(12) United States Patent
Miyakawa et al.

(10) Patent No.: US 11,101,319 B2
(45) Date of Patent: Aug. 24, 2021

(54) SEMICONDUCTOR STORAGE DEVICE INCLUDING VARIABLE RESISTANCE ELEMENTS

(71) Applicant: TOSHIBA MEMORY CORPORATION, Tokyo (JP)

(72) Inventors: Tadashi Miyakawa, Yokohama Kanagawa (JP); Katsuhiko Hoya, Yokohama Kanagawa (JP); Hiroyuki Takenaka, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/838,693

(22) Filed: Apr. 2, 2020

(65) Prior Publication Data

US 2020/0303458 A1    Sep. 24, 2020

Related U.S. Application Data

(62) Division of application No. 15/907,935, filed on Feb. 28, 2018, now abandoned.

(30) Foreign Application Priority Data

Mar. 21, 2017    (JP) .............................. JP2017-054755

(51) Int. Cl.
*G11C 11/16*    (2006.01)
*H01L 43/08*    (2006.01)
(Continued)

(52) U.S. Cl.
CPC .......... *H01L 27/228* (2013.01); *G11C 11/161* (2013.01); *G11C 11/1673* (2013.01);
(Continued)

(58) Field of Classification Search
CPC ......... H01L 27/11524; H01L 27/11529; H01L 27/11551–11556;
(Continued)

(56) References Cited

U.S. PATENT DOCUMENTS 8,508,978 B2    8/2013    Ishihara et al.
9,337,239 B2    5/2016    Lee
(Continued)

FOREIGN PATENT DOCUMENTS

WO    2015132997 A1    9/2015

*Primary Examiner* — Nelson Garces
(74) *Attorney, Agent, or Firm* — Kim & Stewart LLP

(57) ABSTRACT

A semiconductor storage device includes first and second wirings that are in a first layer above the substrate, extend along a first direction, and are adjacent to each other along a second direction, third and fourth wirings that are in a second layer above the first layer, extend along the second direction, and are adjacent to each other along the first direction, first and second memory cells on the first wiring, and a third memory cell on the second wiring. The first to third memory cells each include a variable resistance element and a switching element. The switching element of the first memory cell includes a gate coupled to the third wiring. The switching elements of the second and third memory cells each include a gate coupled to the fourth wiring. The variable resistance elements of the first to third memory cells are formed with equal distances from each other.

20 Claims, 55 Drawing Sheets

(51) Int. Cl.
*G11C 13/00* (2006.01)
*H01L 27/22* (2006.01)
*H01L 23/528* (2006.01)
*H01L 29/78* (2006.01)
*H01L 43/02* (2006.01)
*H01F 10/32* (2006.01)

(52) U.S. Cl.
CPC ........ *G11C 11/1675* (2013.01); *H01L 23/528* (2013.01); *H01L 29/7827* (2013.01); *H01L 43/02* (2013.01); *H01L 43/08* (2013.01); *G11C 13/0002* (2013.01); *G11C 13/0004* (2013.01); *G11C 2213/72* (2013.01); *H01F 10/3254* (2013.01); *H01F 10/3286* (2013.01)

(58) Field of Classification Search
CPC ...... H01L 27/11578–11582; H01L 27/24–249; H01L 45/06; H01L 45/126; H01L 45/144; H01L 45/16; H01L 45/1675; H01L 45/1233; H01L 45/04; G11C 11/1675; G11C 11/1673; G11C 11/161; G11C 13/0002; G11C 13/0004; G11C 5/02–05; G11C 5/06–12; G11C 2213/70–82; G11C 14/0081; G11C 14/009; G11C 14/0045; G11C 11/5678; G11C 11/5685; G11C 11/5692

See application file for complete search history.

(56) References Cited

U.S. PATENT DOCUMENTS

| | | |
|---|---|---|
| 2006/0237756 A1 | 10/2006 | Park et al. |
| 2008/0113469 A1* | 5/2008 | Eun .................. H01L 45/06 438/102 |
| 2008/0185569 A1 | 8/2008 | Park et al. |
| 2016/0064452 A1 | 3/2016 | Ueda et al. |
| 2016/0379701 A1 | 12/2016 | Nakatsuka et al. |

\* cited by examiner

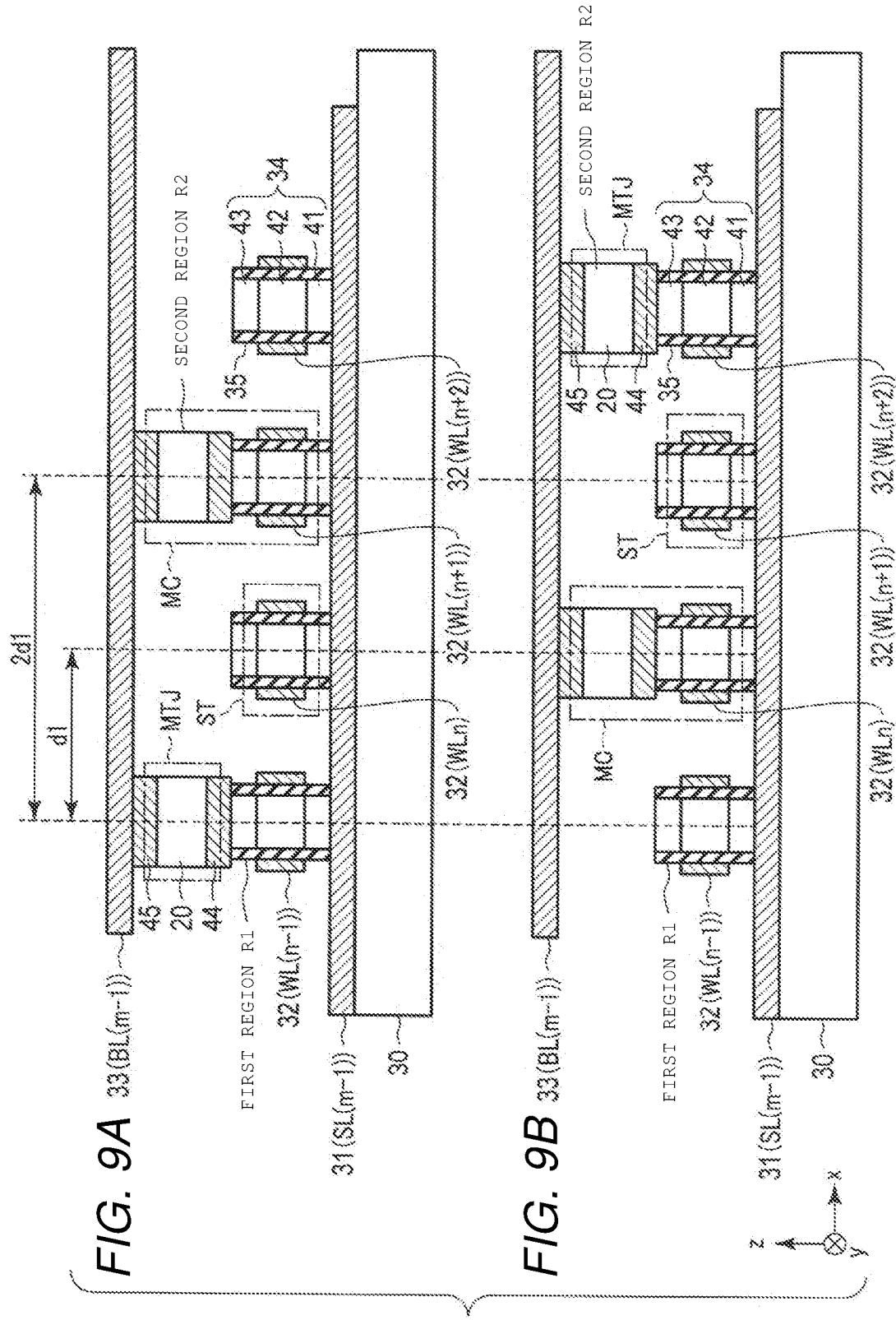

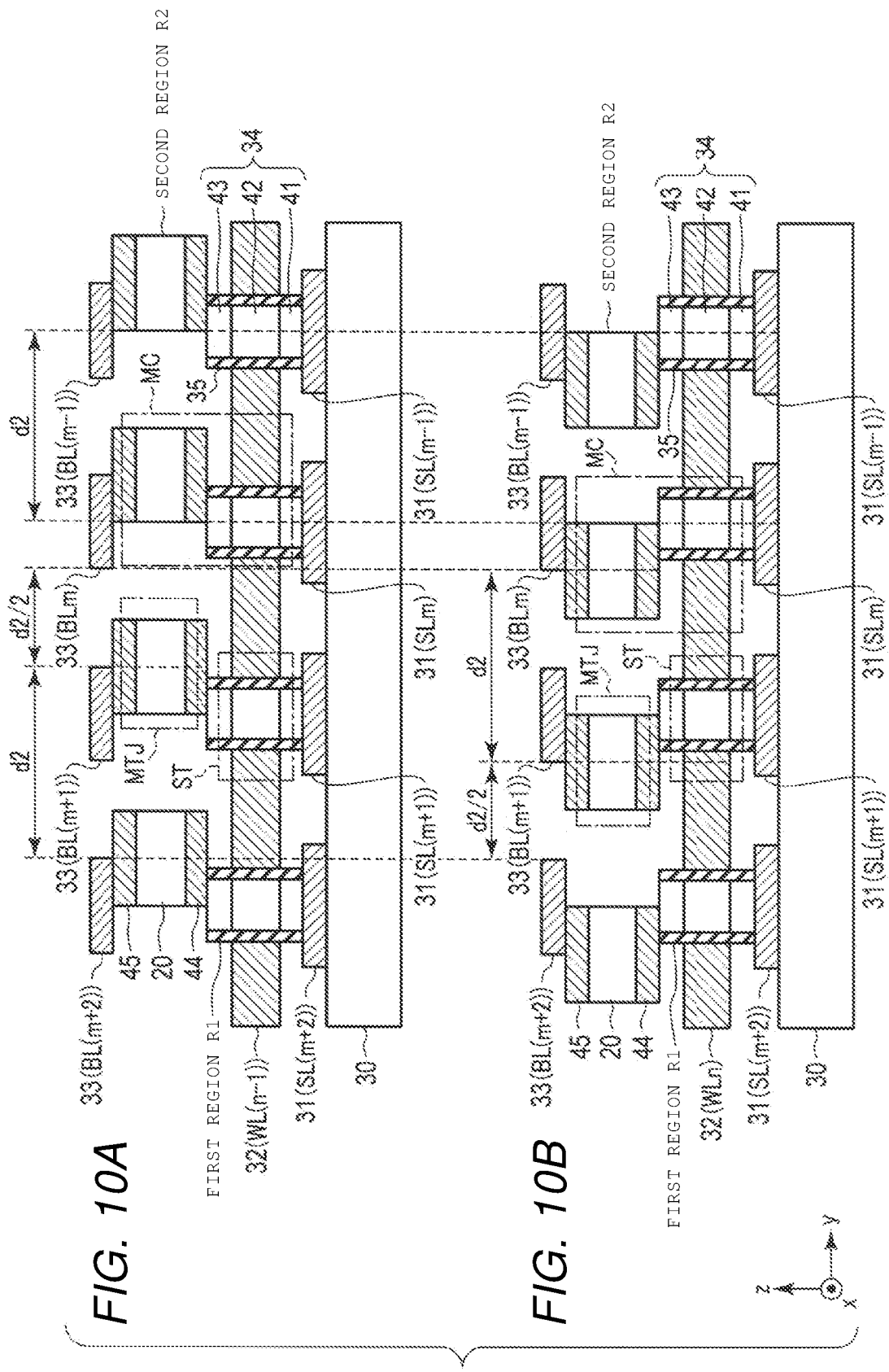

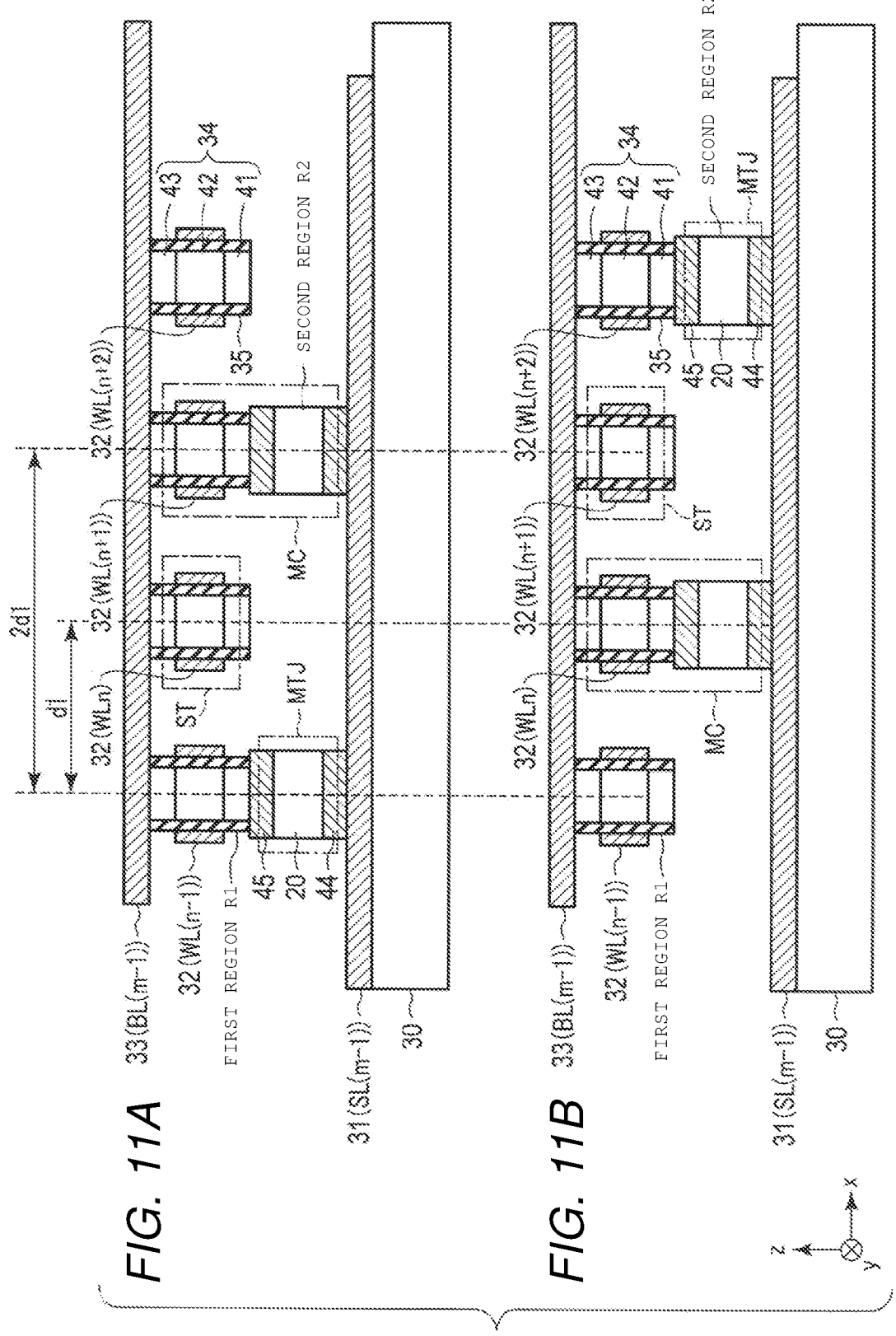

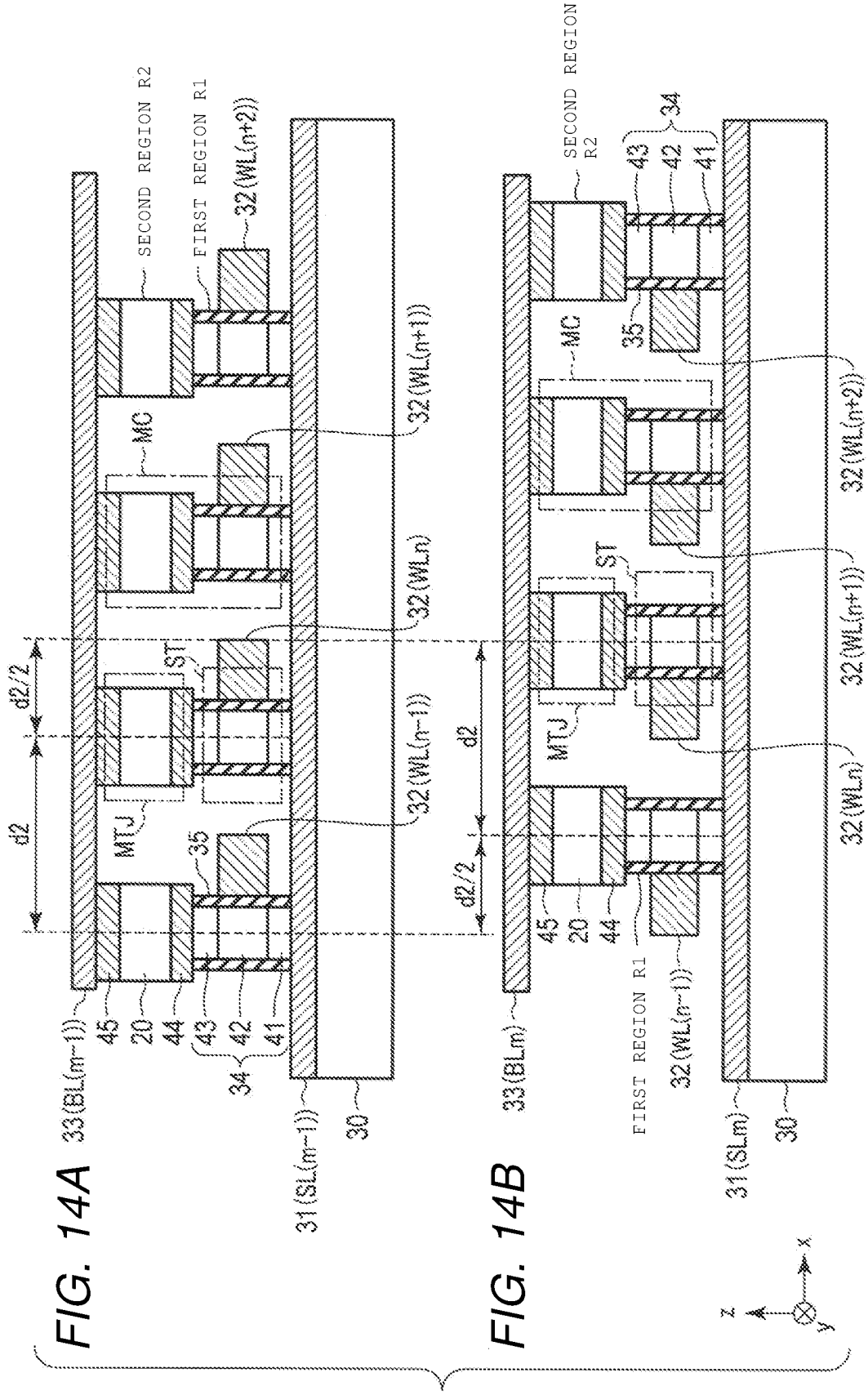

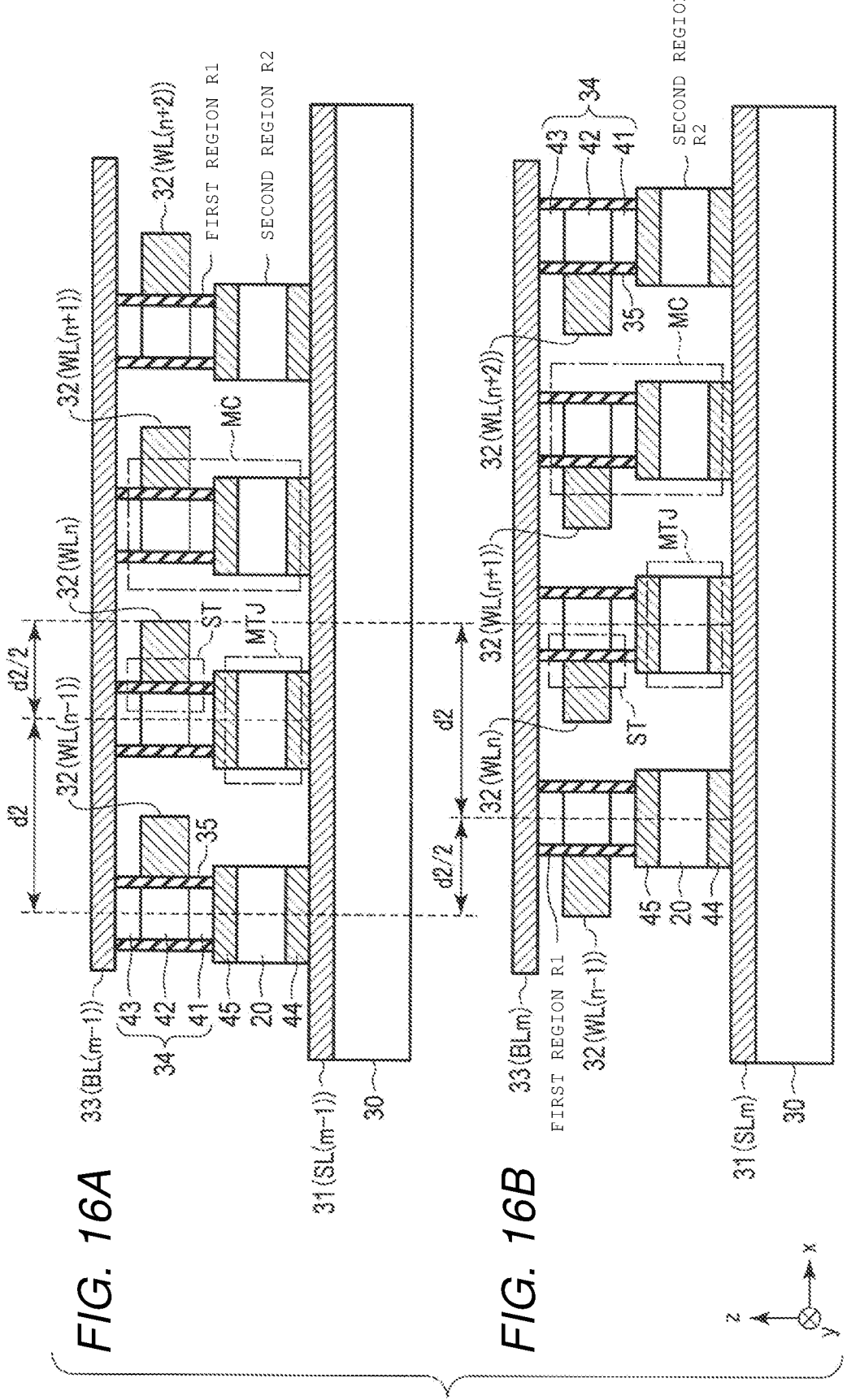

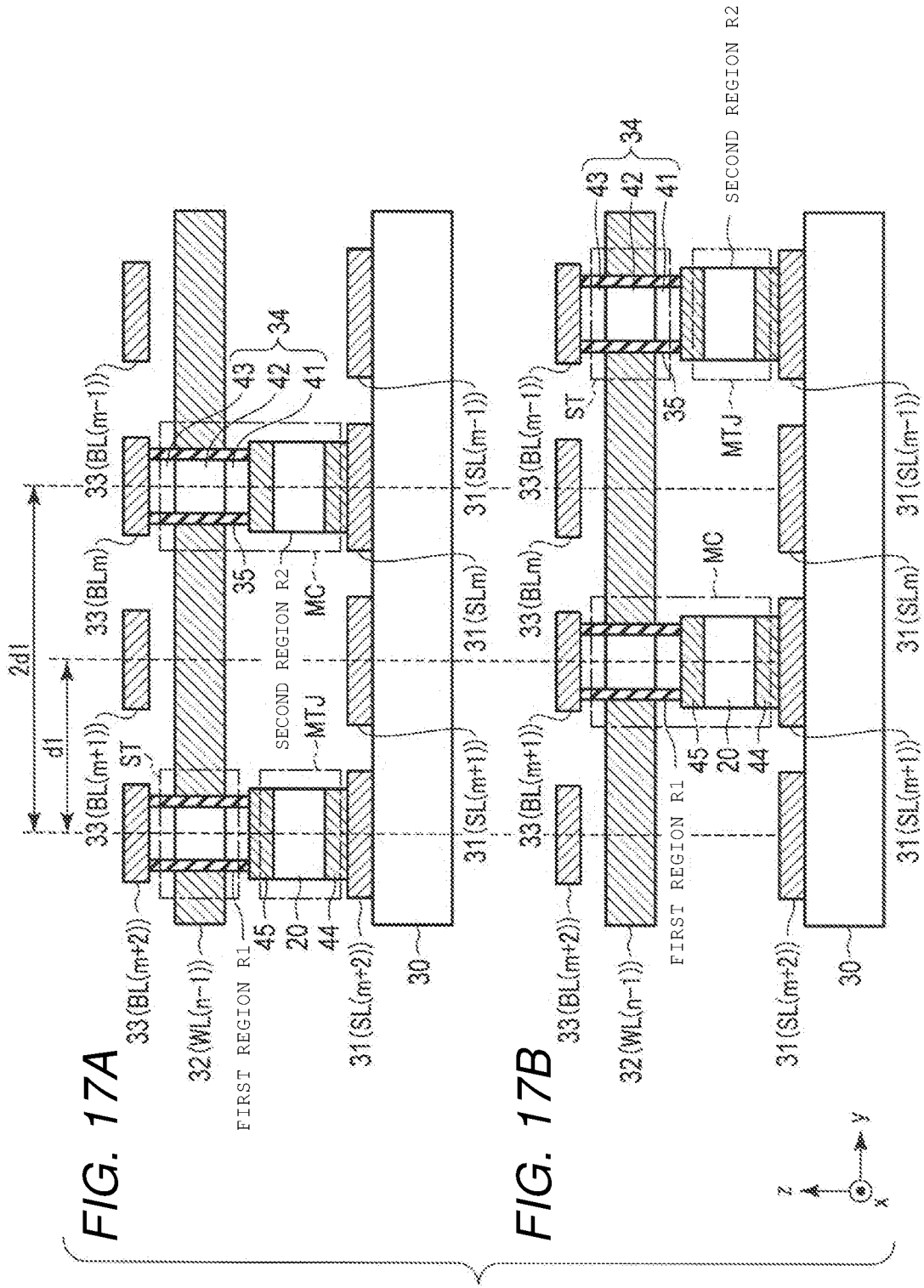

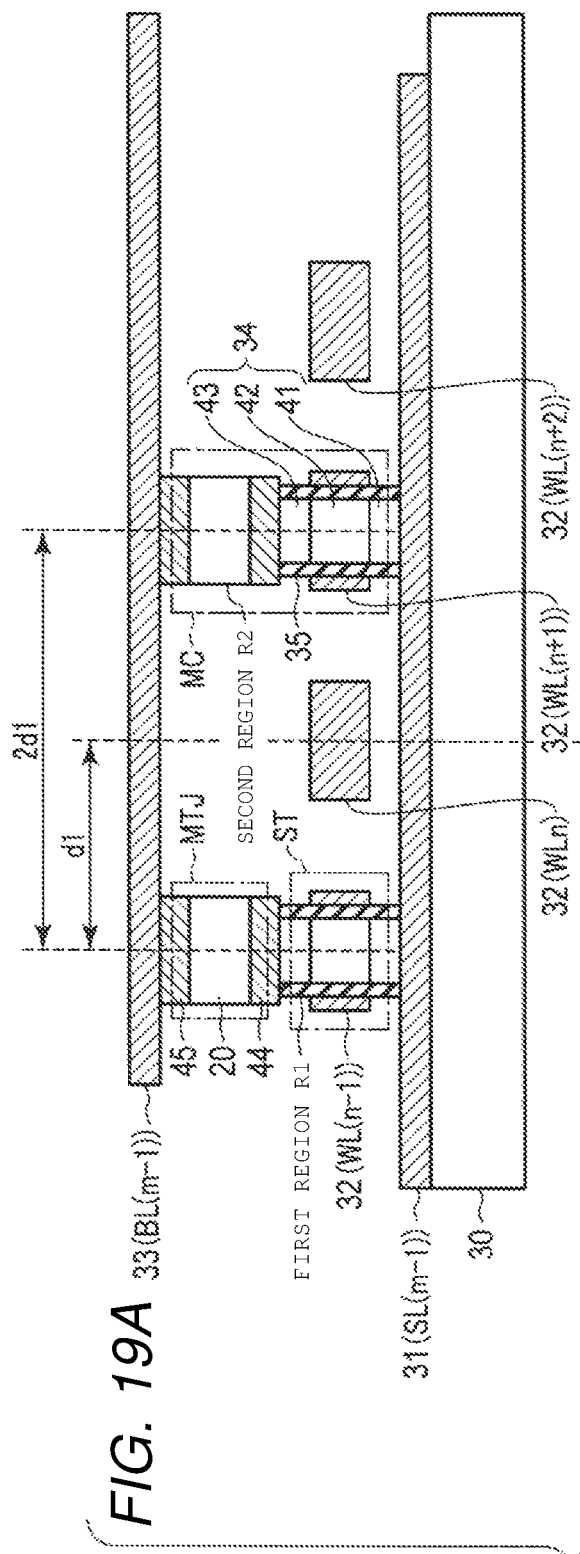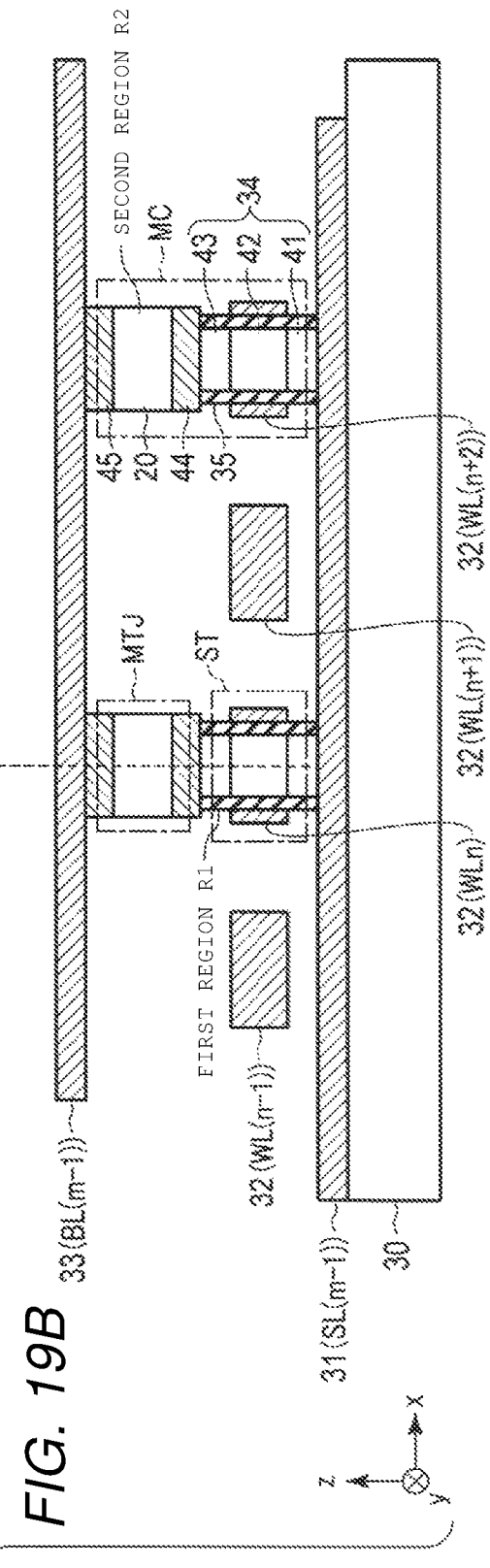

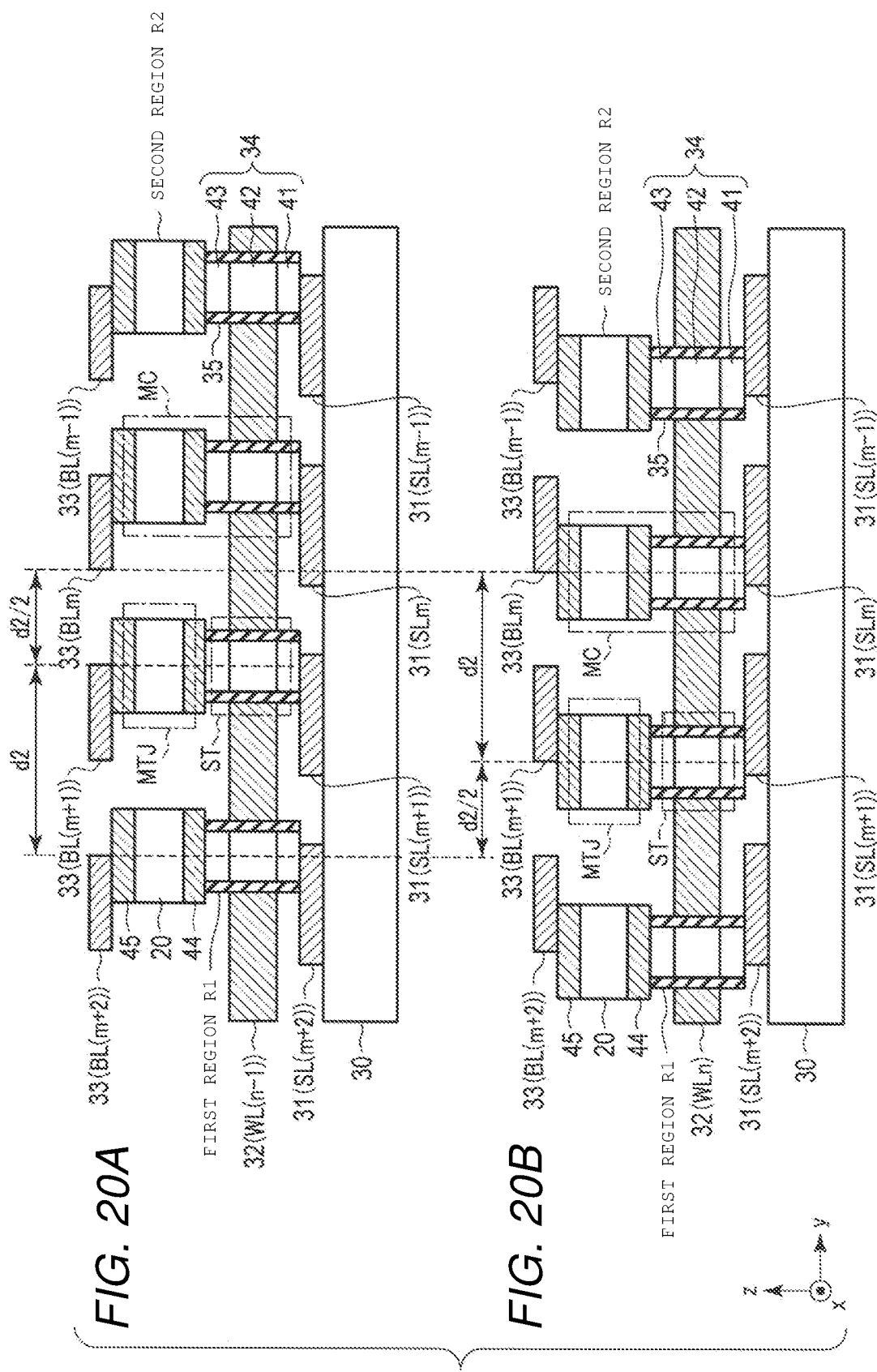

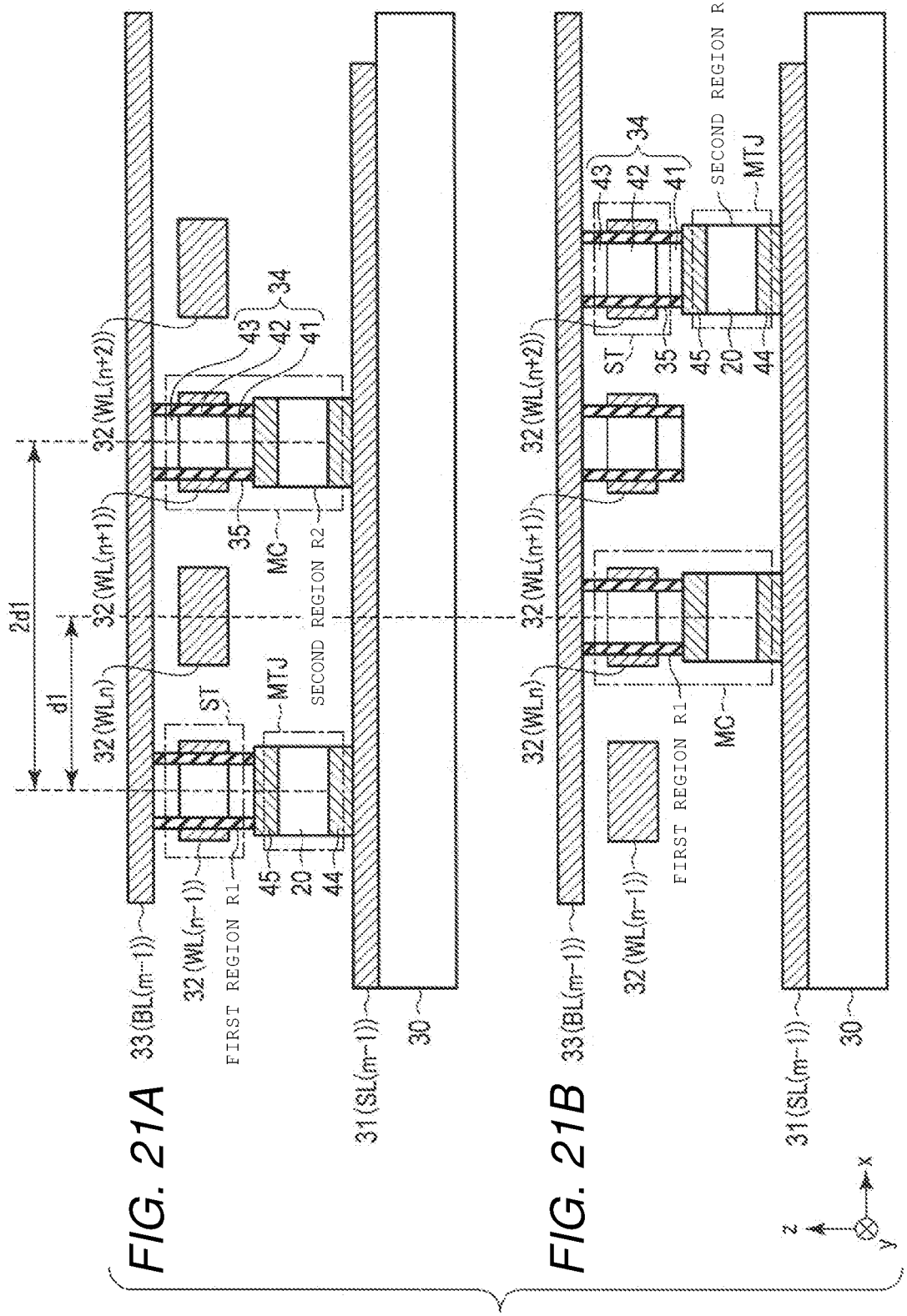

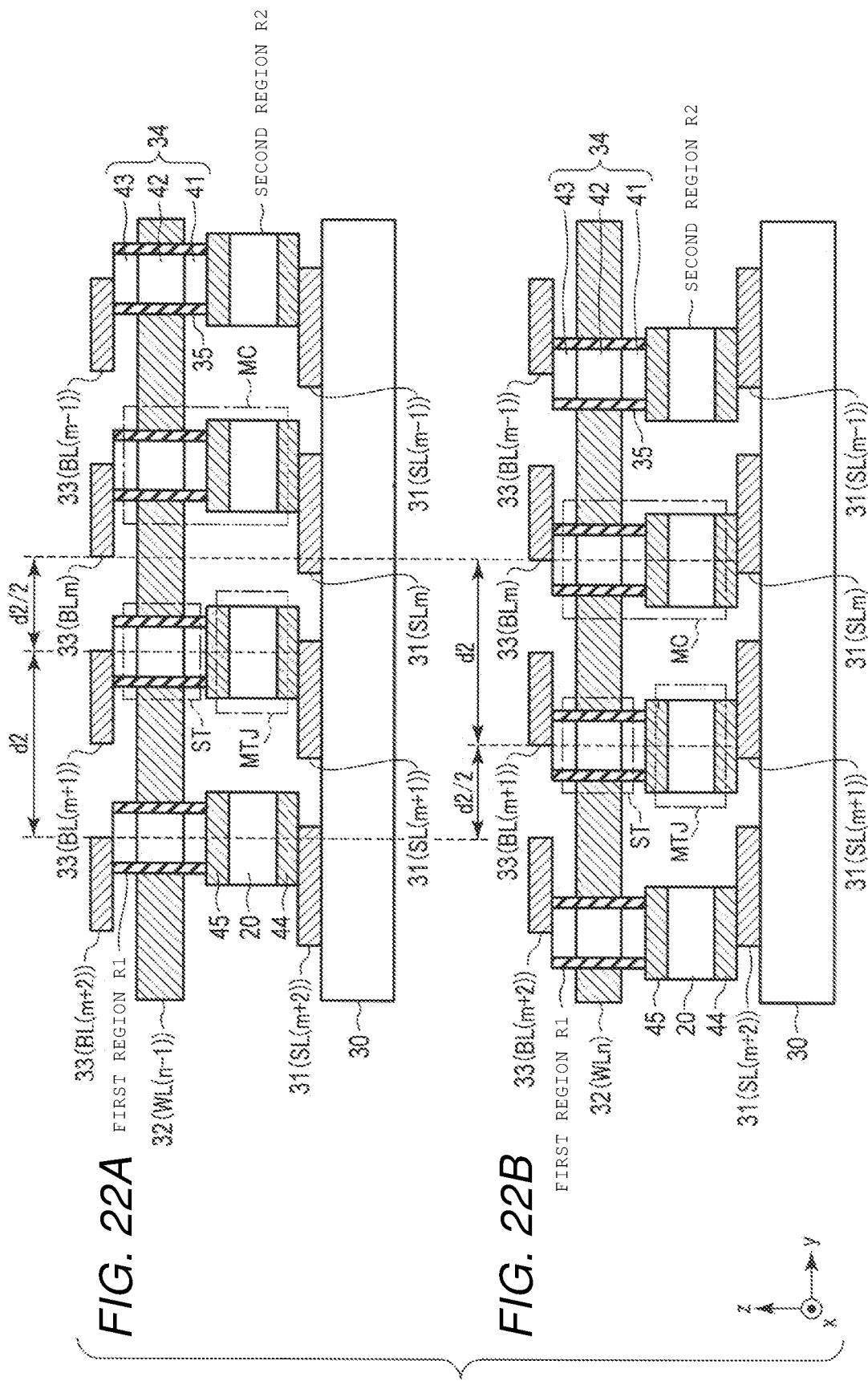

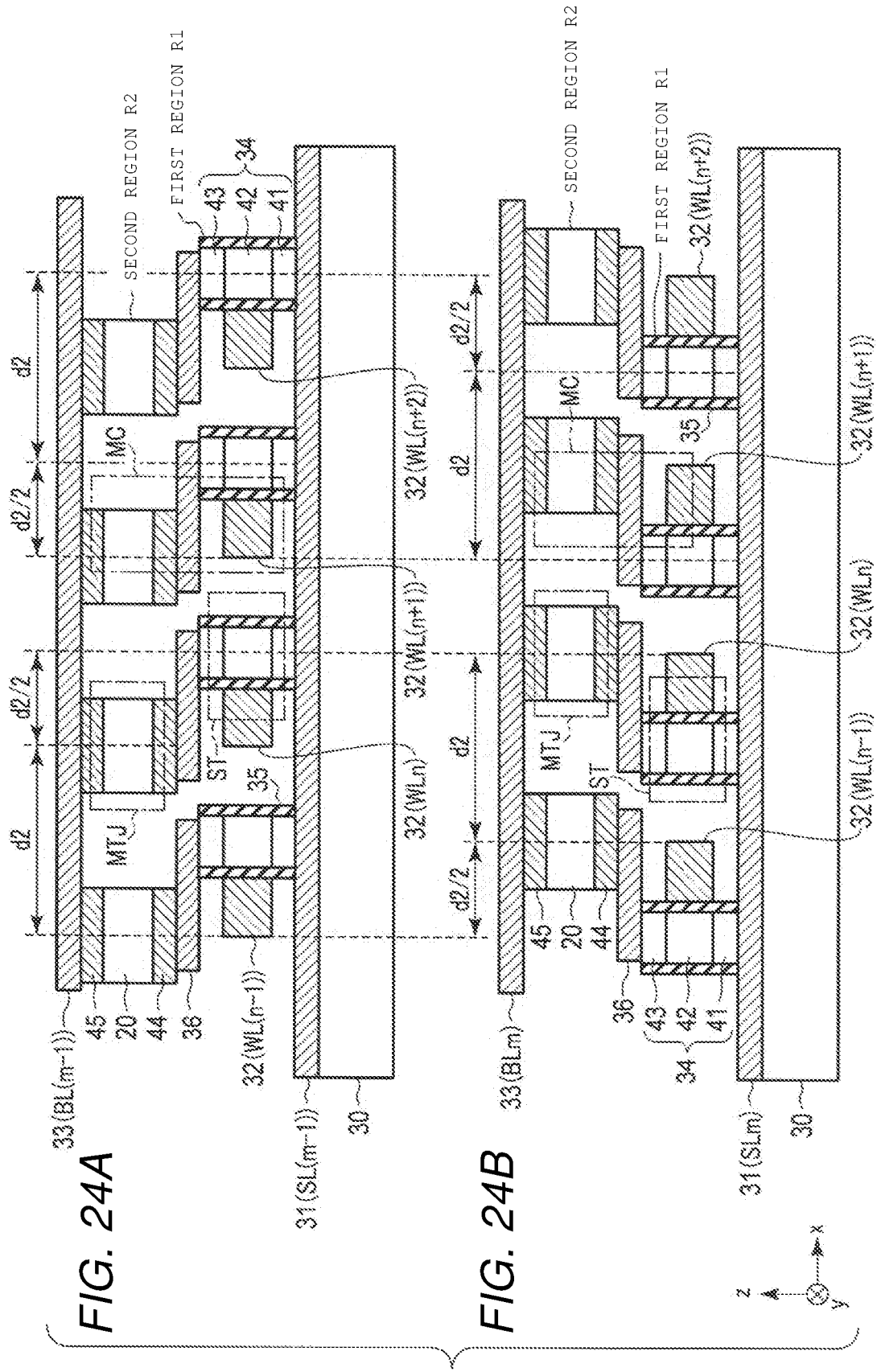

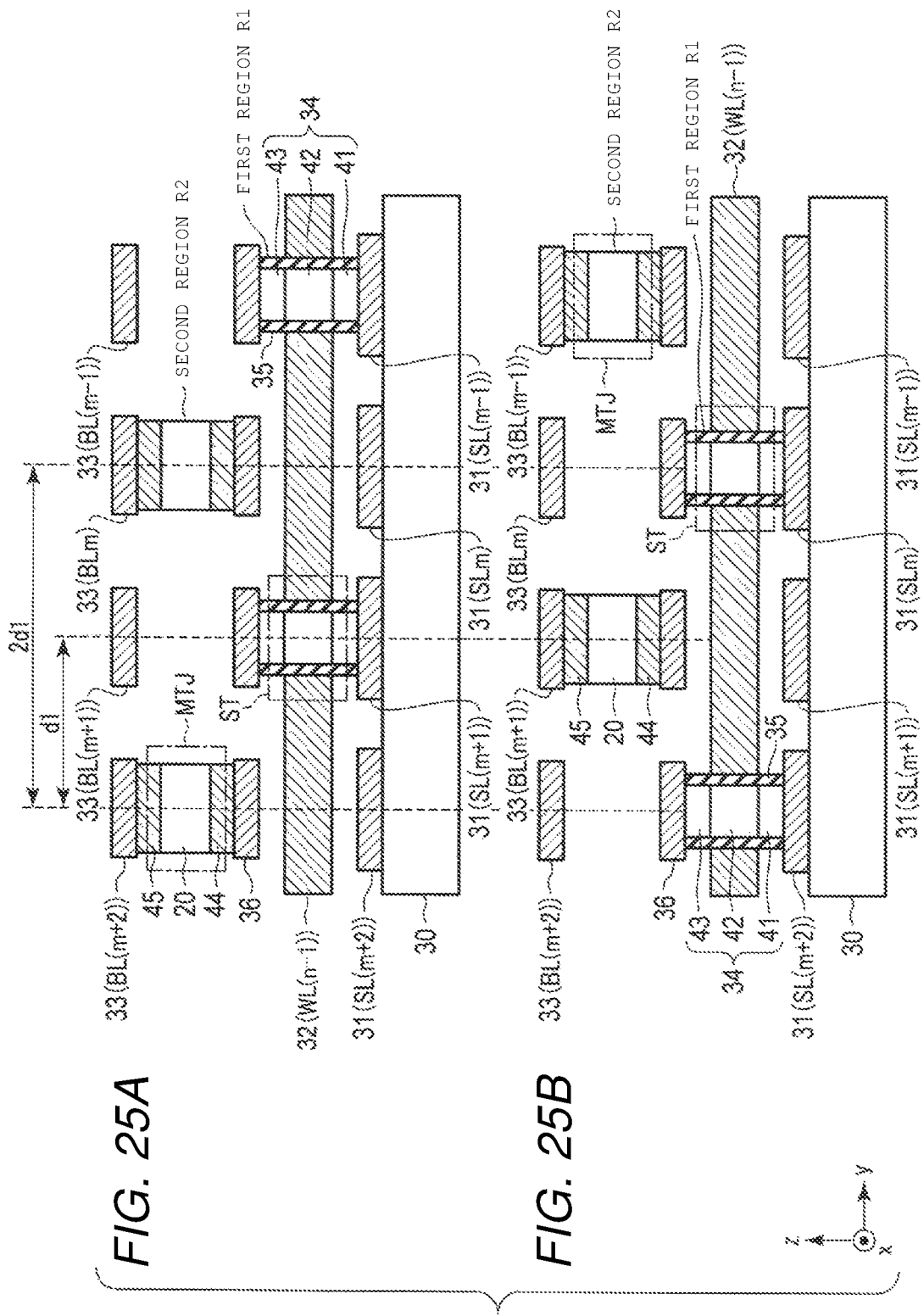

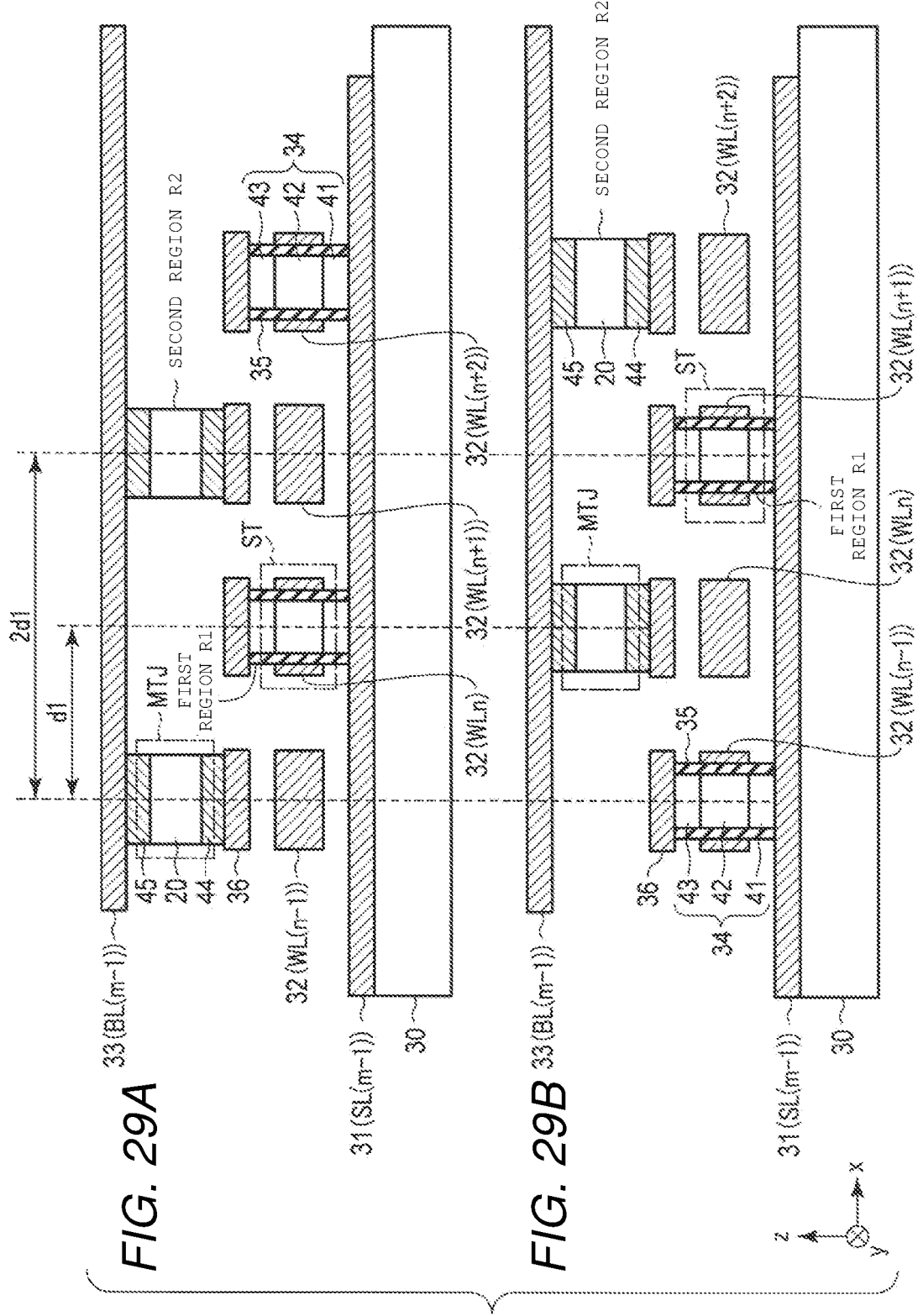

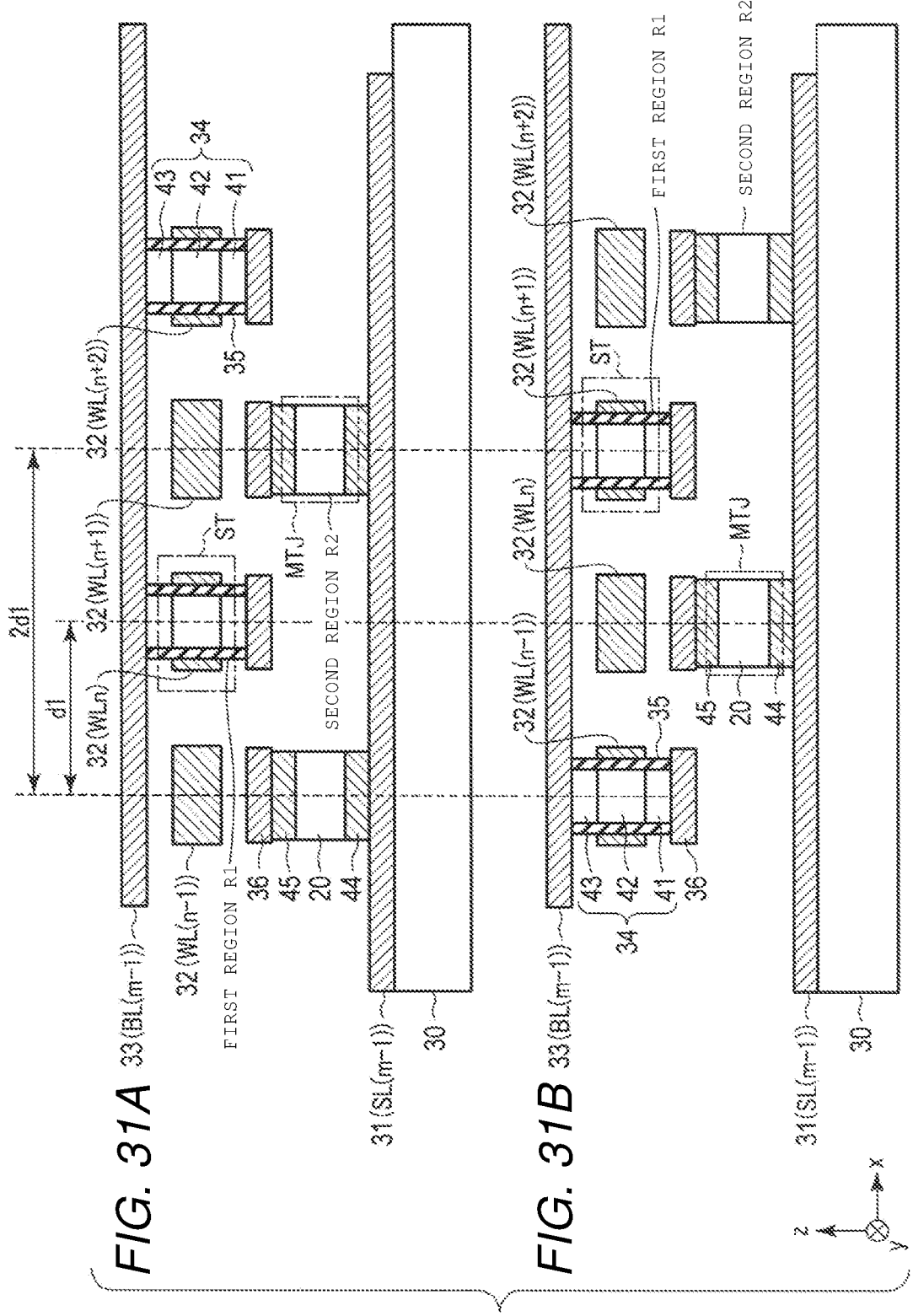

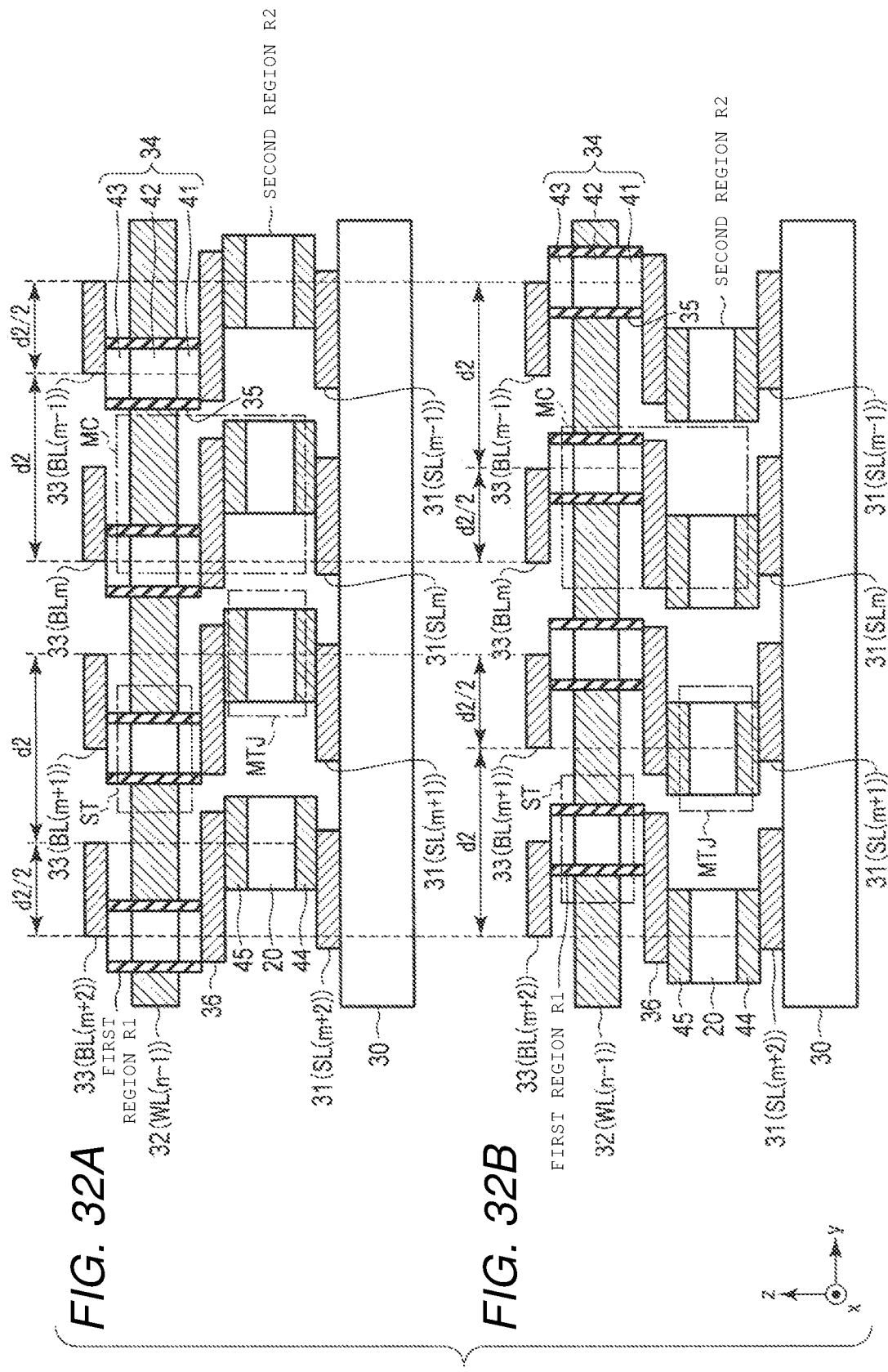

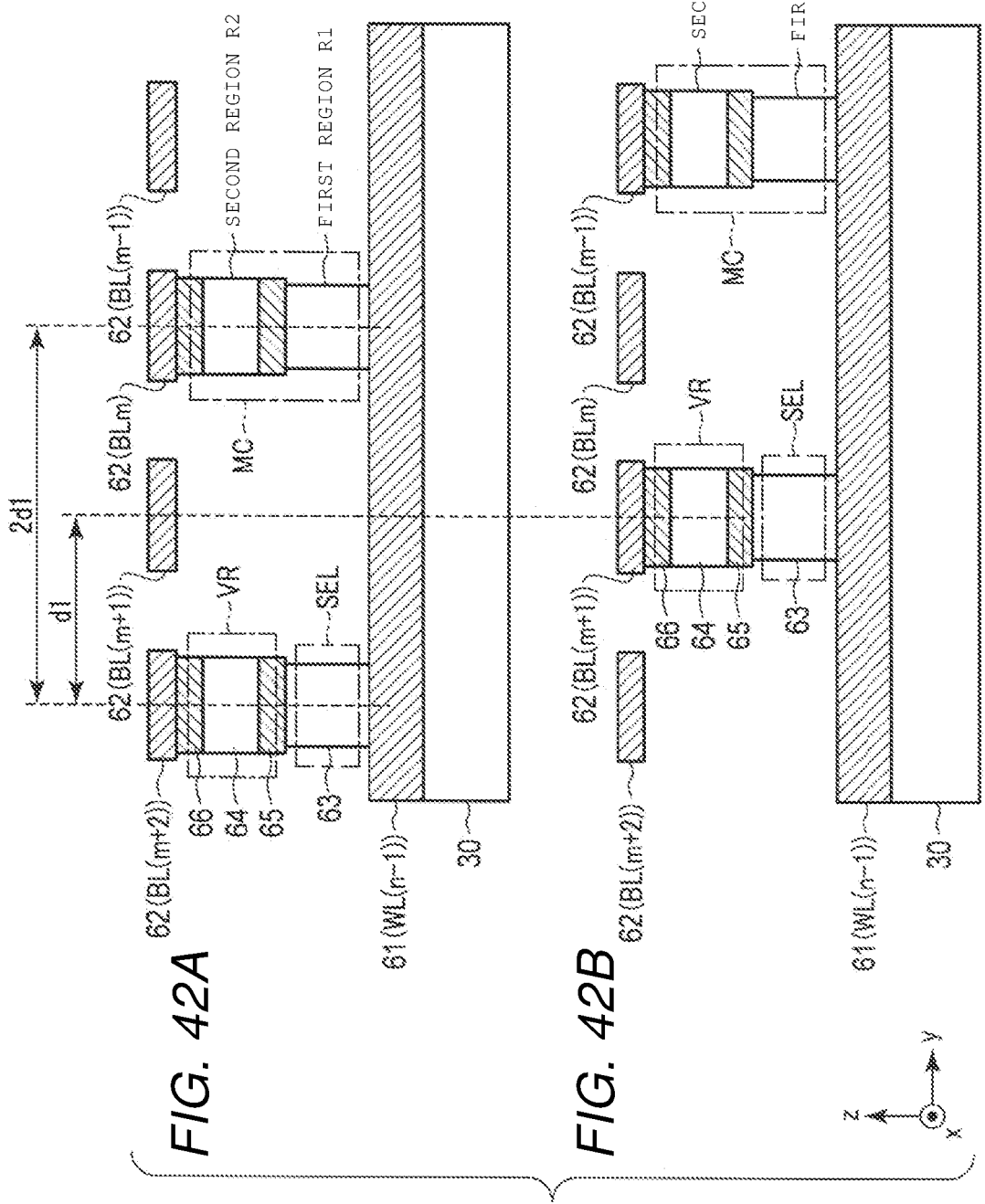

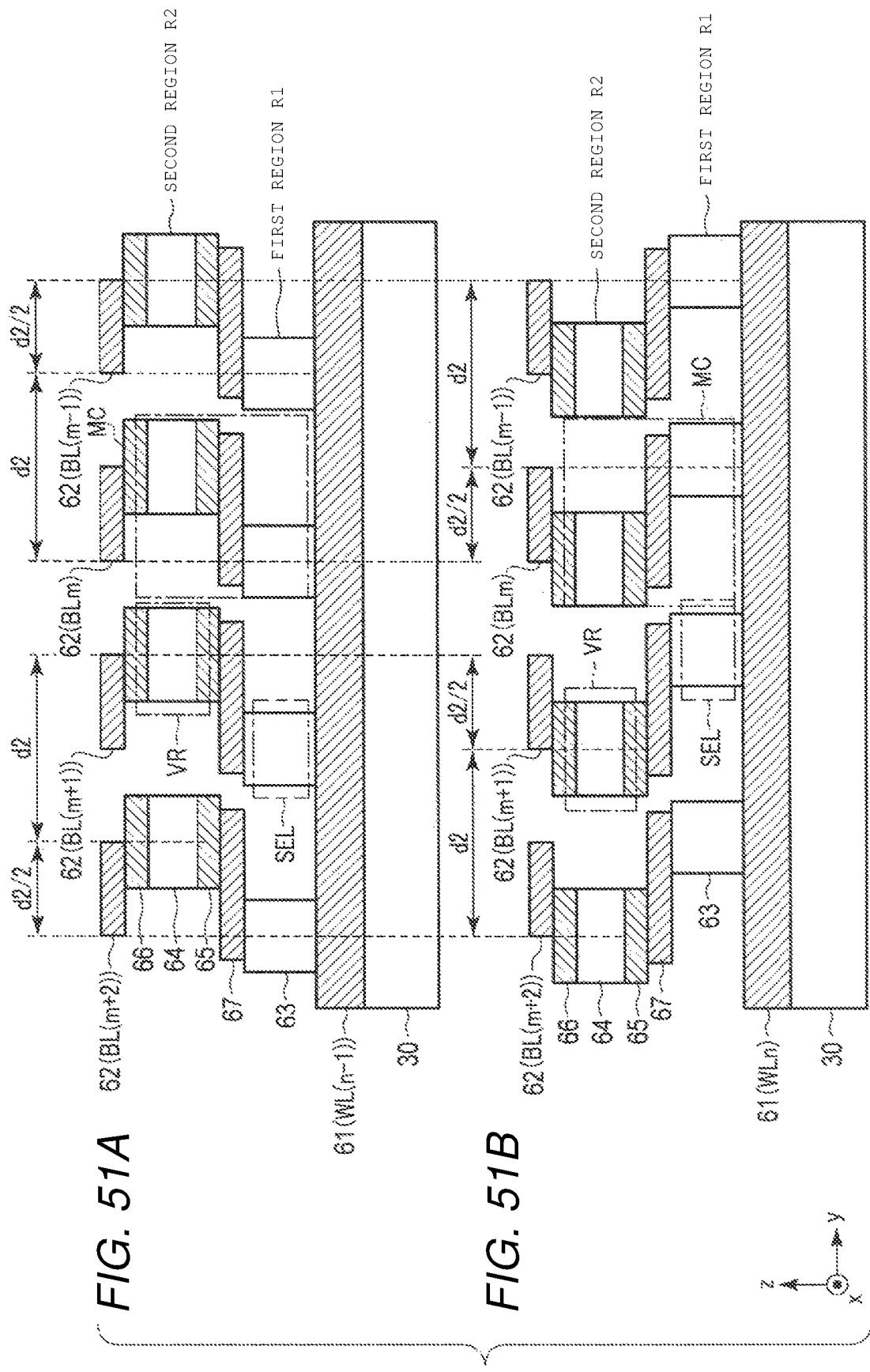

FIG. 55A
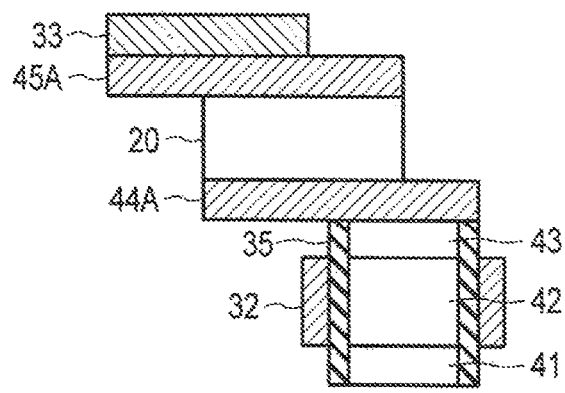
FIG. 55B
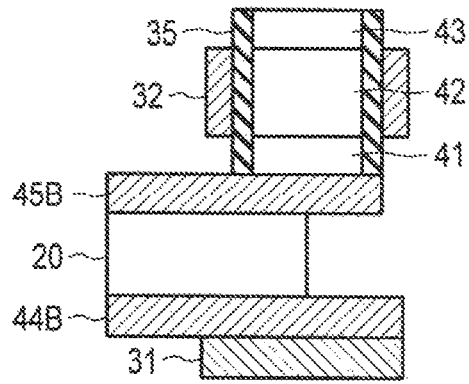
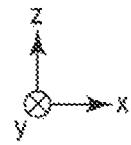

SEMICONDUCTOR STORAGE DEVICE INCLUDING VARIABLE RESISTANCE ELEMENTS

CROSS-REFERENCE TO RELATED APPLICATIONS

This application is a division of U.S. patent application Ser. No. 15/907,935, filed on Feb. 28, 2018, which is based upon and claims the benefit of priority from Japanese Patent Application No. 2017-054755, filed Mar. 21, 2017, the entire contents of each of which are incorporated herein by reference.

FIELD

Embodiments described herein relate generally to a semiconductor storage device.

BACKGROUND

A semiconductor storage device including a variable resistance element is known.

DESCRIPTION OF THE DRAWINGS

FIGS. 9A and 9B are sectional views for describing the configuration of the memory cell array of the semiconductor storage device according to the second embodiment.

FIGS. 10A and 10B are sectional views for describing the configuration of the memory cell array of the semiconductor storage device according to the second embodiment.

FIGS. 11A and 11B are sectional views for describing a configuration of a memory cell array of a semiconductor storage device according to a modification example of the second embodiment.

FIGS. 14A and 14B are sectional views for describing the configuration of the memory cell array of the semiconductor storage device according to the third embodiment.

FIGS. 16A and 15B are sectional views for describing a configuration of a memory cell array of a semiconductor storage device according to a modification example of the third embodiment.

FIGS. 17A and 17B are sectional views for describing the configuration of the memory cell array of the semiconductor storage device according to the modification example of the third embodiment.

FIGS. 19A and 19B are sectional views for describing the configuration of the memory cell array of the semiconductor storage device according to the fourth embodiment.

FIGS. 20A and 20B are sectional views for describing the configuration of the memory cell array of the semiconductor storage device according to the fourth embodiment.

FIGS. 21A and 20B are sectional views for describing a configuration of a memory cell array of a semiconductor storage device according to a modification example of the fourth embodiment.

FIGS. 22A and 22B are sectional views for describing the configuration of the memory cell array of the semiconductor storage device according to the modification example of the fourth embodiment.

FIGS. 24A and 24B are sectional views for describing the configuration of the memory cell array of the semiconductor storage device according to the fifth embodiment.

FIGS. 25A and 25B are sectional views for describing the configuration of the memory cell array of the semiconductor storage device according to the fifth embodiment.

FIGS. 29A and 29B are sectional views for describing the configuration of the memory cell array of the semiconductor storage device according to the sixth embodiment.

FIGS. 31A and 31B are sectional views for describing a configuration of a memory cell array of a semiconductor storage device according to a modification example of the sixth embodiment.

FIGS. 32A and 32B are sectional views for describing the configuration of the memory cell array of the semiconductor storage device according to the modification example of the sixth embodiment.

FIGS. 42A and 42B are sectional views for describing the configuration of the memory cell array of the semiconductor storage device according to the ninth embodiment.

FIGS. 51A and 51B are sectional views for describing the configuration of the memory cell array of the semiconductor storage device according to the twelfth embodiment.

FIGS. 55A and 55B are sectional views for describing a configuration of a memory cell of a semiconductor storage device according to a modification example.

DETAILED DESCRIPTION

Embodiments provide a semiconductor storage device having memory elements arranged such that distances between memory elements adjacent to each other are equal to each other while achieving an overall reduction in size of the semiconductor storage device.

In general, according to one embodiment, a semiconductor storage device includes a substrate, a first wiring and a second wiring that are in a first layer above the substrate, extend along a first direction that is parallel to a surface of the substrate, and are adjacent to each other along a second direction that intersects with the first direction and is parallel to the surface of the substrate, a third wiring and a fourth wiring that are in a second layer above the first layer, extend along the second direction, and are adjacent to each other along the first direction, a first memory cell and a second memory cell on a surface of the first wiring, and a third memory cell on a surface on the second wiring. The first memory cell, the second memory cell, and the third memory cell each include a variable resistance element and a switching element, the switching element of the first memory cell having a gate coupled to the third wiring, and the switching element of the second memory cell and the switching element of the third memory cell each having a gate coupled to the fourth wiring. The variable resistance element of the first memory cell, the variable resistance element of the second memory cell, and the variable resistance element of the third memory cell are formed with equal distances from each other in a plane parallel to the surface of the substrate.

As used herein, a "switching element" is a transistor in some embodiments and a bi-direction switching element, also described herein as a selector, in other embodiments.

Hereinafter, embodiments will be described with reference to the drawings. In the following description, components having the same function and configuration will be assigned a common reference sign. When a plurality of components that are assigned a common reference sign is to be distinguished from one another, the components are distinguished by assigning suffixes to the common reference sign. When it is not necessary to distinguish between the plurality of components, only the common reference sign is assigned to the components.

1. First Embodiment

A semiconductor storage device according to a first embodiment will be described. In the semiconductor storage device according to the first embodiment, a magnetic storage device with perpendicular magnetization using a magnetic tunnel junction (MTJ) element as a memory element is described as an example.

1.1 Configuration

Initially, a configuration of the semiconductor storage device according to the first embodiment will be described.

1.1.1. Configuration of Semiconductor Storage Device

Figure 1:
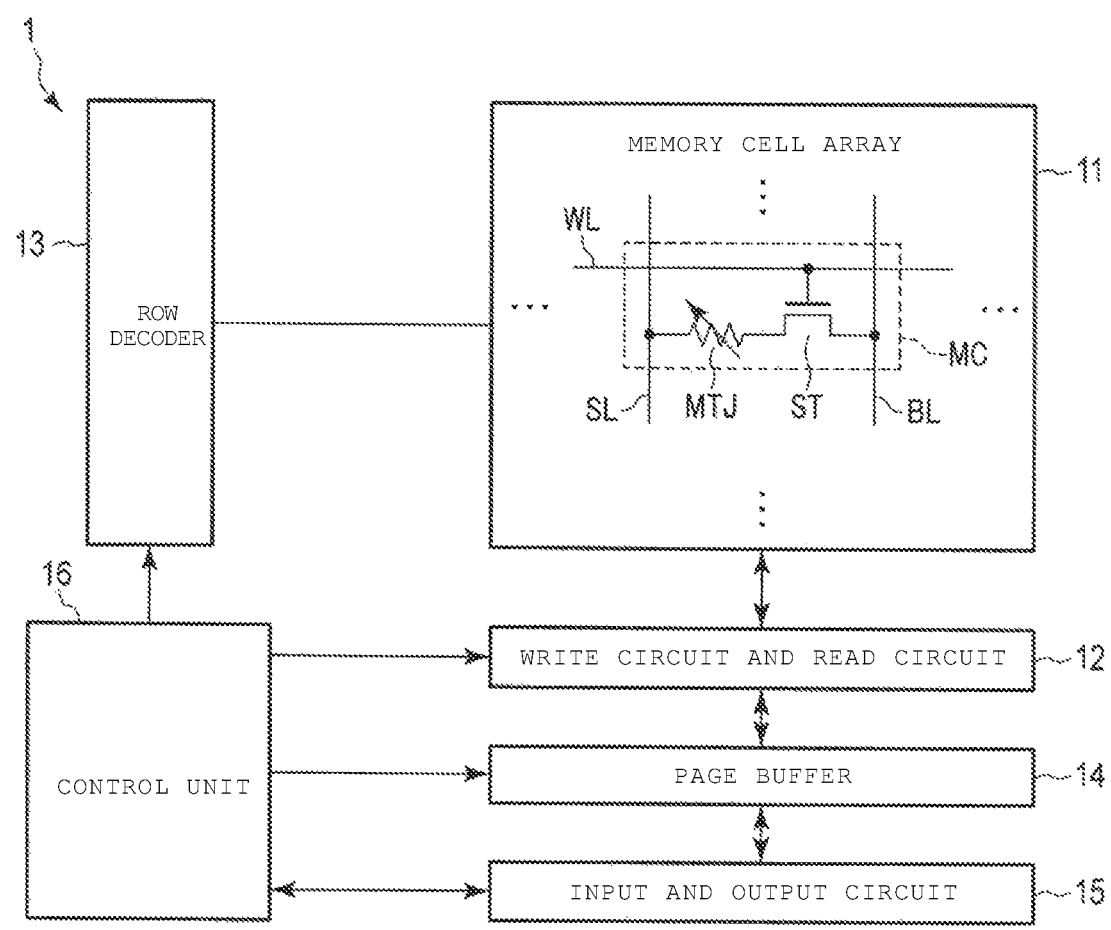
FIG. 1 is a block diagram showing a configuration of a semiconductor storage device according to a first embodiment.

FIG. 1 is a block diagram showing a configuration of a semiconductor storage device 1 according to the first embodiment. As shown in FIG. 1, the semiconductor storage device 1 includes a memory cell array 11, write circuit and read circuit (WC/RC) 12, a row decoder 13, a page buffer 14, input and output circuit 15, and a control unit 16.

The memory cell array 11 includes a plurality of memory cells MC associated with rows and columns. The memory cells MC present in the same row are connected to the same word line WL, and ends of the memory cells MC present in the same column are connected to the same bit line BL and the same source line SL, respectively.

The memory cell MC includes a select transistor ST and a magnetic tunnel junction element MTJ. For example, the select transistor ST includes a first end connected to the bit line BL, a second end connected to the first end of the magnetic tunnel junction element MTJ, and a gate connected the word line WL. The select transistor ST is provided as a switch that controls the supply and stoppage of a current to the magnetic tunnel junction element MTJ. For example, the magnetic tunnel junction element MTJ includes a second end connected to the source line SL. The magnetic tunnel junction element MTJ may switch between a low resistance state and a high resistance state due to the flow of a current. The magnetic tunnel junction element MTJ is able to write data depending on a change of the resistance state, and functions as a variable resistance element that is able to retain the written data in a non-volatile manner and from which the written data can be read.

The WC/RC 12 is connected to the bit line BL and the source line SL. The WC/RC 12 supplies a current to the memory cell MC which is an operation target through the bit line BL and the source line SL, and writes and reads data to and from the memory cell MC. More specifically, the write circuit of the WC/RC 12 writes data in the memory cell MC. For example, the write circuit includes a write driver and a current sink. The read circuit of the WC/RC 12 reads data from the memory cell MC. For example, the read circuit includes a sense amplifier.

The row decoder 13 is connected to the memory cell array 11 through the word line WL. The row decoder 13 decodes a row address that designates a row of the memory cell array 11. The row decoder selects the word line WL depending on the decoding result, and applies a voltage necessary to perform write and read operations of data to the selected word line WL.

The page buffer 14 temporarily retains data written in the memory cell array 11 and data read from the memory cell array 11 for a data unit called a page.

The input and output circuit 15 transmits various signals received from the outside of the semiconductor storage device 1 to the control unit 16 and the page buffer 14, and transmits various information items from the control unit 16 and the page buffer 14 to the outside of the semiconductor storage device 1.

The control unit 16 (which is a control circuit in one embodiment) is connected to the WC/RC 12, the row decoder 13, the page buffer 14, and the input and output circuit 15. The control unit 16 controls the WC/RC 12, the row decoder 13, and the page buffer 14 according to various signals received by the input and output circuit 15 from the outside of the semiconductor storage device 1.

1.1.2. Configuration of Magnetic Tunnel Junction Element

Figure 2:
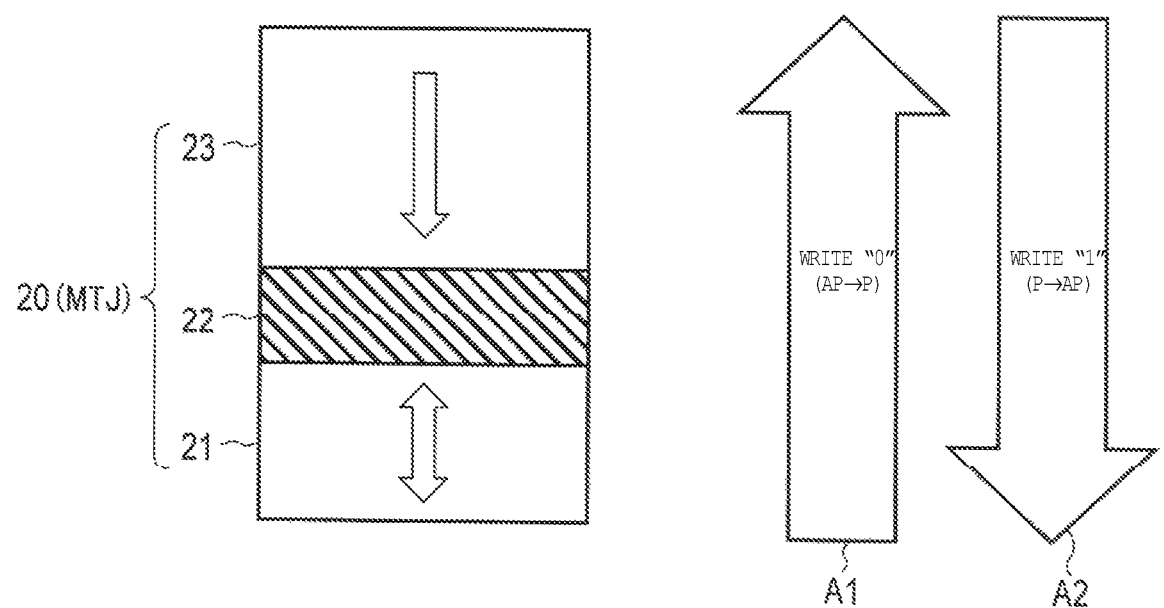
FIG. 2 is a schematic diagram of a magnetic tunnel junction element of the semiconductor storage device according to the first embodiment.

Hereinafter, a configuration of the magnetic tunnel junction element of the semiconductor storage device according to the first embodiment will be described with reference to FIG. 2. FIG. 2 is a schematic diagram for describing the configuration of the magnetic tunnel junction element of the semiconductor storage device according to the first embodiment.

As shown in FIG. 2, a memory element layer 20 functioning as the magnetic tunnel junction element MTJ includes a plurality of stacked films, and includes a current path through which a current flows in a direction perpendicular to a film surface. The memory element layer 20 includes a ferromagnetic layer 21 functioning as a memory layer, a non-magnetic layer 22 functioning as a tunnel barrier layer, and a ferromagnetic layer 23 functioning as a reference layer. For example, the memory element layer 20 is configured such that the ferromagnetic layer 21, the non-magnetic layer 22, and the ferromagnetic layer 23 are sequentially stacked. The magnetic tunnel junction element MTJ is a perpendicular magnetization MTJ element in which the magnetization orientations of the ferromagnetic layers 21 and 23 face directions perpendicular to the film surfaces thereof.

The ferromagnetic layer 21 is a ferromagnetic layer having a direction of easy magnetization that is perpendicular to the film surface, and contains, for example, cobalt iron boron (CoFeB). The ferromagnetic layer 21 has a magnetization orientation facing any one of a direction of the select transistor ST and a direction of the ferromagnetic layer 23. The magnetization property of the ferromagnetic layer 21 is different from that of the ferromagnetic layer 23 such that the magnetization orientation of the ferromagnetic layer 21 is more easily reversed than that of the ferromagnetic layer 23.

The non-magnetic layer 22 is a non-magnetic insulating film, and contains, for example, magnesium oxide (MgO).

The ferromagnetic layer 23 is a ferromagnetic layer having a direction of easy magnetization that is perpendicular to a film surface, and contains, for example, cobalt iron boron (CoFeb). The magnetization orientation of the ferromagnetic layer 23 is fixed. The "magnetization orientation is fixed" means that the magnetization orientation is not changed due to a current having a magnitude enough to reverse the magnetization orientation of the ferromagnetic layer 21. The ferromagnetic layer 21, the non-magnetic layer 22, and the ferromagnetic layer 23 constitute magnetic tunnel junction.

The first embodiment adopts a spin injection writing method that employs a write current which directly flows to the magnetic tunnel junction element MTJ, and the magnetization orientation of the ferromagnetic layer 21 is controlled by the write current. The magnetic tunnel junction element MTJ may enter any one of the low resistance state and the high resistance state depending on whether the magnetization orientations of the ferromagnetic layer 21 and the ferromagnetic layer 23 are parallel or anti-parallel.

When the write current flows to the magnetic tunnel junction element MTJ in a direction of an arrow A1 in FIG. 2, that is, toward the ferromagnetic layer 23 from the ferromagnetic layer 21, the magnetization orientations of the ferromagnetic layer 21 and the ferromagnetic layer 23 become parallel. In a case where the magnetization orientations are parallel, the resistance of the magnetic tunnel junction element MTJ is low, and the magnetic tunnel junction element MTJ is in the low resistance state. The low resistance state is called a "parallel (P) state", and is defined, for example, as a state of data "0".

When the write current flows to the magnetic tunnel junction element MTJ in a direction of an arrow A2 in FIG. 2, that is, toward the ferromagnetic layer 21 from the ferromagnetic layer 23, the magnetization orientations of the ferromagnetic layer 21 and the ferromagnetic layer 23 become anti-parallel. In a case where the magnetization orientations are anti-parallel, the resistance of the magnetic tunnel junction element MTJ is high, and the magnetic tunnel junction element MTJ is in the high resistance state. The high resistance state is called an "anti-parallel (AP) state", and is defined, for example, as a state of data "1".

Although it will be described below that the method of defining the data is performed according to the above-described example, the method of defining data "1" and data "0" is not limited to the above-described example. For example, the P state may be defined as data "1", and the AP state may be defined as data "0".

1.1.3. Stacked Structure of Memory Cell Array

Hereinafter, a stacked structure of the memory cell array of the semiconductor storage device according to the first embodiment will be described. In the following description, it is assumed that a plane on which the bit line BL, the source line SL, and the word line WL extend is the xy-plane, and an axis perpendicular to the xy-plane is the z-axis. For example, the x-axis and the y-axis are defined as the axes which are perpendicular to each other in the xy-plane.

Figure 3:
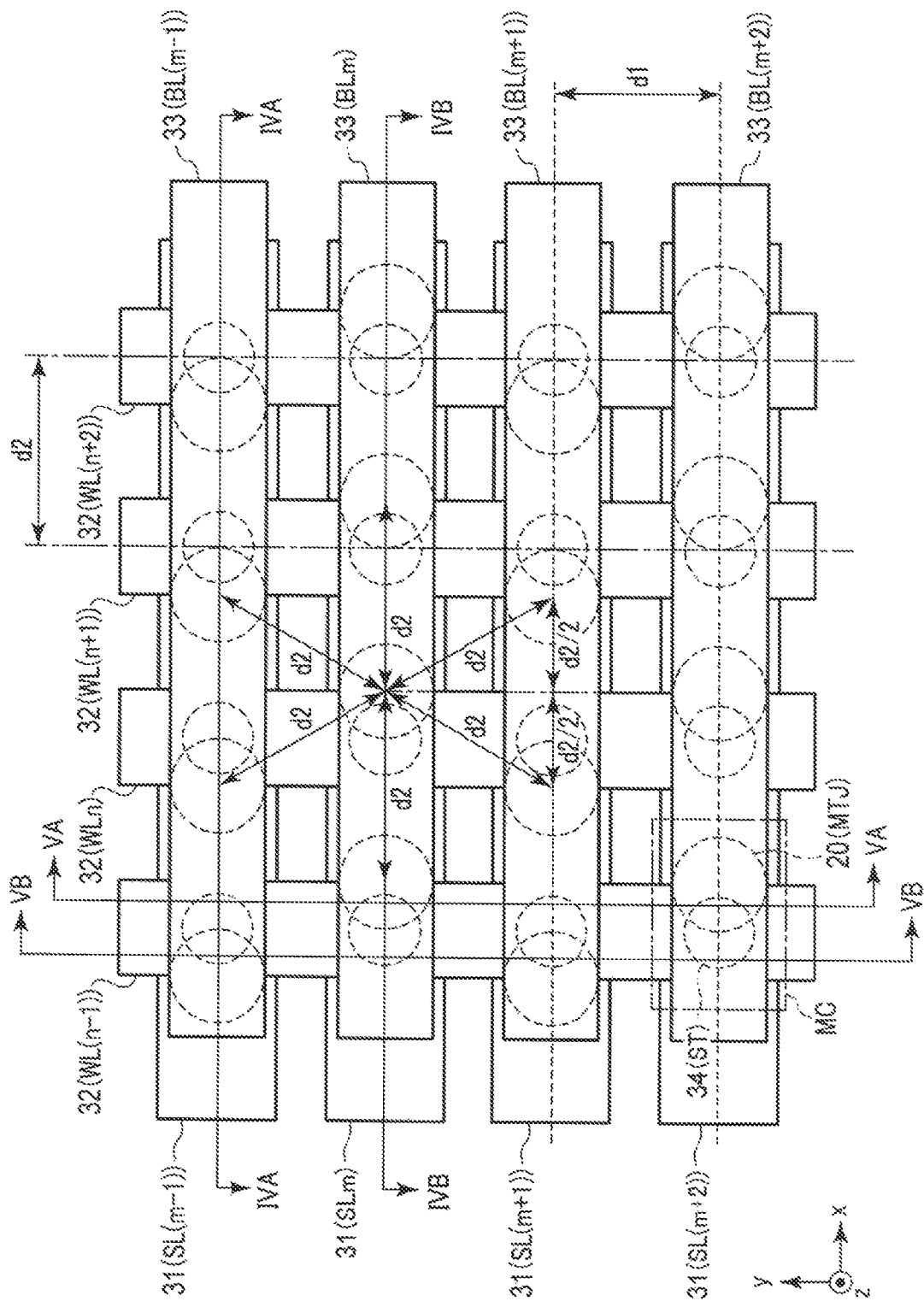
FIG. 3 is a top view for describing a configuration of a memory cell array of the semiconductor storage device according to the first embodiment.
Figure 4:
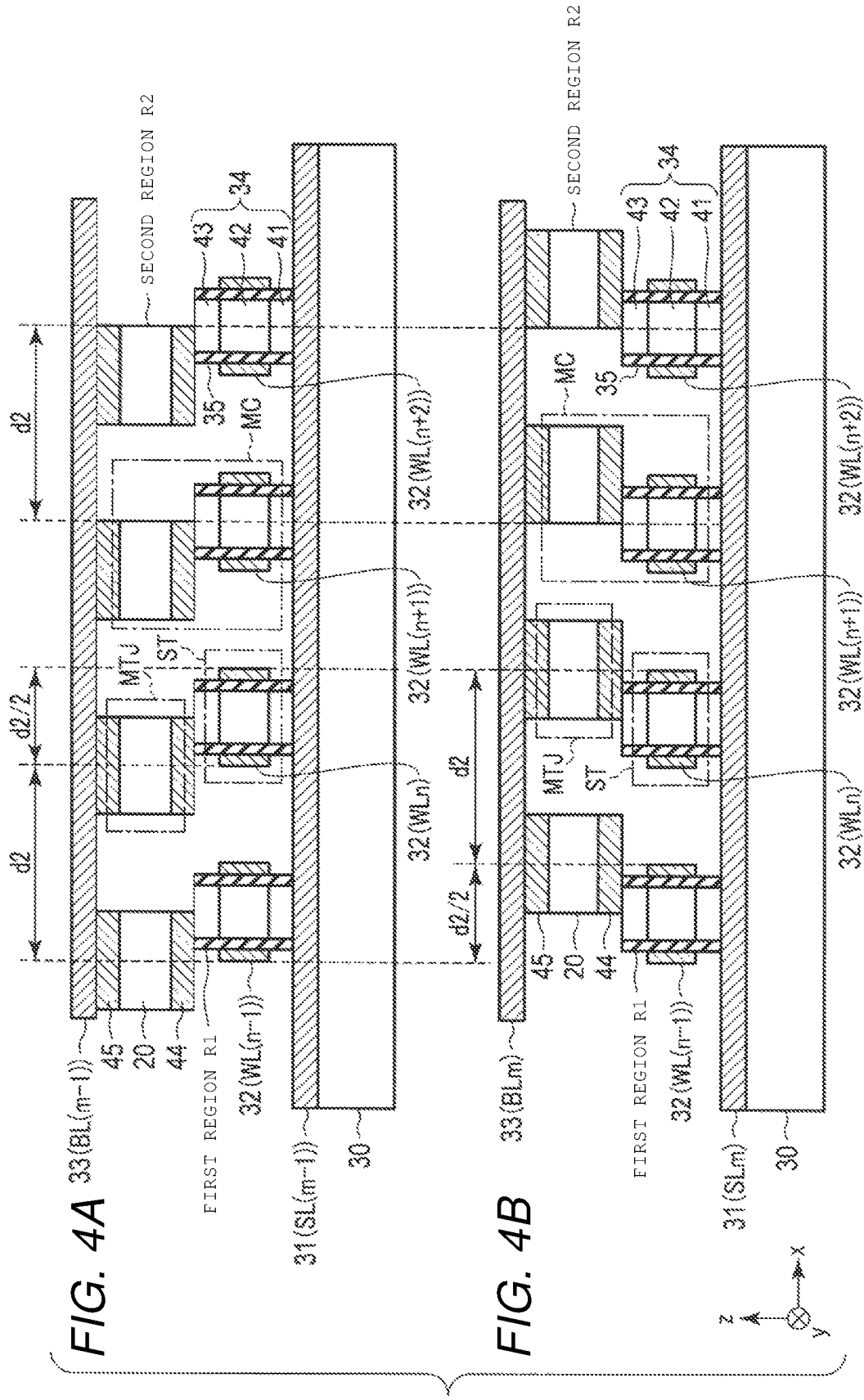
FIGS. 4A and 4B are sectional views for describing the configuration of the memory cell array of the semiconductor storage device according to the first embodiment.
Figure 5:
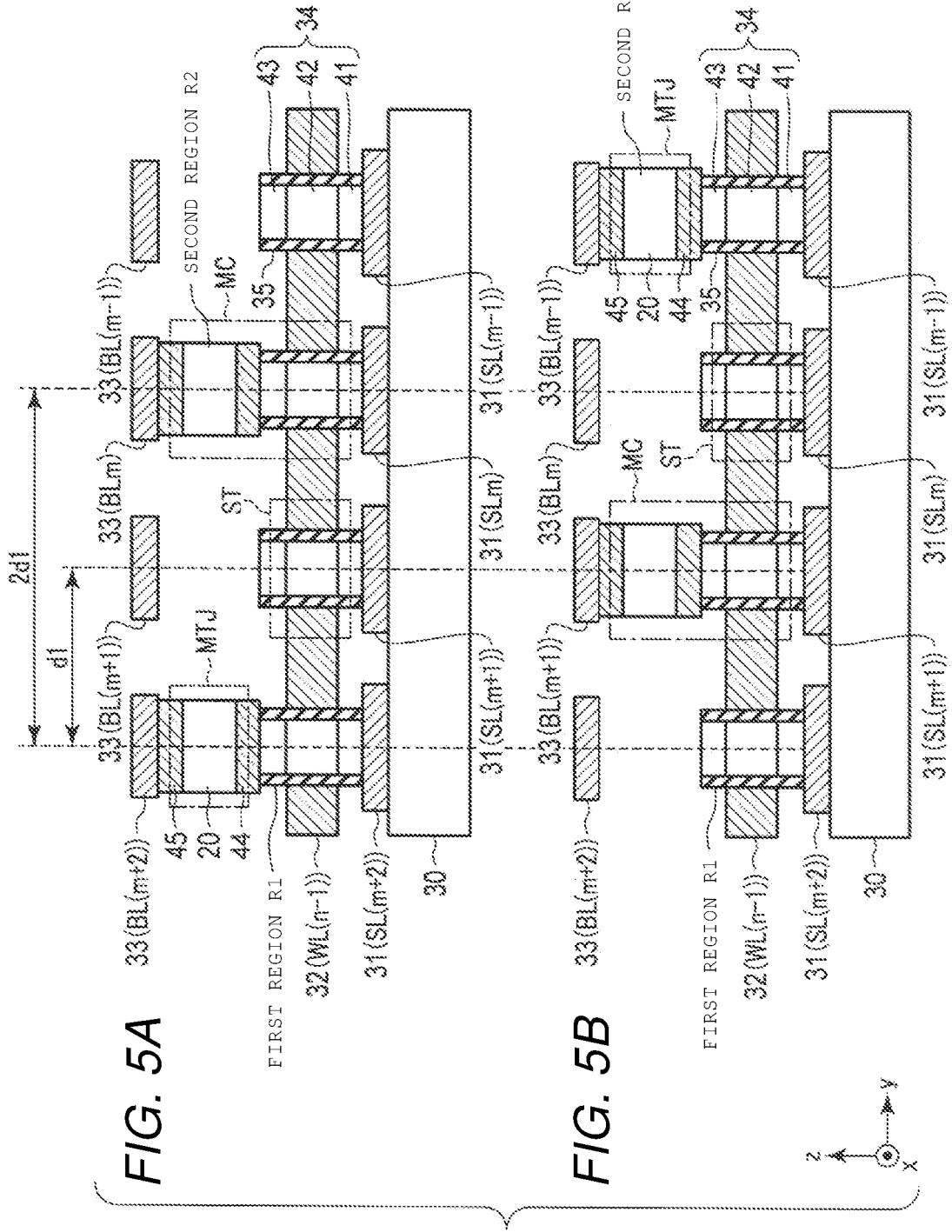
FIGS. 5A and 5B are sectional views for describing the configuration of the memory cell array of the semiconductor storage device according to the first embodiment.
Figure 6:
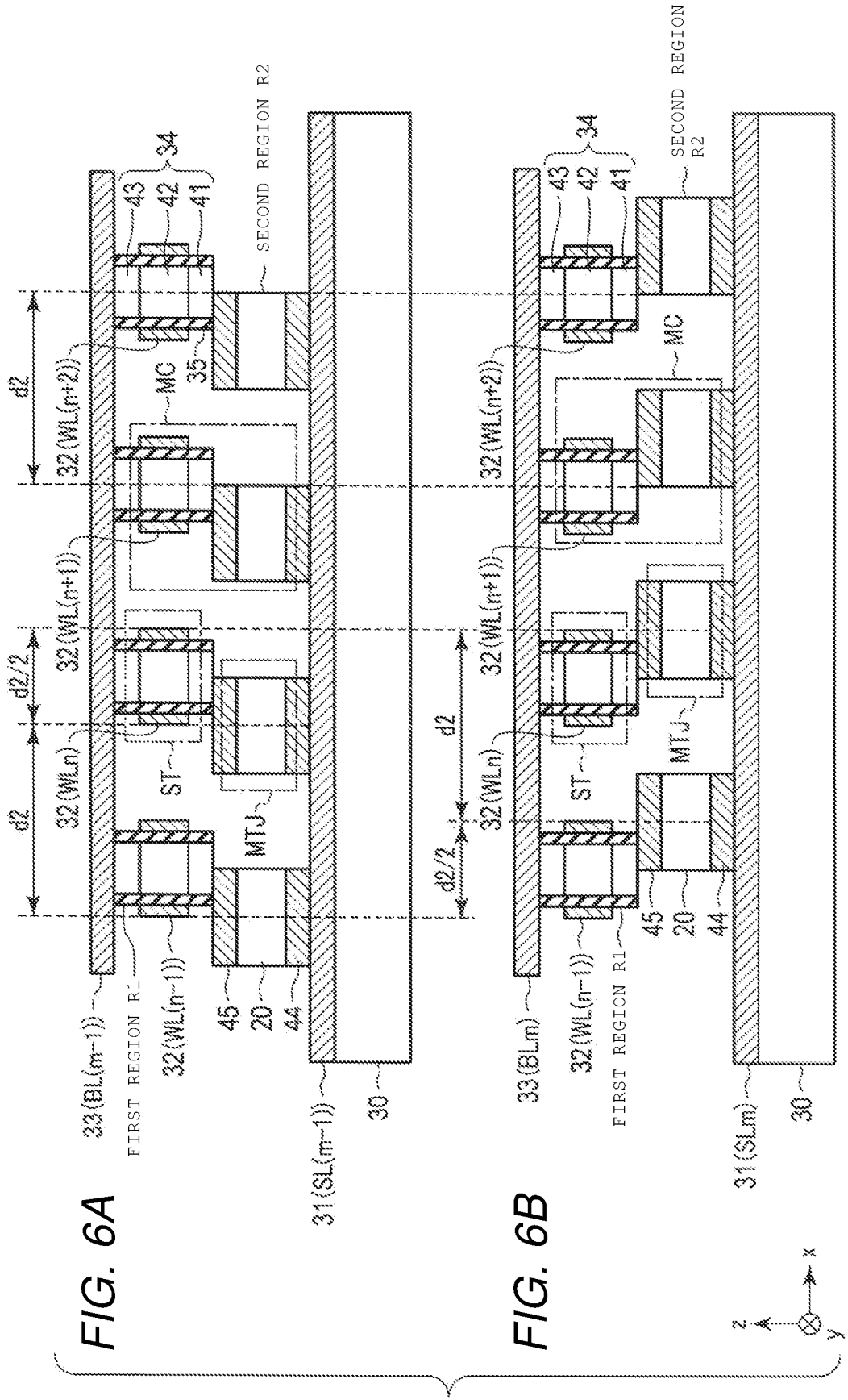
FIGS. 6A and 6B are sectional views for describing a configuration of a memory cell array of a semiconductor storage device according to a modification example of the first embodiment.
Figure 7:
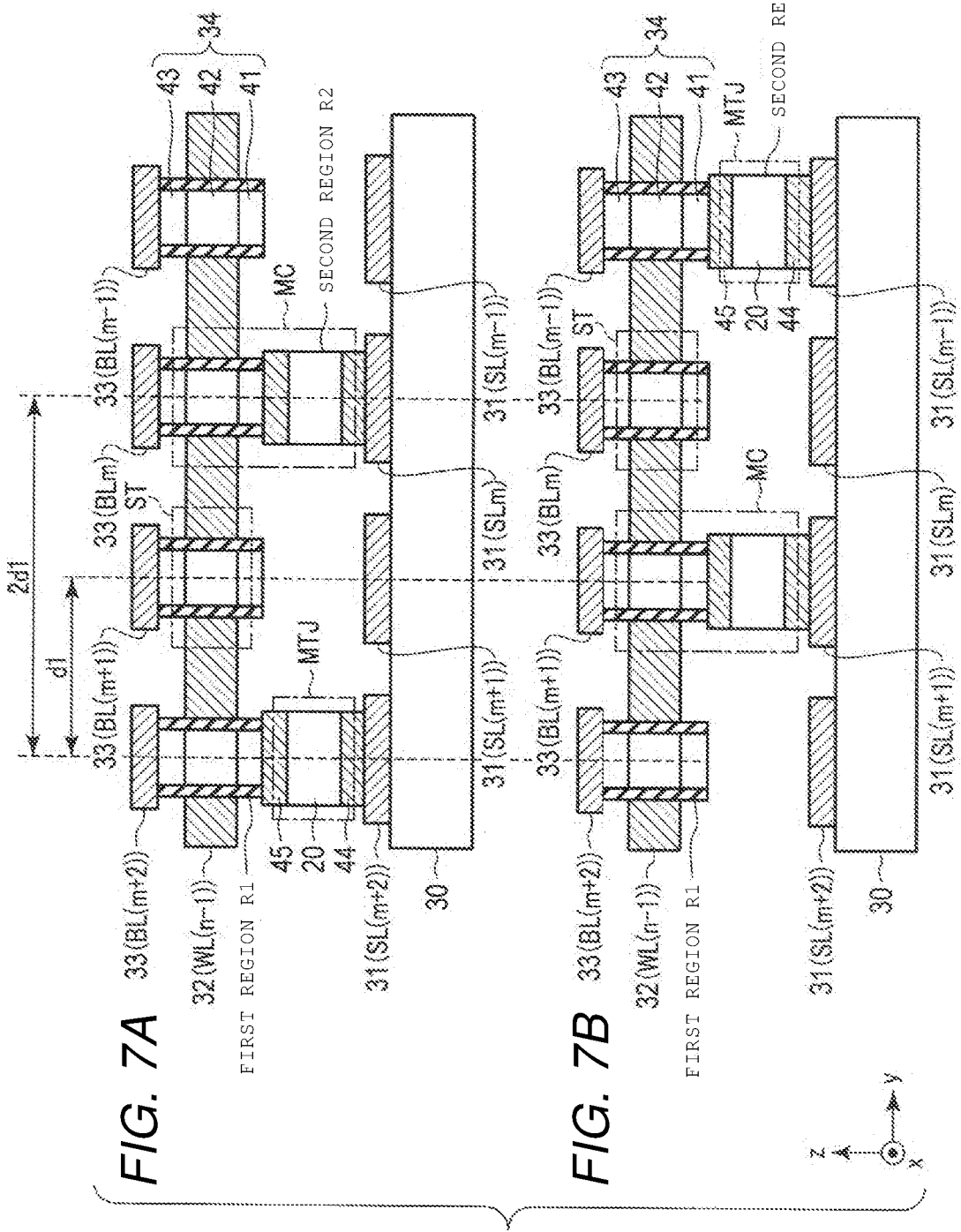
FIGS. 7A and 7B are sectional views for describing the configuration of the memory cell array of a semiconductor storage device according to the modification example of the first embodiment.

Initially, a layout of the memory cell array 11 in the xy-plane will be described with reference to FIG. 3. FIG. 3 is a top view of the memory cell array 11 of the semiconductor storage device according to the first embodiment when viewed in a +z-axis direction.

As shown in FIG. 3, a plurality of wiring layers 31 each functioning as the source line SL extends, for example, along the x-axis direction (also referred to herein as a column direction), and is arranged along the y-axis direction (also referred to herein as a row direction) at equal intervals. In the example of FIG. 3, four wiring layers 31 corresponding to an (m−1)-th-row source line SL(m−1), an m-th-row source line SLm, an (m+1)-th-row source line SL(m+1), and an (m+2)-th-row source line SL(m+2) are illustrated (where m is an arbitrary integer). Two wiring layers 31 adjacent to each other are separated from each other along the y-axis direction by a distance d1. The "two elements are separated from each other by a distance d along a certain direction" means that a distance between a center of a width of any one of the two elements in the certain direction and a center of a width of the other element in the certain direction is separated along the certain direction by the distance d.

A plurality of wiring layers 32 each functioning as the word line WL is formed above the wiring layers 31. For example, the wiring layers 32 extend along the y-axis direction, and are arranged along the x-axis direction at equal intervals. In the example of FIG. 3, four wiring layers 32 corresponding to an (n−1)-th-column word line WL(n−1), an n-th-column word line WLn, an (n+1)-th-column word line WL(n+1), and an (n+2)-th-column word line WL(n+2) are illustrated (where n is an arbitrary integer). Two wiring layers 32 adjacent to each other are separated from each other along the x-axis direction by a distance d2. The distance d2 is longer than the distance d1. A ratio (d1:d2) between the distance d1 and the distance d2 is expressed, for example, by the following expression.

$$d1:d2=\sqrt{3}/2:1$$

A plurality of wiring layers 33 each functioning as the bit line BL is formed above the wiring layers 32. For example, the wiring layers 33 extend along the x-axis direction, and are arranged along the y-axis direction at equal intervals. In the example of FIG. 3, four wiring layers 33 corresponding to a (m−1)-th-row bit line BL(m−1), an m-th-row bit line BLm, an (m+1)-th-row bit line BL(m+1), and an (m+2)-th-row bit line BL(m+2) are illustrated. Specifically, two wiring layers 33 adjacent to each other are separated from each other along the y-axis direction by the distance d1. Although a center of a width of the wiring layer 33 along the y-axis direction matches a center of a width of the wiring layer 31 in the y-axis direction in the xy-plane in the example of FIG. 3, the present embodiment is not limited thereto.

In FIG. 3, a selection element layer 34 functioning as the select transistor ST is formed in a region in which the wiring layers 31 and 33 intersect with the wiring layer 32. For example, the selection element layers 34 each have a cylindrical shape that extends along the z-axis direction, and are formed between the wiring layers 31 and the wiring layers 33. In the example of FIG. 3, a center of a circle (hereinafter, simply referred to as a "center" of the selection element layer 34) which is a section of the selection element 34 taken along the xy-plane, is located, for example, at an intersection of a central line of the wiring layer 31 or 33 on the x-axis direction and a central line of the wiring layer 32 along the y-axis direction. That is, the selection element layers 34 are arranged in a rectangular grid in the xy-plane. Specifically, the selection element layers 34 are arranged along the x-axis direction at equal intervals for every distance d2, and are arranged along the y-axis direction at equal intervals for every distance d1. The selection element layers are arranged in this manner, and thus, the selection element layers 34 are formed one by one for the combination of the wiring layers 31 and 33 in a certain row and the wiring layer 32 in a certain column.

In the following description, an element Y corresponding to the combination of the m-th-row wiring layers 31 and 33 and the n-th-column wiring layer 32 is described as an element Y(m, n) for simplicity of description.

In FIG. 3, the memory element layers 20 are formed such that at least some thereof overlap in regions occupied by the selection element layers 34. For example, the memory element layers 20 each have a cylindrical shape that extends along the z-axis direction, and are formed between the wiring layers 31 and the wiring layers 33.

The memory element layers 20 are arranged in a honeycomb shape in the xy-plane. Specifically, the memory element layers 20 are arranged in positions of vertices and a center of a regular hexagon of which a length of one side is the distance d2 in the xy-plane. More specifically, the memory element layers 20 are arranged along the x-axis direction at equal intervals for every distance d2, and are arranged along the y-axis direction at equal intervals for every distance 2d1. That is, an (m−1)-th-row memory element layer 20 and an (m+1)-th-row memory element layer 20 are aligned in the y-axis direction. An m-th-row memory element layer 20 and an (m+2)-th-row memory element layer 20 are aligned in the y-axis direction. However, the m-th-row memory element layer 20 and the (m−1)-th-row memory element layer 20 are not aligned in the y-axis direction, and the m-th-row memory element layer 20 and the (m+1)-th-row memory element layer 20 are not aligned in the y-axis direction.

In the example of FIG. 3, a center of a circle which is a section of the m-th-row memory element layer 20 taken along the xy-plane (hereinafter, simply referred to as a "center" of the memory element layer 20) is located in a position offset from a center of a width of the corresponding wiring layer 32 along the x-axis direction in the +x-axis direction. Centers of the (m−1)-th-row and (m+1)-th-row memory element layers 20 are located in positions offset from the center of the width of the corresponding wiring layer 32 along the x-axis direction in the −x-axis direction.

The center of the m-th-row memory element layer 20 is located in a position offset from the centers of the (m−1)-th-row and (m+1)-th-row memory element layers 20 along the x-axis direction by a distance d2/2.

The memory element layers are arranged in this manner, and thus, the memory element layers 20 are formed so as to correspond to the selection element layers 34, and are formed one by one for the combination of the wiring layers 31 and 33 in a certain row and the wiring layer 32 in a certain column. An arbitrary memory element layer 20 is disposed with equal distances from six memory element layers 20 adjacent to the arbitrary memory element layer 20 in the xy-plane. Specifically, six memory element layers 20(m, n−1), 20(m, n+1), 20(m−1, n), 20(m−1, n+1), 20(m+1, n), and 20(m+1, n+1) adjacent to the memory element layer 20(m, n) are arranged in the vertices of the regular hexagon of which one side is the distance d2, and the memory element layer 20(m, n) is disposed in the center of the regular hexagon. As another example, six memory element layers 20(m+1, n−1), 20(m+1, n+1), 20(m, n−1), 20(m, n), 20(m+2, n−1), and 20(m+2, n) adjacent to the memory element layer 20(m+1, n) are arranged in the vertices of the regular hexagon of which one side is the distance d2, and the memory element layer 20(m+1, n) is disposed in the center of the regular hexagon.

Hereinafter, configurations of sections of the memory cell array 11 described in FIG. 3 which are taken along the xz-plane and the yz-plane will be described with reference to FIGS. 4A to 5B. FIGS. 4A to 5B are examples of sectional views of the stacked structure of the memory cell array of the semiconductor storage device according to the first embodiment, which are taken along the xz-plane and the yz-plane. Specifically, FIGS. 4A to 5B are sections which are respectively taken along a line IVA-IVA, a line IVB-IVB, a line VA-VA, and a line VB-VB shown in FIG. 3. In FIGS. 4A to 5B, some insulating layers are omitted for simplicity of illustration.

Initially, the configuration of the section of the memory cell array 11 taken along the xz-plane will be described with reference to FIGS. 4A and 4B.

As shown in FIGS. 4A and 4B, on the semiconductor substrate 30, the wiring layer 31 functioning as the source line SL(m−1) is formed in the section taken along the line IVA-IVA, and the wiring layer 31 functioning as the source line SLm is formed in the section taken along the line IVB-IVB. The wiring layer 31 is commonly connected to the one-side ends of the select transistors ST of the plurality of memory cells MC arranged along the x-axis direction.

The plurality of wiring layers 32 functioning as the word lines WL(n−1), WLn, WL(n+1), and WL(n+2) is formed in the same layer above the wiring layers 31 at equal intervals for every distance d2. An insulating film (not shown) is formed between the wiring layers 31 and 32, between the plurality of wiring layers 32, and on top surfaces of the wiring layers 32.

First regions R1 are respectively formed in a plurality of regions in which the select transistors ST are formed. The first regions R1 are formed along the x-axis direction so as to be separated from one another by the distance d2. The first regions R1 are in contact with one of the plurality of wiring layers 32, and reach the wiring layers 31. An insulating layer 35 functioning as a block insulating film is formed on side surfaces of the first region R1. The selection element layer 34 including a semiconductor layer is formed within the first region R1. The selection element layer 34 includes a diffusion layer 41, a channel layer 42, and a diffusion layer 43. For example, the diffusion layer 41, the channel layer 42, and the diffusion layer 43 are sequentially stacked on the wiring layer 31. The channel layer 42 is formed in the same layer as that of the wiring layer 32. Accordingly, the wiring layer 32 functions as the gate of the select transistor ST formed within the first region R1 in contact with the wiring layer 32, and the channel layer 42 functions as a channel of the select transistor ST. The diffusion layers 41 and 43 include carriers, and function respectively as source and drain of the select transistor ST. For example, the select transistor ST functions as a vertical transistor including a current path along the z-axis direction.

Second regions R2 are respectively formed in a plurality of regions in which the magnetic tunnel junction elements MTJ are formed. The second regions R2 are formed along the x-axis direction so as to be separated from one another by the distance d2. Each second region R2 reaches a part of the upper end of the diffusion layer 43. A conductive layer 44, the memory element layer 20, and a conductive layer 45 are sequentially stacked within the second region R2. The conductive layers 44 and 45 function as a lower electrode and an upper electrode of the magnetic tunnel junction element MTJ, respectively. Accordingly, a one-side end of the magnetic tunnel junction element MTJ and the other-side end of the select transistor ST are connected to each other.

In a layer on an upper end of the conductive layer 45, the wiring layer 33 functioning as the bit line BL(m−1) is formed in the section taken along the line IVA-IVA, and the wiring layer 33 functioning as the bit line BLm is formed in the section taken along the line IVB-IVB. The wiring layer 33 is commonly connected to the other-side ends of the magnetic tunnel junction elements MTJ of the plurality of memory cells MC arranged along the x-axis direction.

The second region R2 is formed so as to be offset from the first region R1 in the x-axis direction while maintaining a state in which the conductive layer 44 is electrically connected to the diffusion layer 43. Specifically, the second region R2 is formed so as to be offset from the first region R1 in the −x-axis direction in the section taken along the line IVA-IVA, and is formed as to be offset from the first region R1 in the +x-axis direction in the section taken along the line IVB-IVB. The second region R2 in the section taken along the line IVA-IVA and the second region R2 in the section taken along the line IVB-IVB are formed so as to be offset from each other along the x-axis direction by the distance d2/2.

Hereinafter, the configuration of the section of the memory cell array 11 taken along the yz-plane will be described with reference to FIGS. 5A and 5B.

As shown in FIGS. 5A and 5B, the plurality of wiring layers 31 functioning as the plurality of source lines SL(m+2), SL(m+1), SLm, and SL(m−1) is formed on the semiconductor substrate 30 at equal intervals for every distance d1. The wiring layer 32 functioning as the word line WL(n−1) is formed above the wiring layer 31.

The first regions R1 are formed along the y-axis direction so as to be separated from one another by the distance d1. A center of a width of the first region R1 along the y-axis direction matches a center of a width of the wiring layer 31 formed immediately under the first region R1 along the y-axis direction. The select transistor ST having the same configuration as that of the select transistor ST described in FIGS. 4A and 4B is formed in the first region R1. The plurality of select transistors ST formed along the y-axis direction is commonly connected to the same wiring layer 32.

The second regions R2 are formed along the y-axis direction so as to be separated from one another by the distance 2d1. Specifically, the second regions R2 are formed above the wiring layers 31 functioning as the source lines SL(m+2) and SLm in the section taken along the line VA-VA. The second regions R2 are formed above the wiring layers 31 functioning as the source lines SL(m+1) and SL(m−1) in the section taken along the line VB-VB. The second regions R2 in the section taken along the line VA-VA and the second regions R2 in the section taken along the line VB-VB are formed along the y-axis direction so as to be separated from each other by the distance d1. A center of a width of the second region R2 along the y-axis direction matches centers of widths of the first region R1 formed immediately under the second region R2 and the wiring layer 31 along the y-axis direction. The magnetic tunnel junction element MTJ having the same configuration as that of the magnetic tunnel junction element MTJ described in FIGS. 4A and 4B is formed in the second region R2.

The plurality of wiring layers 33 functioning as the bit lines BL(m+2), BL(m+1), BLm, and BL(m−1) is formed in the layer on the upper end of the conductive layer 45 at equal intervals for every distance d1. The wiring layers 33 functioning as the bit lines BL(m+2) and BLm are respectively connected to the conductive layers 45 in the section taken along the line VA-VA, and the wiring layers 33 functioning as the bit lines BL(m+1) and BL(m−1) are connected to the conductive layers 45 in the section taken along the line VB-VB. A center of a width of the wiring layer 33 along the y-axis direction matches centers of widths of the second region R2, the first region R1, and the wiring layer 31 formed immediately under the wiring layer 33 along the y-axis direction.

1.2 Advantage According to Present Embodiment

According to the first embodiment, it is possible to set the distances between the adjacent memory elements to be at equal intervals while reducing a cell size. The present advantage will be described below.

The select transistor ST of the semiconductor storage device according to the first embodiment is the vertical transistor. Specifically, the select transistor ST is configured such that the diffusion layer 41, the channel layer 42, and the diffusion layer 43 are sequentially stacked along the z-axis direction. The wiring layer 32 is formed in the same layer as that of the channel layer 42. Accordingly, the wiring layer 32 is formed between the wiring layers 31 and 33. In other words, the wiring layer 32 is formed above the wiring layer 31 and under the wiring layer 33. Thus, the current path of the select transistor ST does not follow the xy-plane and can follow the z-axis direction, unlike a planar transistor. With the select transistor ST having a vertical configuration, the memory cell array 11 can be formed with a size (for example, 4F2 size) that is denser than a size (for example, 6F2 size) of the memory cell using the planar transistor.

The magnetic tunnel junction elements MTJ are arranged in the vertices and the center of the regular hexagon in the xy-plane. Specifically, the magnetic tunnel junction elements MTJ which correspond to the combination of the same bit line BL and the same source line SL and are adjacent to each other are separated from each other along the x-axis direction by the distance d2. The magnetic tunnel junction elements MTJ which correspond to the same word line WL and are adjacent to each other are separated from each other along the y-axis direction by the distance d1. The magnetic tunnel junction elements MTJ which correspond to the combination of the bit line BL and the source line SL in the m-th row and correspond to the n-th-column word line WL and the magnetic tunnel junction elements MTJ which correspond to the combination of the bit line BL and the source line SL in the (m+1)-th row and correspond to the n-th-column word line WL are separated from each other along the x-axis direction by the distance d2/2. Accordingly, it is possible to set the distances between all the magnetic tunnel junction elements MTJ adjacent to each other to be equal.

For example, an area necessary to arrange a certain number of memory cells MC according to the present embodiment is about 0.87 times of an area necessary when the memory cells are arranged in the rectangular grid. Thus, it is possible to acquire a memory cell array having a smaller area. When the arrangement of the memory cells MC according to the present embodiment is applied to the same area as that of the memory cells arranged in the rectangular grid, it is possible to arrange the same number of memory cells MC in wider intervals. Accordingly, it is possible to arrange the memory cells in a shape in which interference between the memory cells MC is reduced.

1.3 Modification Example of First Embodiment

Although the semiconductor storage device according to the first embodiment in which the magnetic tunnel junction element MTJ is formed above the select transistor ST is described, the present embodiment is not limited thereto. For example, the magnetic tunnel junction element MTJ may be formed under the select transistor ST.

FIGS. 6A to 7B are examples of sectional views of a stacked structure of a memory cell array of a semiconductor storage device according to a modification example of the first embodiment, which are taken along the xz-plane and the yz-plane. Specifically, FIGS. 6A to 7B show sections which are respectively taken along the line IVA-IVA, the line IVB-IVB, the line VA-VA, and the line VB-VB shown in FIG. 3, and correspond to FIGS. 4A to 5B.

As shown in FIGS. 6A to 7B, the magnetic tunnel junction element MTJ is formed on the wiring layer 31, the select transistor ST is formed on the magnetic tunnel junction element MTJ, and the wiring layer 33 is formed on the select transistor ST.

The magnetic tunnel junction element MTJ and the select transistor ST shown in FIGS. 6A to 7B are merely substituted for the magnetic tunnel junction element MTJ and the select transistor ST shown in FIGS. 4A to 5B in the z-axis direction, and the positional relation therebetween in the xy-plane is not changed.

With such a configuration, even when the select transistor ST is formed on the magnetic tunnel junction element MTJ, it is possible to acquire the same advantage as that of the first embodiment.

2. Second Embodiment

Hereinafter, a semiconductor storage device according to a second embodiment will be described. The magnetic tunnel junction element is offset from the select transistor along the x-axis direction in the first embodiment, whereas the magnetic tunnel junction element is offset from the select transistor along the y-axis direction in the second embodiment. Hereinafter, differences from the first embodiment will be described.

2.1 Stacked Structure of Memory Cell Array

A stacked structure of a memory cell array of the semiconductor storage device according to a second embodiment will be described below.

Figure 8:
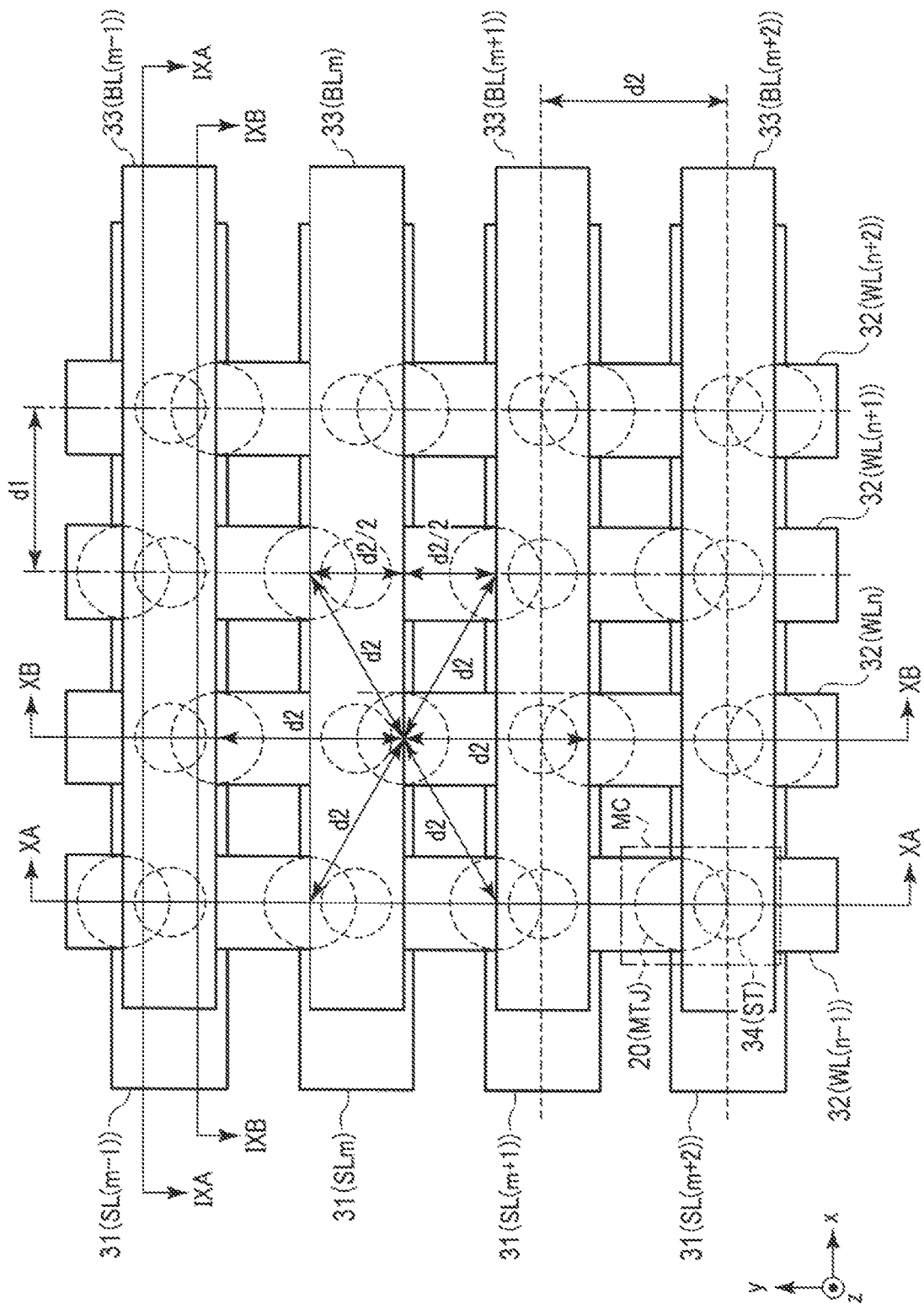
FIG. 8 is a top view for describing a configuration of a memory cell array of a semiconductor storage device according to a second embodiment.
Figures 12A, 12B:
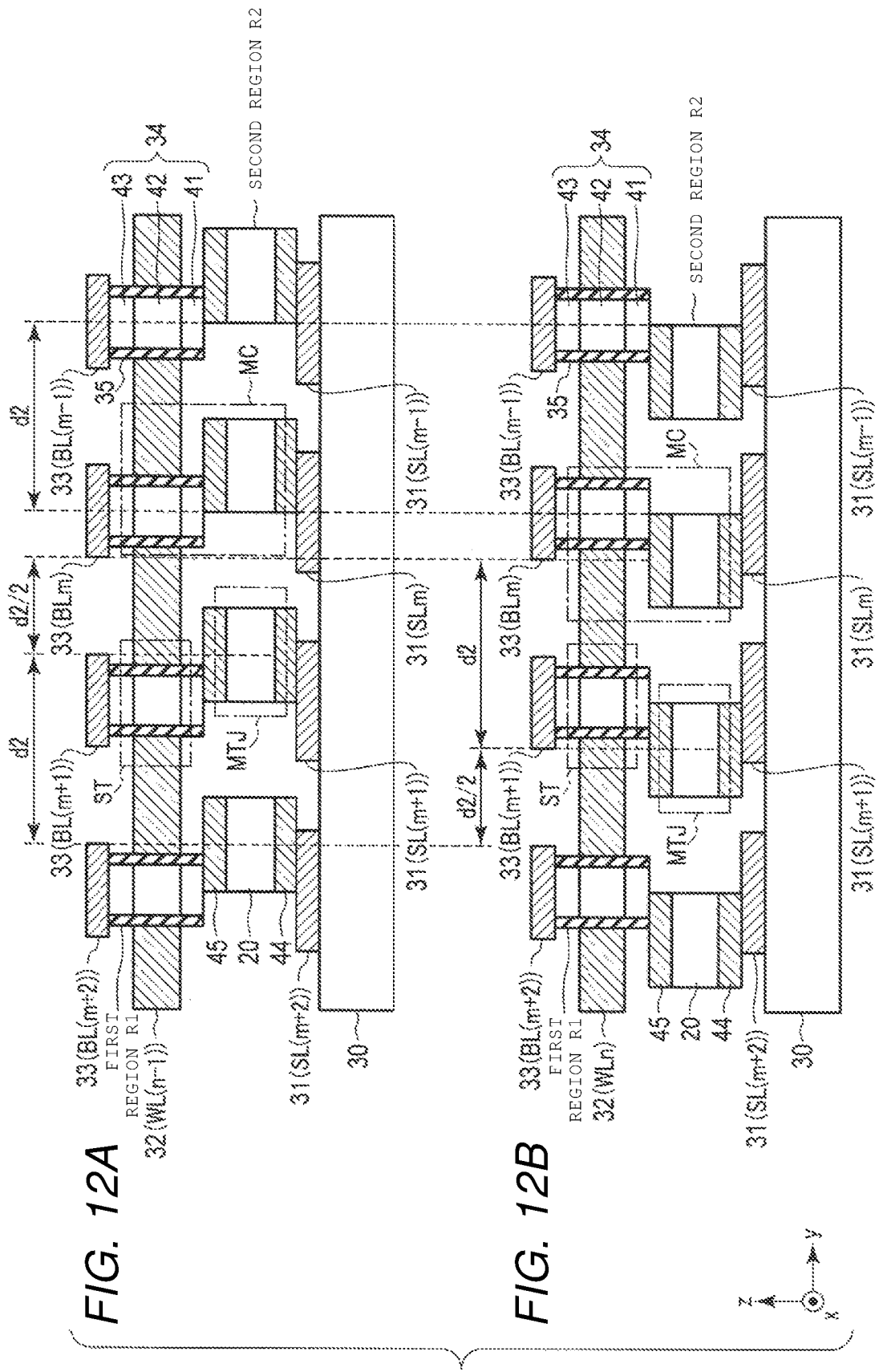
FIGS. 12A and 12B are sectional views for describing the configuration of the memory cell array of the semiconductor storage device according to the modification example of the second embodiment.

Initially, a layout of the memory cell array 11 in the xy-plane will be described with reference to FIG. 8. FIG. 8 is a top view of the memory cell array 11 of the semiconductor storage device according to the second embodiment when viewed in the +z-axis direction.

As shown in FIG. 8, two wiring layers 31 adjacent to each other are separated from each other along the y-axis direction by the distance d2. Two wiring layers 32 adjacent to each other are separated from each other along the x-axis direction by the distance d1. Two wiring layers 33 adjacent to each other are separated from each other along the y-axis direction by the distance d2. In the example of FIG. 8, a center of a width of the wiring layer 33 along the y-axis direction matches, for example, a center of a width of the wiring layer 31 along the y-axis direction in the xy-plane, and the present embodiment is not limited thereto.

Selection element layers 34 are arranged in a rectangular grid in the xy-plane. Specifically, the selection element layers 34 are arranged, for example, along the x-axis direction at equal intervals for every distance d1, and are arranged along the y-axis direction at equal intervals for every distance d2.

Memory element layers 20 are disposed in a honeycomb shape in the xy-plane. Specifically, the memory element layers 20 are arranged in a position of vertices and a center of a regular hexagon of which a length of one side is the distance d2 in the xy-plane. More specifically, the memory element layers 20 are arranged along the y-axis direction at equal intervals for every distance d2, and are arranged along the x-axis direction at equal intervals for every distance 2d1. That is, an (n−1)-th-column memory element layer 20 and an (n+1)-th-column memory element layer 20 are aligned in the x-axis direction. An n-th-column memory element layer 20 and an (n+2)-th-column memory element layer 20 are aligned in the x-axis direction. However, the n-th-column memory element layer 20, and the (n−1)-th-column memory element layer 20 are not aligned in the x-axis direction, and the n-th-column memory element layer 20 and the (n+1)-th-column memory element layer 20 are not aligned in the x-axis direction.

In the example of FIG. 8, a center of the n-th-column memory element layer 20 is located in a position, which is offset from a center of a width of the combination of the corresponding wiring layers 31 and 33 along the y-axis direction, in the −y-axis direction. Centers of the (n−1)-th-column and (n+1)-th-column memory element layers 20 are located in positions, which are offset from a center of a width of the combination of the corresponding wiring layers 31 and 33 along the y-axis direction, in the +y-axis direction. As a result, the center of the n-th-column memory element layer 20 is located in a position offset from the centers of the (n−1)-th-column and (n+1)-th-column memory element layers 20, along the y-axis direction by the distance d2/2.

The memory element layers are arranged in this manner, and thus, an arbitrary memory element layer 20 is disposed with equal distances from six memory element layers 20 adjacent to the arbitrary memory element layer 20 in the xy-plane. Specifically, for example, six memory element layers 20($m$−1, $n$), 20($m$+1, $n$), 20($m$, $n$−1), 20($m$+1, $n$−1), 20($m$, $n$+1), and 20($m$+1, $n$+1) adjacent to a memory element layer 20($m$, $n$) are arranged in the vertices of the regular hexagon of which one side is the distance d2, and the memory element layer 20($m$, $n$) is disposed in the center of the regular hexagon. As another example, six memory element layers 20($m$−1, $n$+1), 20($m$+1, $n$+1), 20($m$−1, $n$), 20($m$, $n$), 20($m$−1, $n$+2), and 20($m$, $n$+2) adjacent to the memory element layer 20($m$, $n$+1) are arranged in the vertices of the regular hexagon of which one side is the distance d2, and the memory element layer 20($m$, $n$+1) is disposed in the center of the regular hexagon.

Hereinafter, configurations of sections of the memory cell array 11 described in FIG. 8 which are taken along the xz-plane and the yz-plane will be described with reference to FIGS. 9A to 10B. FIGS. 9A to 10B are examples of sectional views of a stacked structure of the memory cell array of the semiconductor storage device according to the second embodiment, which are taken along the xz-plane and the yz-plane. Specifically, FIGS. 9A to 10B show sections taken along a line IXA-IXA, a line IXB-IXB, a line XA-XA, and a line XB-XB shown in FIG. 8. In the following description, differences between FIGS. 9A to 10B and FIGS. 4A to 5B will be described.

Initially, the configuration of the section of the memory cell array 11 taken along the xz-plane will be described with reference to FIGS. 9A and 9B.

As shown in FIGS. 9A and 9B, the plurality of wiring layers 32 functioning as the word lines WL(n−1), WLn, WL(n+1), and WL(n+2) is formed in the same layer above the wiring layer 31 at equal intervals for every distance d1.

First regions R1 are formed along the x-axis direction so as to be separated from one another by the distance d1. The first regions R1 are in contact with one of the plurality of wiring layers 32, and reach the wiring layers 31. The select transistor ST having the same configuration as that of the select transistor ST described in the above-described embodiment is formed in the first region R1.

Second regions R2 are formed along the x-axis direction so as to be separated from each other by the distance 2d1. Specifically, the second regions R2 are formed above the wiring layers 32 functioning as the word lines WL(n−1) and WL(n+1) in the section taken along the line IXA-IXA. The second regions R2 are formed above the wiring layers 32 functioning as the word lines WLn and WL(n+2) in the section taken along the line IXB-IXB. The second region R2 in the section taken along the line IXA-IXA and the second region R2 in the section taken along the line IXB-IXB are formed along the x-axis direction so as to be separated from each other by the distance d1. A center of a width of the second region R2 along the x-axis direction matches a center of a width of the first region R1 formed immediately under the second region R2 along the x-axis direction. The magnetic tunnel junction element MTJ having the same configuration as that of the magnetic tunnel junction element MTJ described in the above-described embodiment is formed in the second region R2.

Hereinafter, the configuration of the section of the memory cell array 11 taken along the yz-plane will be described with reference to FIGS. 10A and 10B.

As shown in FIGS. 10A and 10B, the plurality of wiring layers 31 functioning as the plurality of source lines SL(m+2), SL(m+1), SLm, and SL(m−1) is formed on the semiconductor substrate 30 at equal intervals for every distance d2. Above the wiring layer 31, the wiring layer 32 functioning as the word line WL(n−1) is formed in the section taken along the line XA-XA, and the wiring layer 32 functioning as the word line WLn in the section taken along the line XB-XB.

The first regions R1 are formed along the y-axis direction so as to be separated from one another by the distance d2. A center of a width of the first region R1 along the y-axis direction matches a center of a width of the wiring layer 31 formed immediately under the first region R1 along the y-axis direction. The select transistor ST having the same configuration as that of the select transistor ST described in the above-described embodiment is formed in the first region R1.

The second regions R2 are formed along the y-axis direction so as to be separated from one another by the distance d2. The second region R2 is formed so as to be offset from the first region R1 in the y-axis direction while maintaining a state in which the conductive layer 44 is electrically connected to the diffusion layer 43. Specifically, the second region R2 is formed so as to be offset from the first region R1 in the +y-axis direction in the section taken along the line XA-XA, and is formed so as to be offset from the first region R1 in the −y-axis direction in the section taken along the line XB-XB. The second region R2 in the section taken along the line XA-XA and the second region R2 in the section taken along the line XB-XB are formed along the x-axis direction so as to be offset from each other along the x-axis direction by the distance d2/2. The magnetic tunnel junction element MTJ having the same configuration as that of the magnetic tunnel junction element MTJ described in the above-described embodiment is formed in the second region R2.

The plurality of wiring layers 33 functioning as the bit lines BL(m+2), BL(m+1), BLm, and BL(m−1) is formed on an upper end of the conductive layer 45 at equal intervals by the distance d2. A center of a width of the wiring layer 33 along the y-axis direction matches centers of widths of the first region R1 and the wiring layer 31 formed immediately under the wiring layer 33 along the y-axis direction.

2.2 Advantage According to Present Embodiment

According to the second embodiment, the magnetic tunnel junction elements MTJ are disposed in the vertices and the center of the regular hexagon in the xy-plane. Specifically, the magnetic tunnel junction elements MTJ which correspond to the same word line WL and are adjacent to each other are separated from each other along the y-axis direction by the distance d2. The magnetic tunnel junction elements MTJ which correspond to the combination of the same bit line BL and the same source line SL and are adjacent to each other are separated from each other along the x-axis direction by the distance d1. The magnetic tunnel junction elements MTJ which correspond to the combination of the bit line BL and the source line SL in the m-th row and correspond to the n-th-column word line WL and the magnetic tunnel junction elements MTJ which correspond to the combination of the bit line BL and the source line SL in the m-th row and correspond to the (n+1)-th-column word line WL are separated from each other along the y-axis direction by the distance d2/2. Accordingly, it is possible to set the distances between all the magnetic tunnel junction elements MTJ adjacent to each other to be equal. Thus, a manufacturing fluctuation in a manufacturing stage can be reduced in the embodiment compared to the arrangement in which the distances between all the magnetic tunnel junction elements adjacent to each other are not equal, such as in the case of the memory cells arranged in the rectangular grid.

In addition, according to the second embodiment, it is possible to similarly acquire other advantages mentioned in the first embodiment.

2.3 Modification Example of Second Embodiment

Although the semiconductor storage device according to the second embodiment in which the magnetic tunnel junction element MTJ is formed above the select transistor ST is described, the present embodiment is not limited thereto. For example, the magnetic tunnel junction element MTJ may be formed under the select transistor ST.

FIGS. 11A to 12B are examples of sectional views of a stacked structure of a memory cell array of a semiconductor storage device according to a modification example of the second embodiment, which are taken along the xz-plane and the yz-plane. Specifically, FIGS. 11A to 12B show sections taken along the line IXA-IXA, the line IXB-IXB, the line XA-XA, and the line XB-XB shown in FIG. 8, and correspond to FIGS. 9A to 10B.

As shown in FIGS. 11A to 12B, the magnetic tunnel junction element MTJ is formed on the wiring layer 31, the select transistor ST is formed on the magnetic tunnel junction element MTJ, and the wiring layer 33 is formed on the select transistor ST.

The magnetic tunnel junction element MTJ and the select transistor ST shown in FIGS. 11A to 12B are merely substituted for the magnetic tunnel junction element MTJ and the select transistor ST shown in FIGS. 9A to 10B in the z-axis direction, and the positional relation therebetween in the xy-plane is not changed.

With such a configuration, even when the select transistor ST is formed on the magnetic tunnel junction element MTJ, it is possible to acquire the same advantage as that of the second embodiment.

3. Third Embodiment

Hereinafter, a semiconductor storage device according to a third embodiment will be described. The select transistors are arranged in the rectangular grid in the first embodiment and the second embodiment, whereas the select transistors are arranged in a honeycomb shape in the third embodiment. In the third embodiment, the select transistors are arranged similarly to the arrangement of the magnetic tunnel junction elements described in the first embodiment. That is, in the third embodiment, a center of the select transistor in the xy-plane matches a center of the magnetic tunnel junction element. Hereinafter, differences from the first embodiment will be described.

3.1 Stacked Structure of Memory Cell Array

A stacked structure of a memory cell array of a semiconductor storage device according to the third embodiment will be described below.

Figure 13:
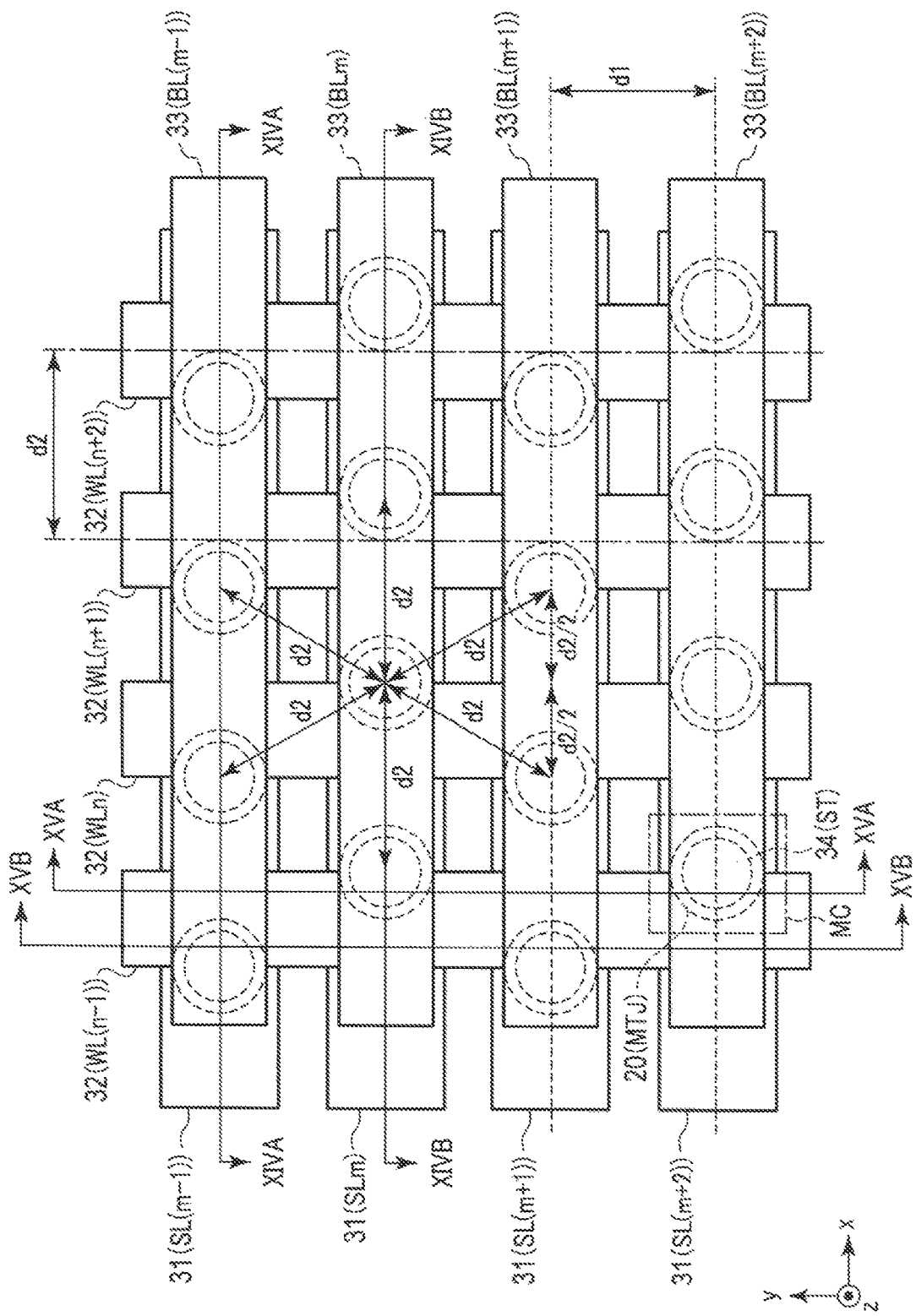
FIG. 13 is a top view for describing a configuration of a memory cell array of a semiconductor storage device according to a third embodiment.

Initially, a layout of the memory cell array 11 in the xy-plane will be described with reference to FIG. 13. FIG. 13 is a top view of the memory cell array 11 of the semiconductor storage device according to the third embodiment when viewed in the +z-axis direction.

As shown in FIG. 13, the arrangement of the wiring layers 31 to 33 and the memory element layers 20 is the same as that of the first embodiment, and thus, the description is omitted.

The selection element layers 34 are arranged in the honeycomb shape in the xy-plane. Specifically, the selection element layers 34 are arranged in vertices and a center of a regular hexagon of which a length of one side is the distance d2 in the xy-plane. More specifically, the selection element layers 34 are arranged along the x-axis direction at equal intervals for every distance d2, and are arranged along the y-axis direction at equal intervals for every distance 2d1. That is, an (m−1)-th-row selection element layer 34 and an (m+1)-th-row selection element layer 34 are aligned in the y-axis direction. An m-th-row selection element layer 34 and an (m+2)-th-row selection element layer 34 are aligned in the y-axis direction. However, the m-th-row selection element layer 34 and the (m−1)-th-row selection element layer 34, and the m-th-row selection element layer 34 and the (m+1)-th-row selection element layer 34 are not aligned in the y-axis direction.

In the example of FIG. 13, a center of the m-th-row selection element layer 34 is disposed so as to match a center of the memory element layer 20 in the xy-plane. That is, a center of the m-th-row selection element layer 34 is located in a position offset from centers of the (m−1)-th-row and (m+1)-th-row selection element layers 34 along the x-axis direction by the distance d2/2.

The selection element layers are arranged in this manner, and thus, an arbitrary selection element layer 34 is disposed with equal distances from six selection element layers 34 adjacent to the arbitrary selection element layer 34 in the xy-plane. Specifically, for example, six selection element layers 34(m, n−1), 34(m, n+1), 34(m−1, n), 34(m−1, n+1), 34(m+1, n), and 34(m+1, n+1) adjacent to the selection element layer 34(m, n) are arranged in the vertices of the regular hexagon of which one side is the distance d2, and the selection element layer 34(m, n) is disposed in the center of the regular hexagon. As another example, six selection element layers 34(m+1, n−1), 34(m+1, n+1), 34(m, n−1), 34(m, n), 34(m+2, n−1), and 34(m+2, n) adjacent to the selection element layer 34(m+1, n) are arranged in the vertices of the regular hexagon of which one side is the distance d2, and the selection element layer 34(m+1, n) is disposed in the center of the regular hexagon.

Hereinafter, configurations of sections of the memory cell array 11 described in FIG. 13 which are taken along the xz-plane and the yz-plane will be described with reference to FIGS. 14A to 15B. FIGS. 14A to 15B are examples of sectional views of a stacked structure of the memory cell array of the semiconductor storage device according to the third embodiment, which are taken along the xz-plane and the yz-plane. Specifically, FIGS. 14A to 15B show sections taken along a line XIVA-XIVA, a line XIVB-XIVB, a line XVA-XVA, and a line XVB-XVB shown in FIG. 13. In the following description, differences between FIGS. 14A to 15B and FIGS. 4A to 5B will be described.

Initially, the configuration of the section of the memory cell array 11 taken along the xz-plane will be described with reference to FIGS. 14A and 14B.

As shown in FIGS. 14A and 14B, the first region R1 is formed so as to be in contact with a part of the wiring layer 32. Specifically, the first region R1 is in contact with a part of the wiring layer 32 on the −x-axis in the section taken along the line XIVA-XIVA, and is in contact with a part of the wiring layer 32 on the +x-axis in the section taken along the line XIVB-XIVB. A center of a width of the first region R1 along the x-axis direction matches a center of a width of the second region R2 formed immediately above the first region R1 along the x-axis direction.

That is, the combination of the first region R1 and the second region R2 is formed so as to be offset from the wiring layer 32 in the −x-axis direction in the section taken along the line XIVA-XIVA, and is formed so as to be offset from the wiring layer 32 in the +x-axis direction in the section taken along the line XIVB-XIVB. The combination of the first region R1 and the second region R2 in the section taken along the line XIVA-XIVA and the combination of the first region R1 and the second region R2 in the section taken along the line XIVB-XIVB are formed so as to be offset from each other along the x-axis direction by the distance d2/2.

Hereinafter, the configuration of the section of the memory cell array 11 taken along the yz-plane will be described with reference to FIGS. 15A and 15B.

Figures 15A, 15B:
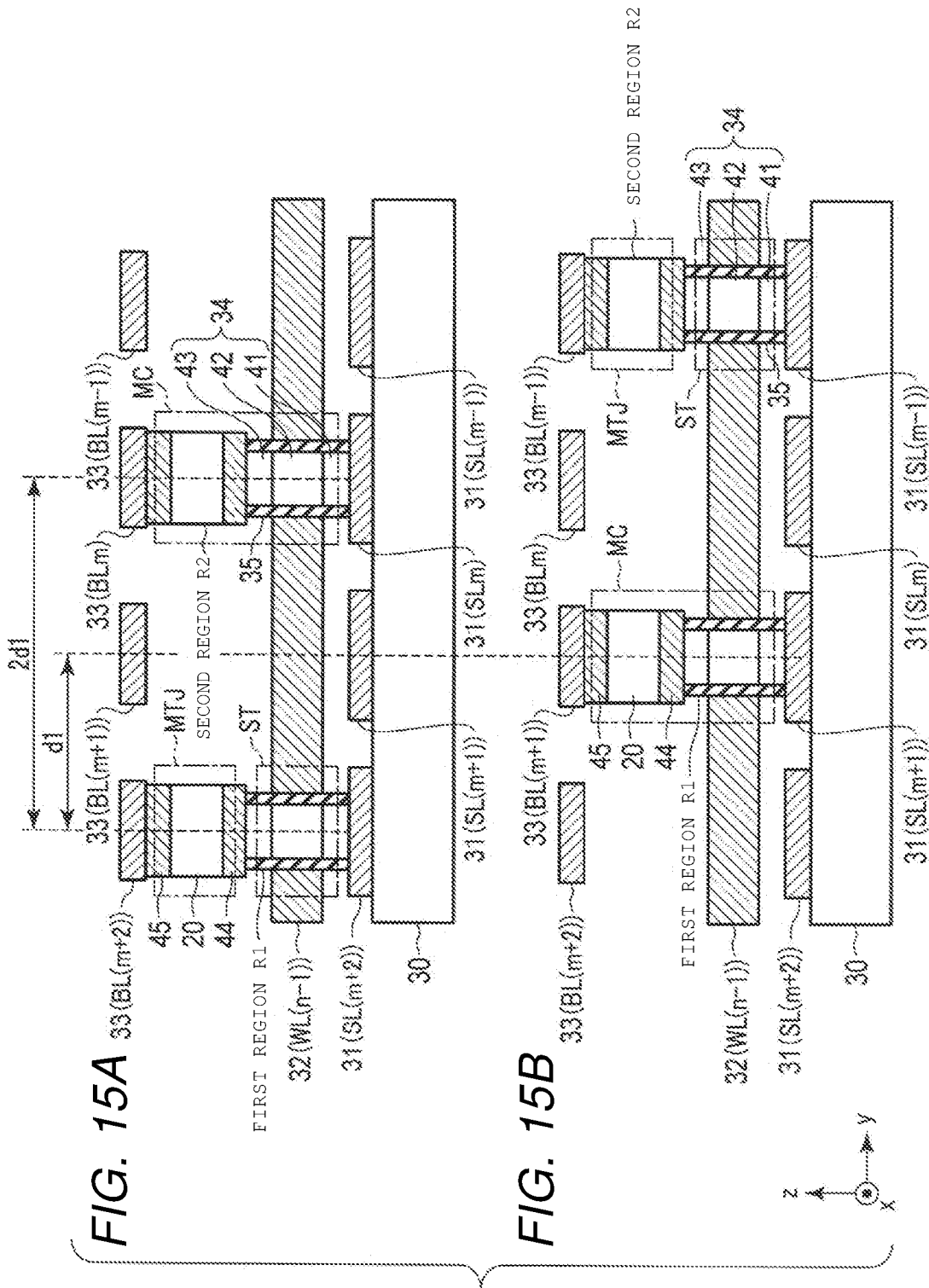
FIGS. 15A and 15B are sectional views for describing the configuration of the memory cell array of the semiconductor storage device according to the third embodiment.

As shown in FIGS. 15A and 15B, the first regions R1 are formed along the y-axis direction so as to be separated from one another by the distance 2d1. Specifically, the first regions R1 are formed above the wiring layers 31 functioning as the source lines SL(m+2) and SLm in the section taken along the line XVA-XVA. The first regions R1 are formed above the wiring layers 31 functioning as the source lines SL(m+1) and SL(m−1) in the section taken along the line XVB-XVB. The first region R1 in the section taken along the line XVA-XVA and the first region R1 in the section taken along the line XVB-XVB are formed along the y-axis direction so as to be separated from each other by the distance d1.

3.2 Advantage According to Present Embodiment

According to the third embodiment, the select transistors ST are disposed in the vertices and the center of the regular hexagon in the xy-plane. Specifically, the select transistors ST which correspond to the combination of the same bit line BL and the same source line SL and are adjacent to each other are separated from each other along the x-axis direction by the distance d2. The select transistors ST which correspond to the same word line WL and are adjacent to each other are separated from each other along the y-axis direction by the distance d1. The select transistors ST which correspond to the combination of the bit line BL and the source line SL in the m-th row and correspond to the n-th-column word line WL and the select transistors ST which correspond to the combination of the bit line BL and the source line SL in the (m+1)-th row and correspond to the n-th-column word line WL are separated from each other along the x-axis direction by the distance d2/2. Accordingly, it is possible to set the distances between all the select transistors ST adjacent to each other to be equal. Thus, it is possible to reduce a manufacturing fluctuation in a manufacturing stage.

A center of the select transistor ST matches a center of the magnetic tunnel junction element MTJ in the xy-plane. Accordingly, it is possible to increase a contact area between the select transistor ST and the magnetic tunnel junction element MTJ. It is possible to further reduce an area occupied by the memory cell in the xy-plane.

In addition, according to the third embodiment, it is possible to similarly acquire other advantages mentioned in the first embodiment.

3.3 Modification Example of Third Embodiment

Although the semiconductor storage device according to the third embodiment in which the magnetic tunnel junction element MTJ is formed above the select transistor ST is described, the present embodiment is not limited thereto. For example, the magnetic tunnel junction element MTJ may be formed under the select transistor ST.

FIGS. 16A to 17B are examples of sectional views of a stacked structure of a memory cell array of a semiconductor storage device according to a modification example of the third embodiment, which are taken along the xz-plane and the yz-plane. Specifically, FIGS. 16A to 17B show sections taken along the line XIVA-XIVA, the line XIVB-XIVB, the line XVA-XVA, and the line XVB-XVB shown in FIG. 13, and correspond to FIGS. 14A to 15B.

As shown in FIGS. 16A to 17B, the magnetic tunnel junction element MTJ is formed on the wiring layer 31, the select transistor ST is formed on the magnetic tunnel junction element MTJ, and the wiring layer 33 is formed on the select transistor ST.

The magnetic tunnel junction element MTJ and the select transistor ST shown in FIGS. 16A to 17B are merely substituted for the magnetic tunnel junction element MTJ and the select transistor ST shown in FIGS. 14A to 15B in the z-axis direction, and the positional relation therebetween in the xy-plane is not changed.

With such a configuration, even when the select transistor ST is formed on the magnetic tunnel junction element MTJ, it is possible to acquire the same advantage as that of the third embodiment.

4. Fourth Embodiment

Hereinafter, a semiconductor storage device according to a fourth embodiment will be described. In the fourth embodiment, the fourth embodiment is different from the first embodiment and the second embodiment in that the select transistors are arranged in the honeycomb shape, similarly to the third embodiment. In the fourth embodiment, the select transistors are arranged similarly to the arrangement of the magnetic tunnel junction elements described in the second embodiment. That is, in the fourth embodiment, the select transistors are arranged together with the magnetic tunnel junction elements along the y-axis direction, and a central position of the select transistor matches a center of the magnetic tunnel junction element in the xy-plane. Hereinafter, differences from the second embodiment will be described.

4.1 Stacked Structure of Memory Cell Array

A stacked structure of a memory cell array of the semiconductor storage device according to the fourth embodiment will be described below.

Figure 18:
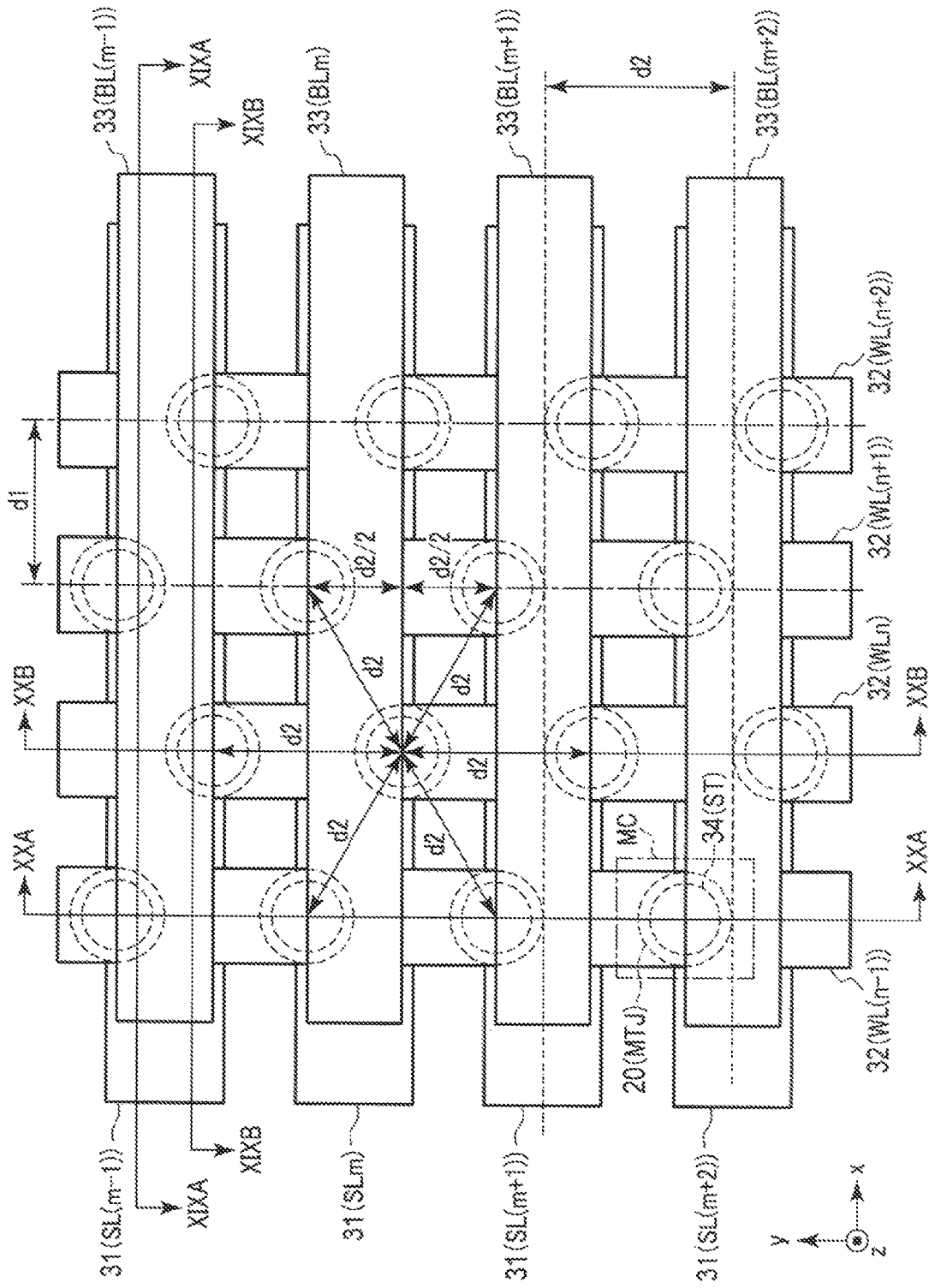
FIG. 18 is a top view for describing a configuration of a memory cell array of a semiconductor storage device according to a fourth embodiment.

Initially, a layout of the memory cell array 11 in the xy-plane will be described with reference to FIG. 18. FIG. 18 is a top view of the memory cell array 11 of the semiconductor storage device according to the fourth embodiment when viewed in the +z-axis direction.

As shown in FIG. 18, the arrangement of the wiring layers 31 to 33 and the memory element layers 20 is the same as that of the second embodiment, and thus, the description is omitted.

The selection element layers 34 are arranged in the honeycomb shape in the xy-plane. Specifically, the selection element layers 34 are arranged in vertices and a center of a regular hexagon of which a length of one side is the distance d2 in the xy-plane. More specifically, the selection element layers 34 are arranged along the y-axis direction at equal intervals for every distance d2, and are arranged along the x-axis direction at equal intervals for every distance 2d1. That is, the (n−1)-th-column selection element layer 34 and the (n+1)-th-column selection element layer 34 are aligned in the x-axis direction. The n-th-column selection element layer 34 and the (n+2)-th-column selection element layer 34 are aligned in the x-axis direction. However, the n-th-column selection element layer 34 and the (n−1)-th-column selection element layer 34, and the n-th-column selection element layer 34 and the (n+1)-th-column selection element layer 34 are not aligned in the x-axis direction.

In the example of FIG. 18, a center of the selection element layer 34 is disposed so as to match a center of the memory element layer 20 in the xy-plane. That is, the center of the n-th-column selection element layer 34 is located in a position offset from the centers of the (n−1)-th-column and (n+1)-th-column selection element layers 34, along the y-axis direction by the distance d2/2.

The selection element layers are arranged in this manner, and thus, an arbitrary selection element layer 34 is disposed with equal distances from six selection element layers 34 adjacent to the arbitrary selection element layer 34 in the xy-plane. Specifically, for example, six selection element layers 34(m−1, n), 34(m+1, n), 34(m, n−1), 34(m+1, n−1), 34(m, n+1), and 34(m+1, n+1) adjacent to the selection element layer 34(m, n) are arranged in the vertices of the regular hexagon of which one side is the distance d2, and the selection element layer 34(m, n) is disposed in the center of the regular hexagon. As another example, six selection element layers 34(m−1, n+1), 34(m+1, n+1), 34(m−1, n), 34(m, n), 34(m−1, n+2), and 34(m, n+2) adjacent to the selection element layer 34(m, n+1) are arranged in the vertices of the regular hexagon of which one side is the distance d2, and the selection element layer 34(m, n+1) is disposed in the center of the regular hexagon.

Hereinafter, configurations of sections of the memory cell array 11 described in FIG. 18 which are taken along the xz-plane and the yz-plane will be described with reference to FIGS. 19A to 20B. FIGS. 19A to 20B are examples of sectional views of a stacked structure of the memory cell array of the semiconductor storage device according to the fourth embodiment, which are taken along the xz-plane and the yz-plane. Specifically, FIGS. 19A to 20B show sections taken along a line XIXA-XIXA, a line XIXB-XIXB, a line XXA-XXA, and a line XXB-XXB shown in FIG. 18. In the following description, differences between FIGS. 19A to 20B and FIGS. 9A to 10B will be described.

Initially, the configuration of the section of the memory cell array 11 taken along the xz-plane will be described with reference to FIGS. 19A and 19B.

As shown in FIGS. 19A and 19B, the first regions R1 are formed so as to be in contact with the wiring layers 32 functioning as the word lines WL(n−1) and WL(n+1) and reach the wiring layers 31 in the section taken along the line XIXA-XIXA. The first regions R1 are formed so as to be in contact with the wiring layers 32 functioning as the word lines WLn and WL(n+2) and reach the wiring layers 31 in the section taken along the line XIXB-XIXB. The first region R1 in the section taken along the line XIXA-XIXA and the first region R1 in the section taken along the line XIXB-XIXB are formed along the x-axis direction so as to be separated from each other by the distance d1.

Hereinafter, the configuration of the section of the memory cell array 11 taken along the yz-plane will be described with reference to FIGS. 20A and 20B.

As shown in FIGS. 20A and 20B, the first region R1 is formed so as to reach a part of an upper end of the wiring layer 31. Specifically, the first region R1 reaches a part of the wiring layer 31 on the +y-axis in the section taken along the line XXA-XXA, and reaches a part of the wiring layer 31 on the −y-axis in the section taken along the line XXB-XXB. A center of a width of the first region R1 along the y-axis direction matches a center of a width of the second region R2 formed immediately above the first region R1 along the y-axis direction.

That is, the combination of the first region R1 and the second region R2 is formed so as to be offset from the wiring layer 31 in the +y-axis direction in the section taken along the line XXA-XXA, and is formed so as to be offset from the wiring layer 31 in the −y-axis direction in the section taken along the line XXB-XXB. The combination of the first region R1 and the second region R2 in the section taken along the line XXA-XXA and the combination of the first region R1 and the second region R2 in the section taken along the line XXB-XXB are formed along the y-axis direction so as to be offset from each other by the distance d2/2.

4.2 Advantage According to Present Embodiment

According to the fourth embodiment, the select transistors ST are disposed in the vertices and the center of the regular hexagon in the xy-plane. Specifically, the select transistors ST which correspond to the same word line WL and are adjacent to each other are separated from each other along the y-axis direction by the distance d2. The select transistors ST which correspond to the combination of the same bit line BL and the same source line SL and are adjacent to each other are separated from each other along the x-axis direction by the distance d1. The select transistors ST which correspond to the combination of the bit line BL and the source line SL in the m-th row and correspond to the n-th-column word line WL and the select transistors ST which correspond to the combination of the bit line BL and the source line SL in the m-th row and correspond to the (n+1)-th-column word line WL are separated from each other along the y-axis direction by the distance d2/2. Accordingly, it is possible to set the distances between all the select transistors ST to be equal. Thus, it is possible to reduce a manufacturing fluctuation in a manufacturing stage.

A center of the select transistor ST matches a center of the magnetic tunnel junction element MTJ in the xy-plane. Accordingly, it is possible to increase a contact area between the select transistor ST and the magnetic tunnel junction element MTJ. It is possible to further reduce an area occupied by the memory cell in the xy-plane.

In addition, according to the fourth embodiment, it is possible to similarly acquire other advantages mentioned in the second embodiment.

4.3 Modification Example of Fourth Embodiment

Although the semiconductor storage device according to the fourth embodiment in which the magnetic tunnel junction element MTJ is formed above the select transistor ST is described, the present embodiment is not limited thereto. For example, the magnetic tunnel junction element MTJ may be formed under the select transistor ST.

FIGS. 21A to 22B are examples of sectional views of a stacked structure of a memory cell array of a semiconductor storage device according to a modification example of the fourth embodiment, which are taken along the xz-plane and the yz-plane. Specifically, FIGS. 21A to 22B show sections taken along the line XIXA-XIXA, the line XIXB-XIXB, the line XXA-XXA, and the line XXB-XXB shown in FIG. 18, and correspond to FIGS. 19A to 20B.

As shown in FIGS. 21A to 22B, the magnetic tunnel junction element MTJ is formed on the wiring layer 31, the select transistor ST is formed on the magnetic tunnel junction element MTJ, and the wiring layer 33 is formed on the select transistor ST.

The magnetic tunnel junction element MTJ and the select transistor ST shown in FIGS. 21A to 22B are merely substituted for the magnetic tunnel junction element MTJ and the select transistor ST shown in FIGS. 19A to 20B in the z-axis direction, and the positional relation therebetween in the xy-plane is not changed.

With such a configuration, even when the select transistor ST is formed on the magnetic tunnel junction element MTJ, it is possible to acquire the same advantage as that of the fourth embodiment.

5. Fifth Embodiment

Hereinafter, a semiconductor storage device according to a fifth embodiment will be described. In the third embodiment, the select transistors are offset from the word lines in the same direction as the magnetic tunnel junction elements, and thus, the select transistors are arranged in the honeycomb shape. In contrast, the fifth embodiment is different from the third embodiment in that the select transistors are offset from the word line in a direction opposite to a direction the magnetic tunnel junction elements are offset, and thus, the select transistors are arranged in the honeycomb shape. That is, in the fifth embodiment, when the center of the magnetic tunnel junction element is offset from the word line in the +x-axis direction, the center of the select transistor is offset from the word line in the −x-axis direction. When the center of the magnetic tunnel junction element is offset from the word line in the −x-axis direction, the center of the select transistor is offset from the word line in the +x-axis direction. Hereinafter, differences from the third embodiment will be described.

5.1 Stacked Structure of Memory Cell Array

A stacked structure of a memory cell array of the semiconductor storage device according to the fifth embodiment will be described below.

Figure 23:
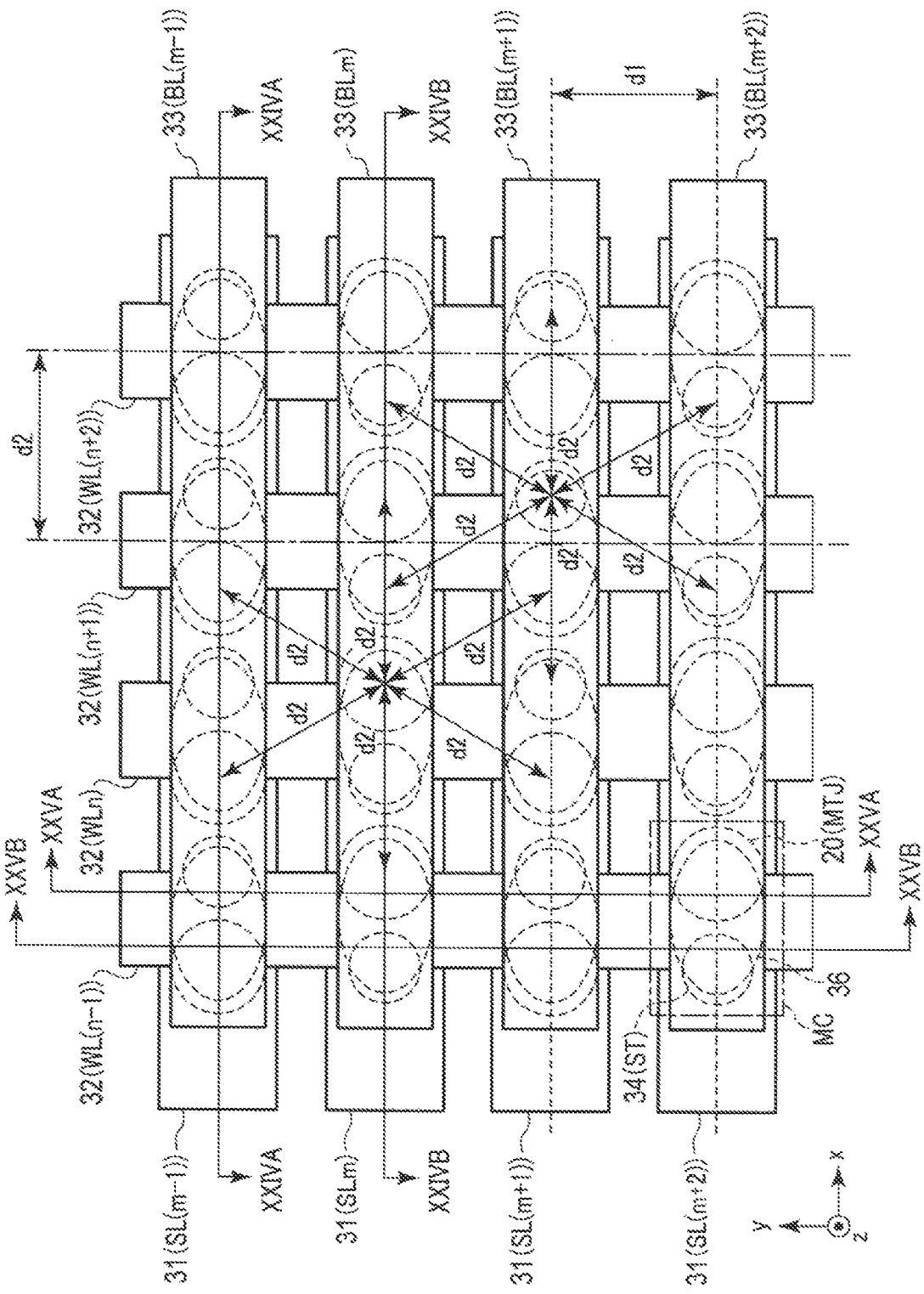
FIG. 23 is a top view for describing a configuration of a memory cell array of a semiconductor storage device according to a fifth embodiment.
Figures 26A, 26B:
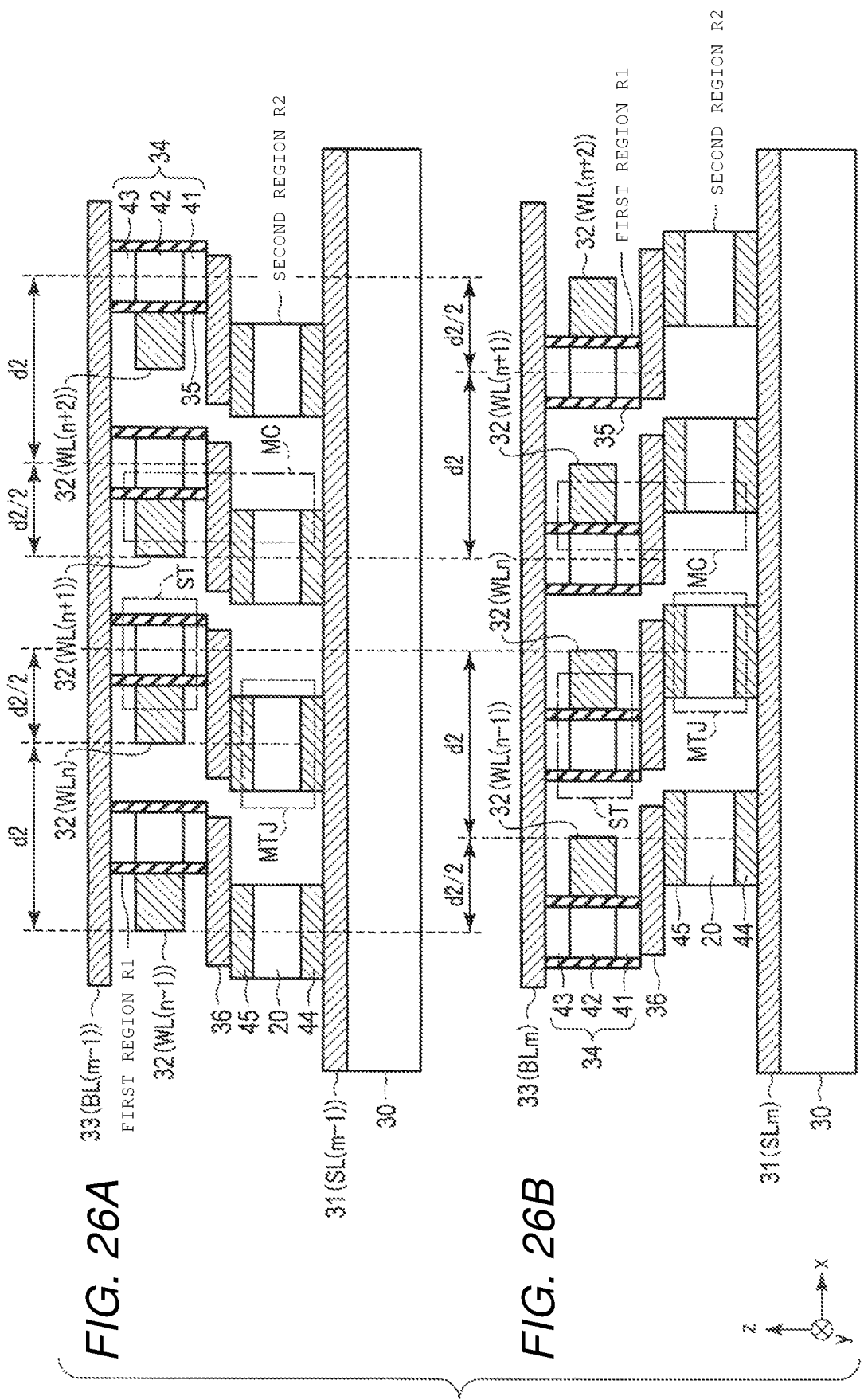
FIGS. 26A and 26B are sectional views for describing a configuration of a memory cell array of a semiconductor storage device according to a modification example of the fifth embodiment.
Figures 27A, 27B:
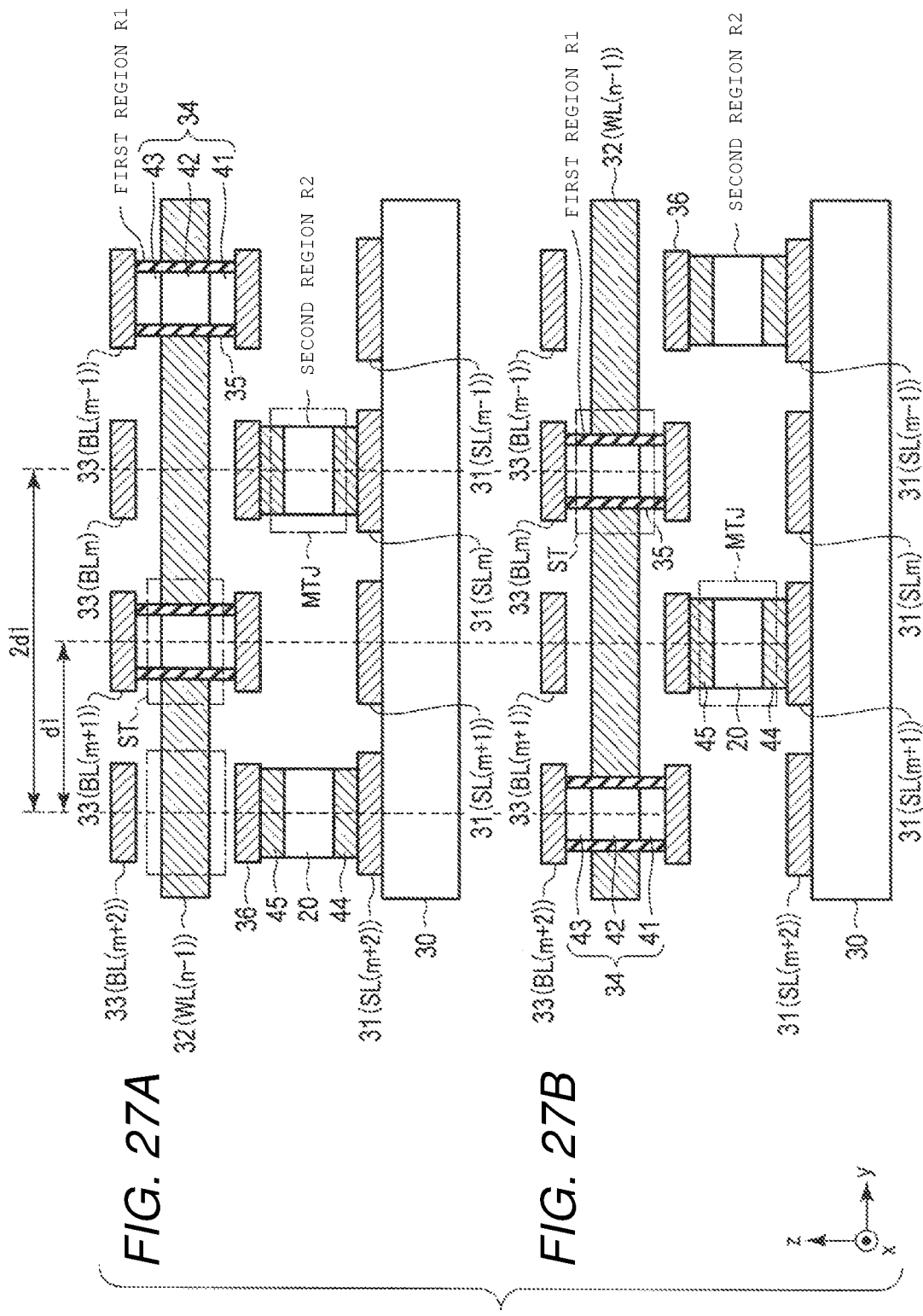
FIGS. 27A and 27B are sectional views for describing the configuration of the memory cell array of the semiconductor storage device according to the modification example of the fifth embodiment.

Initially, a layout of the memory cell array 11 in the xy-plane will be described with reference to FIG. 23. FIG. 23 is a top view of the memory cell array 11 of the semiconductor storage device according to the fifth embodiment when viewed in the +z-axis direction.

As shown in FIG. 23, the arrangement of the wiring layers 31 to 33 and the memory element layers 20 is the same as that of the third embodiment, and thus, the description is omitted.

The selection element layers 34 are arranged in the honeycomb shape in the xy-plane. Specifically, the center of the selection element layer 34 is disposed so as to be offset from the wiring layer 32 in a direction opposite to the direction in which the center of the memory element layer 20 is offset from the wiring layer in the xy-plane.

The selection element layers 34 are formed such that at least some thereof overlap in regions occupied by the wiring layers 32. More specifically, the center of the m-th-row selection element layer 34 is located in a position which is offset from the center of the width of the corresponding wiring layer 32 along the x-axis direction, in the −x-axis direction. The centers of the (m−1)-th-row and (m+1)-th-row selection element layers 34 are located in positions, which are offset from the center of the width of the corresponding wiring layer 32 along the x-axis direction, in the +x-axis direction. The center of the m-th-row selection element layer 34 is located in a position, which is offset from the centers of the (m−1)-th-row and (m+1)-th-row selection element layers 34, along the x-axis direction by the distance d2/2.

The selection element layers are arranged in this manner, and thus, an arbitrary selection element layer 34 is disposed with equal distances from six selection element layers 34 adjacent to the arbitrary selection element layer 34 in the xy-plane. Specifically, for example, six selection element layers 34(m, n−1), 34(m, n+1), 34(m−1, n−1), 34(m−1, n), 34(m+1, n−1), and 34(m+1, n) adjacent to the selection element layer 34(m, n) are arranged in the vertices of the regular hexagon of which one side is the distance d2, and the selection element layer 34(m, n) is disposed in the center of the regular hexagon. As another example, six selection element layers 34(m+1, n−1), 34(m+1, n+1), 34(m, n), 34(m, n+1), 34(m+2, n), and 34(m+2, n+1) adjacent to the selection element layer 34(m+1, n) are arranged in the vertices of the regular hexagon of which one side is the distance d2, and the selection element layer 34(m+1, n) is disposed in the center of the regular hexagon.

In the example of FIG. 23, the memory element layer 20 and the selection element layer 34 do not overlap and are separate from each other in the xy-plane. Thus, an internal connection layer 36 is further formed between the memory element layer 20 and the selection element layer 34 such that the memory element layer 20 and the selection element layer 34 are connected to each other. For example, the internal connection layer 36 has an oval shape so as to overlap both the memory element layer 20 and the selection element layer 34 in the xy-plane.

Hereinafter, configurations of sections of the memory cell array 11 described in FIG. 23 which are taken along the xz-plane and the yz-plane will be described with reference to FIGS. 24A to 25B. FIGS. 24A to 25B are examples of sectional views of a stacked structure of the memory cell array of the semiconductor storage device according to the fifth embodiment, which are taken along the xz-plane and the yz-plane. Specifically, FIGS. 24A to 25B show sections taken along a line XXIVA-XXIVA, a line XXIVB-XXIVB, a line XXVA-XXVA, and a line XXVB-XXVB shown in FIG. 23. In the following description, differences between FIGS. 24A to 25B and FIGS. 14A to 15B will be described.

Initially, the configuration of the section of the memory cell array 11 taken along the xz-plane will be described with reference to FIGS. 24A and 24B.

As shown in FIGS. 24A and 24B, the first region R1 is formed so as to be in contact with a part of the wiring layer 32. Specifically, the first region R1 is in contact with a part of the wiring layer 32 on the +x-axis in the section taken along the line XXIVA-XXIVA, and is in contact with a part of the wiring layer 32 on the −x-axis in the section taken along the XXIVB-XXIVB. A center of a width of the first region R1 along the x-axis direction is different from a center of a width of the second region R2 formed immediately above the first region R1 along the x-axis direction.

That is, in the section taken along the line XXIVA-XXIVA, the second region R2 is formed so as to be offset from the wiring layer 32 in the −x-axis direction, and the first region R1 is formed so as to be offset from the wiring layer 32 in the +x-axis direction. In the section taken along the line XXIVB-XXIVB, the second region R2 is formed so as to be offset from the wiring layer 32 in the +x-axis direction, and the first region R1 is formed so as to be offset from the wiring layer 32 in the −x-axis direction. The first region R1 and the second region R2 in the section taken along the line XXIVA-XXIVA and the first region R1 and the second region R2 in the section taken along the line XXIVB-XXIVB are formed so as to be offset from each other along the x-axis direction by the distance d2/2.

The internal connection layer 36 is formed on an upper end of the diffusion layer 43. The internal connection layer 36 further extends toward the −x-axis direction than the first region R1 in the section taken along the line XXIVA-XXIVA, and further extends toward the +x-axis direction than the first region R1 in the section taken along the line XXIVB-XXIVB. The second region R2 is formed on an upper end of the internal connection layer 36.

Hereinafter, the configuration of the section of the memory cell array 11 taken along the yz-plane will be described with reference to FIGS. 25A and 25B.

As shown in FIGS. 25A and 25B, the first regions R1 are formed along the y-axis direction so as to be separated from one another by the distance 2d1. Specifically, the first regions R1 are formed on the wiring layers 31 functioning as the source lines SL(m+1) and SL(m−1) in the section taken along the line XXVA-XXVA. The first regions R1 are formed above the wiring layers 31 functioning as the source lines SL(m+2) and SLm in the section taken along the line XXVB-XXVB. The first region R1 in the section taken along the line XXVA-XXVA and the first region R1 in the section taken along the line XXVB-XXVB are formed along the y-axis direction so as to be separated from each other by the distance d1.

The internal connection layer 36 is located in an upper end of the diffusion layer 43 and a lower end of the conductive layer 44. For example, a center of the internal connection layer 36 along the y-axis direction matches centers of widths of the first region R1 and the second region R2 along the y-axis direction.

5.2 Advantage According to Present Embodiment

According to the fifth embodiment, when the magnetic tunnel junction element MTJ is offset from the center of the width of the corresponding word line WL along the x-axis direction in the +x-axis direction, the select transistor ST is offset from the center of the width of the corresponding word line WL along the x-axis direction in the −x-axis direction. When the magnetic tunnel junction element MTJ is offset from the center of the width of the corresponding word line WL along the x-axis direction in the −x-axis direction, the select transistor ST is offset from the center of the width of the corresponding word line WL along the x-axis direction in the +x-axis direction. The select transistors ST are disposed in the vertices and the center of the regular hexagon in the xy-plane. Accordingly, the select transistor ST does not overlap the magnetic tunnel junction element MTJ in the xy-plane. Thus, it is possible to form the magnetic tunnel junction element MTJ on a base portion in which the select transistor ST is not present. Accordingly, it is possible to reduce a characteristic fluctuation of the magnetic tunnel junction element MTJ in manufacturing the magnetic tunnel junction element.

The internal connection layer 36 is formed between the select transistor ST and the magnetic tunnel junction element MTJ. The internal connection layer 36 overlaps both the select transistor ST and the magnetic tunnel junction element MTJ in the xy-plane. Accordingly, it is possible to connect the select transistor ST and the magnetic tunnel junction element MTJ.

In addition, according to the fifth embodiment, it is possible to similarly acquire other advantages mentioned in the third embodiment.

5.3 Modification Example of Fifth Embodiment

Although the semiconductor storage device according to the fifth embodiment in which the magnetic tunnel junction element MTJ is formed above the select transistor ST is described, the present embodiment is not limited thereto. For example, the magnetic tunnel junction element MTJ may be formed under the select transistor ST.

FIGS. 26A to 27B are examples of sectional views of a stacked structure of a memory cell array of a semiconductor storage device according to a modification example of the fifth embodiment, which are taken along the xz-plane and the yz-plane. Specifically, FIGS. 26A to 27B show sections taken along the line XXIVA-XXIVA, the line XXIVB-XXIVB, the line XXVA-XXVA, and the line XXVB-XXVB shown in FIG. 23, and correspond to FIGS. 24A to 25B.

As shown in FIGS. 26A to 27B, the magnetic tunnel junction element MTJ is formed on the wiring layer 31, the select transistor ST is formed on the magnetic tunnel junction element MTJ, and the wiring layer 33 is formed on the select transistor ST.

The magnetic tunnel junction element MTJ and the select transistor ST shown in FIGS. 26A to 27B are merely substituted for the magnetic tunnel junction element MTJ and the select transistor ST shown in FIGS. 24A to 25B in the z-axis direction, and the positional relation therebetween in the xy-plane is not changed.

With such a configuration, even when the select transistor ST is formed on the magnetic tunnel junction element MTJ, it is possible to acquire the same advantage as that of the fifth embodiment.

6. Sixth Embodiment

Hereinafter, a semiconductor storage device according to a sixth embodiment will be described. In the fourth embodiment, the select transistors are offset from the bit line and the source line in the same direction with the magnetic tunnel junction elements, and thus, the select transistors are arranged in the honeycomb shape. In contrast, the sixth embodiment is different from the fourth embodiment in that the select transistors are offset from the bit line and the source line in a direction opposite to a direction the magnetic tunnel junction elements are offset, and thus, the select transistors are arranged in the honeycomb shape. That is, in the sixth embodiment, when the center of the magnetic tunnel junction element is offset from the bit line and the source line in the +y-axis direction, the center of the select transistor is offset from the bit line and the source line in the −y-axis direction. When the center of the magnetic tunnel junction element is offset from the bit line and the source line in the −y-axis direction, the center of the select transistor is offset from the bit line and the source line in the +y-axis direction. Hereinafter, differences from the fourth embodiment will be described.

6.1 Stacked Structure of Memory Cell Array

A stacked structure of a memory cell array of the semiconductor storage device according to the sixth embodiment will be described below.

Figure 28:
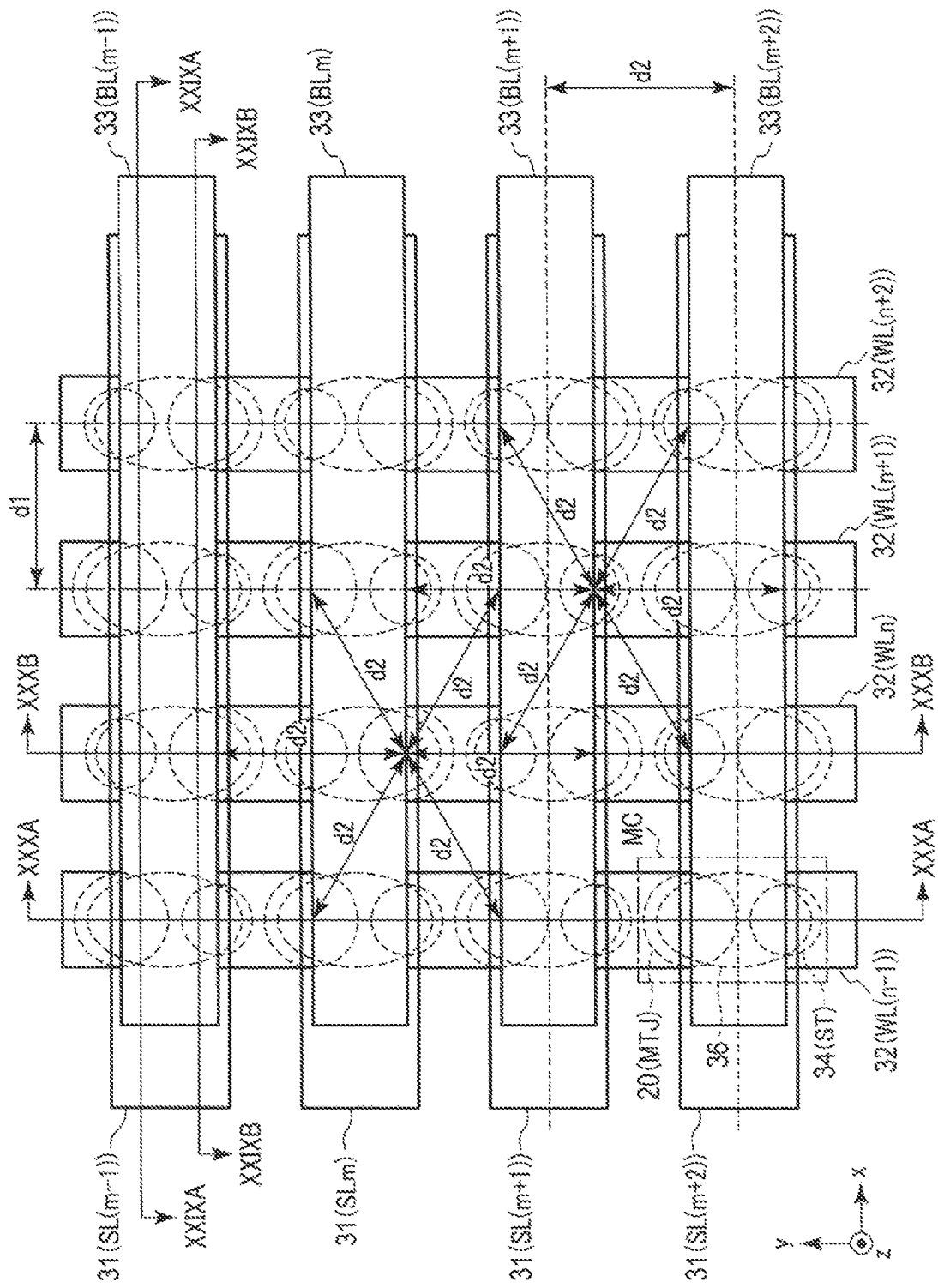
FIG. 28 is a top view for describing a configuration of a memory cell array of a semiconductor storage device according to a sixth embodiment.

Initially, a layout of the memory cell array 11 in the xy-plane will be described with reference to FIG. 28. FIG. 28 is a top view of the memory cell array 11 of the semiconductor storage device according to the sixth embodiment when viewed in the +z-axis direction.

As shown in FIG. 28, the arrangement of the wiring layers 31 to 33 and the memory element layers 20 is the same as that of the fourth embodiment, and thus, the description is omitted.

The selection element layers 34 are arranged in the honeycomb shape in the xy-plane. Specifically, the center of the selection element layer 34 is disposed so as to be offset from the wiring layers 31 and 33 in a direction opposite to the direction in which the center of the memory element layer 20 is offset from the wiring layers in the xy-plane.

In FIG. 28, the selection element layers 34 are formed such that at least some thereof overlap in regions occupied by the wiring layers 31 and 33. More specifically, the center of the n-th-column selection element layer 34 is located in a position, which is offset from the centers of the widths of the corresponding wiring layers 31 and 33 along the y-axis direction, in the +y-axis direction. The centers of the (n−1)-th-column and (n+1)-th-column selection element layers 34 are located in positions, which are offset from the centers of the widths of the corresponding wiring layers 31 and 33 along the y-axis direction, in the −y-axis direction. The center of the n-th-column selection element layer 34 is located in a position offset from the centers of the (n−1)-th-column and (n+1)-th-column selection element layers 34, along the y-axis direction by the distance d2/2.

The selection element layers are arranged in this manner, and thus, an arbitrary selection element layer 34 is disposed with equal distances from six selection element layers 34 adjacent to the arbitrary selection element layer 34 in the xy-plane. Specifically, for example, six selection element layers 34(*m*−1, *n*), 34(*m*+1, *n*), 34(*m*−1, *n*−1), 34(*m*, *n*−1), 34(*m*−1, *n*+1), and 34(*m*, *n*+1) adjacent to the selection element layer 34(*m*, *n*) are arranged in the vertices of the regular hexagon of which one side is the distance d2, and the selection element layer 34(*m*, *n*) is disposed in the center of the regular hexagon. As another example, six selection element layers 34(*m*−1, *n*+1), 34(*m*+1, *n*+1), 34(*m*, *n*), 34(*m*+1, *n*), 34(*m*, *n*+2), and 34(*m*+1, *n*+2) adjacent to the selection element layer 34(*m*, *n*+1) are arranged in the vertices of the regular hexagon of which one side is the distance d2, and the selection element layer 34(*m*, *n*+1) is disposed in the center of the regular hexagon.

In the example of FIG. 28, the memory element layer 20 and the selection element layer 34 do not overlap and are separate from each other in the xy-plane. Thus, an internal connection layer 36 is further formed between the memory element layer 20 and the selection element layer 34 such that the memory element layer 20 and the selection element layer 34 are connected to each other. For example, the internal connection layer 36 has an oval shape so as to overlap both the memory element layer 20 and the selection element layer 34 in the xy-plane.

Hereinafter, configurations of sections of the memory cell array 11 described in FIG. 28 which are taken along the xz-plane and the yz-plane will be described with reference to FIGS. 29A to 30B. FIGS. 29A to 30B are examples of sectional views of a stacked structure of the memory cell array of the semiconductor storage device according to the sixth embodiment, which are taken along the xz-plane and the yz-plane. Specifically, FIGS. 29A to 30B show sections taken along a line XXIXA-XXIXA, a line XXIXB-XXIXB, a line XXXA-XXXA, and a line XXXB-XXXB shown in FIG. 28. In the following description, differences between FIGS. 29A to 30B and FIGS. 19A to 20B will be described.

Initially, the configuration of the section of the memory cell array 11 taken along the xz-plane will be described with reference to FIGS. 29A and 29B.

As shown in FIGS. 29A and 29B, the first regions R1 are formed so as to be separated from one another along the x-axis direction by the distance 2d1. Specifically, the first regions R1 are formed so as to be in contact with the wiring layers 32 functioning as the word lines WLn and WL(n+2) and reach the wiring layers 31 in the section taken along the line XXIXA-XXIXA. The first regions R1 are formed so as to be in contract with the wiring layers 32 functioning as the word lines WL(n−1) and WL(n+1) and reach the wiring layers 31 in the section taken along the line XXIXB-XXIXB. The first region R1 in the section taken along the line XXIXA-XXIXA and the first region R1 in the section taken along the line XXIXB-XXIXB are formed along the x-axis direction so as to be separated from each other by the distance d1.

The internal connection layer 36 is located in an upper end of the diffusion layer 43 and on the lower end of the conductive layer 44. The center of the internal connection layer 36 along the x-axis direction matches the centers of the widths of the first region R1 and the second region R2 along the x-axis direction.

Hereinafter, the configuration of the section of the memory cell array 11 taken along the yz-plane will be described with reference to FIGS. 30A and 30B.

Figures 30A, 30B:
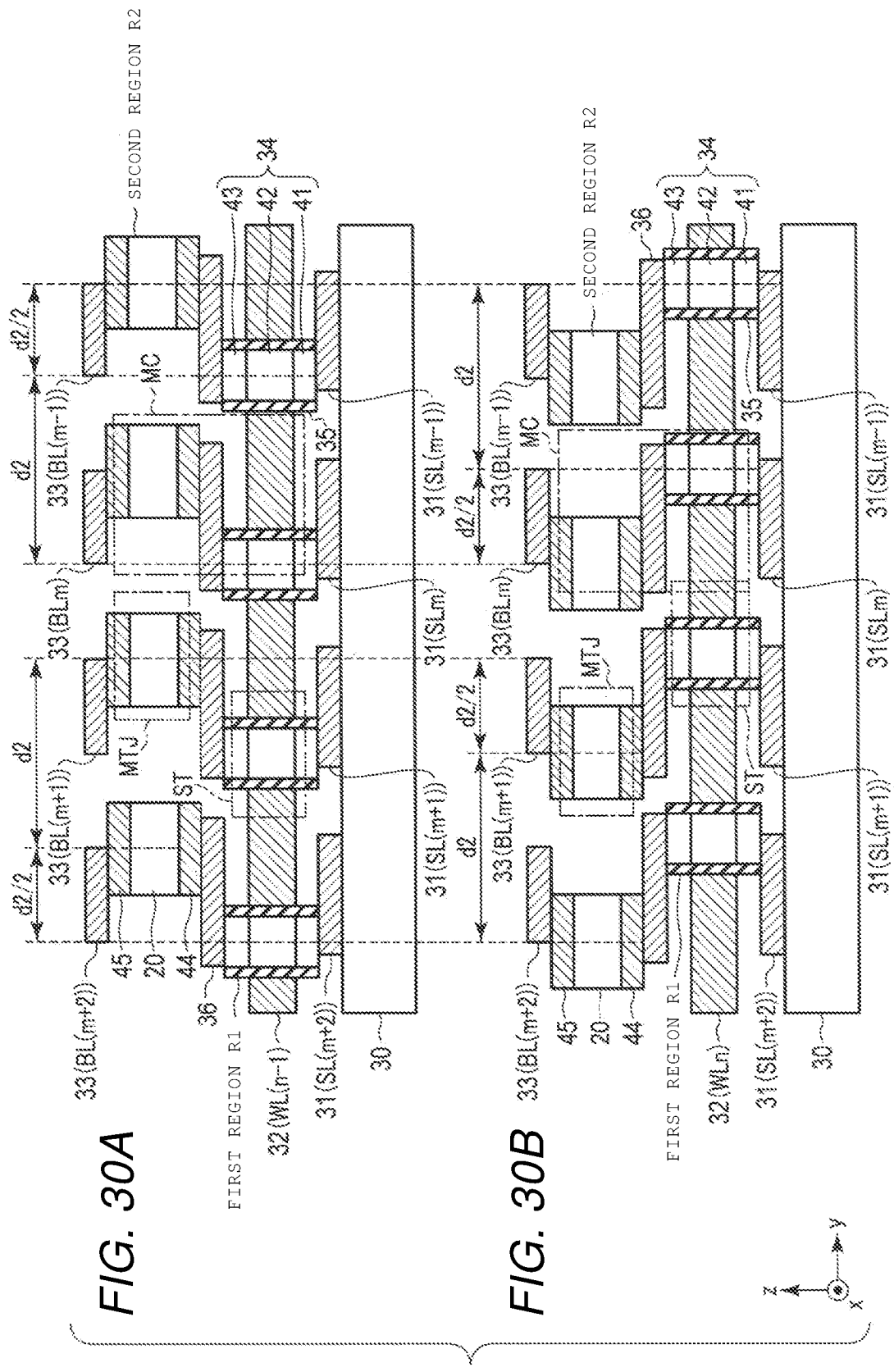
FIGS. 30A and 30B are sectional views for describing the configuration of the memory cell array of the semiconductor storage device according to the sixth embodiment.

As shown in FIGS. 30A and 30B, the first region R1 is formed so as to reach a part of an upper end of the wiring layer 31. Specifically, the first region R1 is formed so as to be offset from the center of the width of the wiring layer 31 along the y-axis direction in the −y-axis direction in the section taken along the line XXXA-XXXA, and is formed so as to be offset from the center of the width of the wiring layer 31 along the y-axis direction in the +y-axis direction in the section taken along the line XXXB-XXXB. A center of a width of the first region R1 along the x-axis direction is different from a center of a width of the second region R2 formed immediately above the first region R1 along the x-axis direction.

That is, the first region R1 in the section taken along the line XXXA-XXXA and the first region R1 in the section taken along the line XXXB-XXXB are formed along the y-axis direction so as to be separated from each other by the distance d2/2.

The internal connection layer 36 is formed on an upper end of the diffusion layer 43. The internal connection layer 36 further extends toward the +y-axis direction than the first region R1 in the section taken along the line XXXA-XXXA, and further extends toward the −y-axis direction than the first region R1 in the section taken along the line XXXB-XXXB. The second region R2 is formed on an upper end of the internal connection layer 36.

6.2 Advantage According to Present Embodiment

According to the sixth embodiment, when the magnetic tunnel junction element MTJ is offset from the centers of the widths of the corresponding bit line BL and source line SL along the y-axis direction in the +y-axis direction, the select transistor ST is offset from the centers of the widths of the corresponding bit line BL and source line SL along the y-axis direction in the −y-axis direction. When the magnetic tunnel junction element MTJ is offset from the centers of the widths of the corresponding bit line BL and source line SL along the y-axis direction in the −y-axis direction, the select transistor ST is offset from the centers of the widths of the corresponding bit line BL and source line SL along the y-axis direction in the +y-axis direction. The select transistors ST are disposed in the vertices and the center of the regular hexagon in the xy-plane. Accordingly, the select transistor ST does not overlap the magnetic tunnel junction element MTJ in the xy-plane. Thus, it is possible to form the magnetic tunnel junction element MTJ on a base portion in which the select transistor ST is not present. Accordingly, it is possible to reduce a characteristic fluctuation of the magnetic tunnel junction element MTJ in manufacturing the magnetic tunnel junction element.

The internal connection layer 36 is formed between the select transistor ST and the magnetic tunnel junction element MTJ. The internal connection layer 36 overlaps both the select transistor ST and the magnetic tunnel junction element MTJ in the xy-plane. Accordingly, it is possible to connect the select transistor ST and the magnetic tunnel junction element MTJ.

In addition, according to the sixth embodiment, it is possible to similarly acquire other advantages mentioned in the fourth embodiment.

6.3 Modification Example of Sixth Embodiment

Although the semiconductor storage device according to the sixth embodiment in which the magnetic tunnel junction element MTJ is formed above the select transistor ST is described, the present embodiment is not limited thereto. For example, the magnetic tunnel junction element MTJ may be formed under the select transistor ST.

FIGS. 31A to 32B are examples of sectional views of a stacked structure of a memory cell array of a semiconductor storage device according to a modification example of the sixth embodiment, which are taken along the xz-plane and the yz-plane. Specifically, FIGS. 31A to 32B show sections taken along the line XXIXA-XXIXA, the line XXIXB-XXIXB, the line XXXA-XXXA, and the line XXXB-XXXB shown in FIG. 28, and correspond to FIGS. 29A to 30B.

As shown in FIGS. 31A to 32B, the magnetic tunnel junction element MTJ is formed on the wiring layer 31, and the internal connection layer 36 is formed on the magnetic tunnel junction element MTJ. The select transistor ST is formed on the internal connection layer 36, and the wiring layer 33 is formed on the select transistor ST.

The magnetic tunnel junction element MTJ and the select transistor ST shown in FIGS. 31A to 32B are merely substituted for the magnetic tunnel junction element MTJ and the select transistor ST shown in FIGS. 29A to 30B in the z-axis direction, and the positional relation therebetween in the xy-plane is not changed.

With such a configuration, even when the select transistor ST is formed on the magnetic tunnel junction element MTJ, it is possible to acquire the same advantage as that of the sixth embodiment.

7. Seventh Embodiment

Hereinafter, a semiconductor storage device according to a seventh embodiment will be described. Although the example in which the transistor is used as the element for selecting the memory element is described in the first embodiment to the sixth embodiment, a case where a non-linear element having a rectifying action such as a diode is used will be described in the seventh embodiment.

That is, the semiconductor device according to the seventh embodiment may be applied to not the semiconductor storage device including the variable resistance element having a necessity for a current to flow in both directions but the semiconductor storage device including variable resistance element without having a necessity for a large current to flow in both direction. For example, a resistive random-access memory (ReRAM) or a phase-change random-access memory (PCRAM) are known as the semiconductor storage device including the above-described variable resistance element.

Hereinafter, differences from the first embodiment will be described.

7.1 Configuration

Initially, a configuration of the semiconductor storage device according to the seventh embodiment will be described.

7.1.1. Configuration of Semiconductor Storage Device

Figure 33:
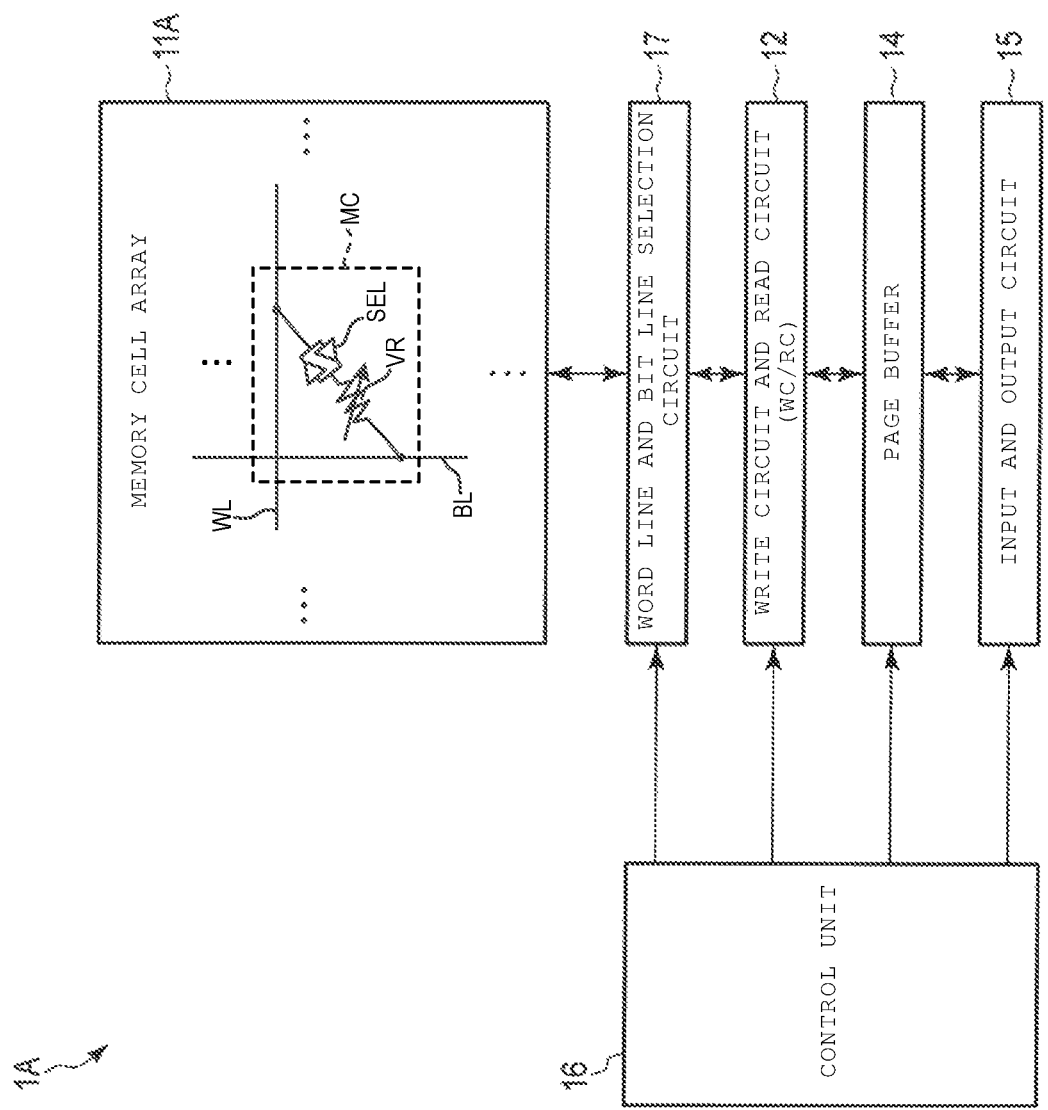
FIG. 33 is a block diagram showing a configuration of a semiconductor storage device according to a seventh embodiment.

FIG. 33 is a block diagram showing a configuration of a semiconductor storage device 1A according to the seventh embodiment. FIG. 33 corresponds to FIG. 1. As shown in FIG. 33, the semiconductor storage device 1A includes a memory cell array 11A. The semiconductor storage device 1A includes a word line and bit line selection circuit 17 instead of the row decoder.

The memory cell array 11A includes a plurality of memory cells MC associated with rows and columns. The memory cells MC present in the same row are connected to the same word line WL, and both ends of the memory cells MC present in the same column are connected to the same bit line BL.

The memory cell MC includes a selector SEL and a variable resistance element VR. For example, the selector SEL includes a first end connected to the word line WL and a second end connected to a first end of the variable resistance element VR. For example, the selector SEL has a rectifying function, and is formed as a bi-directional switching element that controls the supply of a current to the variable resistance element VR. For example, the variable resistance element VR includes a second end connected to the bit line BL. In the following description, a case where the selector SEL and the variable resistance element VR are connected between the bit line BL and the word line WL in the order shown in FIG. 33 will be described, but the present embodiment is not limited thereto. For example, the first end of the selector SEL may be connected to the bit line BL, and the second end of the variable resistance element VR may be connected to the word line WL.

For example, the word line and bit line selection circuit 17 is connected between the WC/RC 12 and the memory cell array 11A, and is connected to the bit line BL and the word line WL. Since the word line and bit line selection circuit 17 supplies a current to the memory cell MC which is an operation target through the bit line BL and the word line WL, the word line and bit line selection circuit selects the bit line BL and the word line WL connected to the memory cell MC which is the operation target.

7.1.2. Stacked Structure of Memory Cell Array

Hereinafter, a stacked structure of a memory cell array of the semiconductor storage device according to the seventh embodiment will be described.

Figure 34:
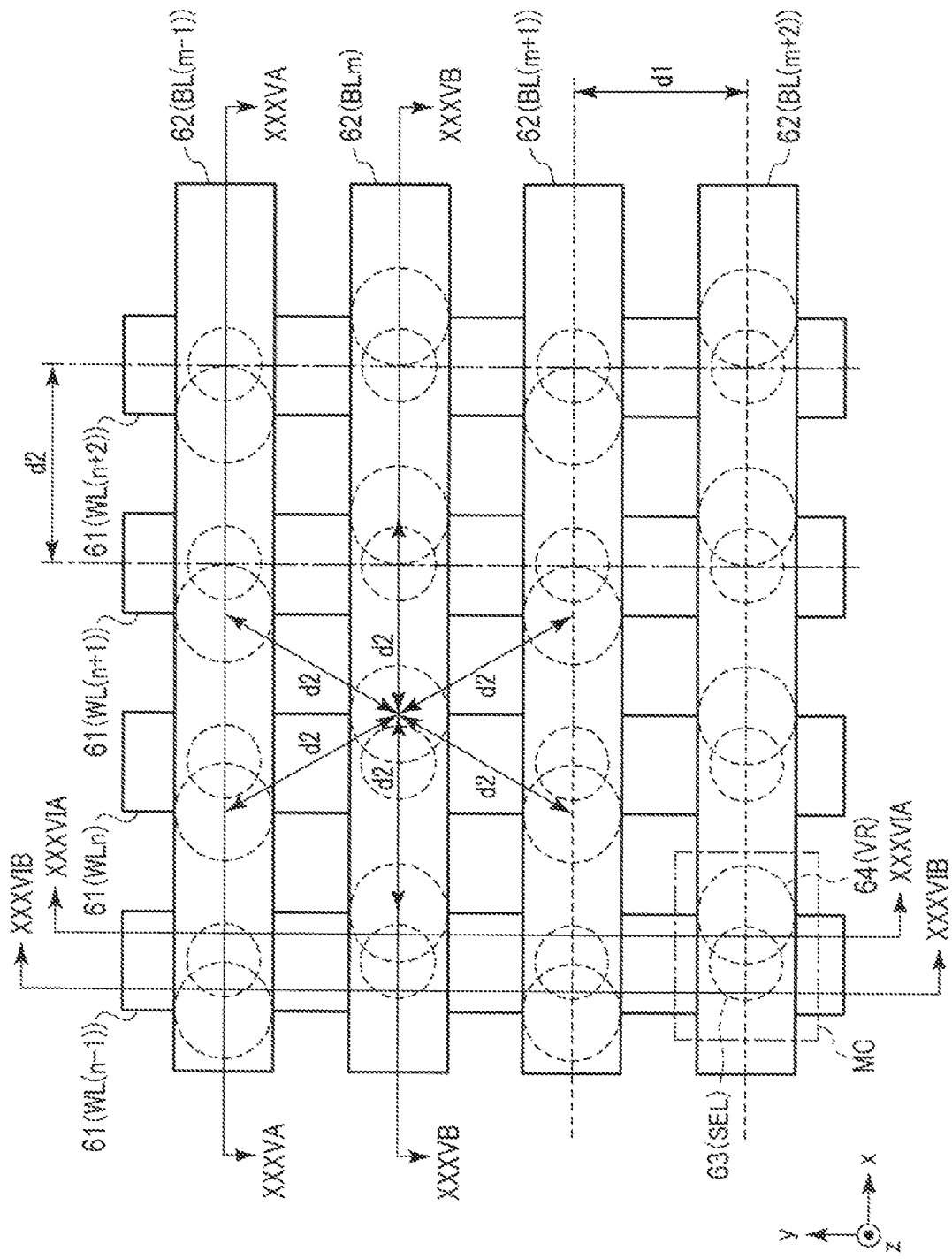
FIG. 34 is a top view for describing a configuration of a memory cell array of a semiconductor storage device according to a seventh embodiment.
Figure 35:
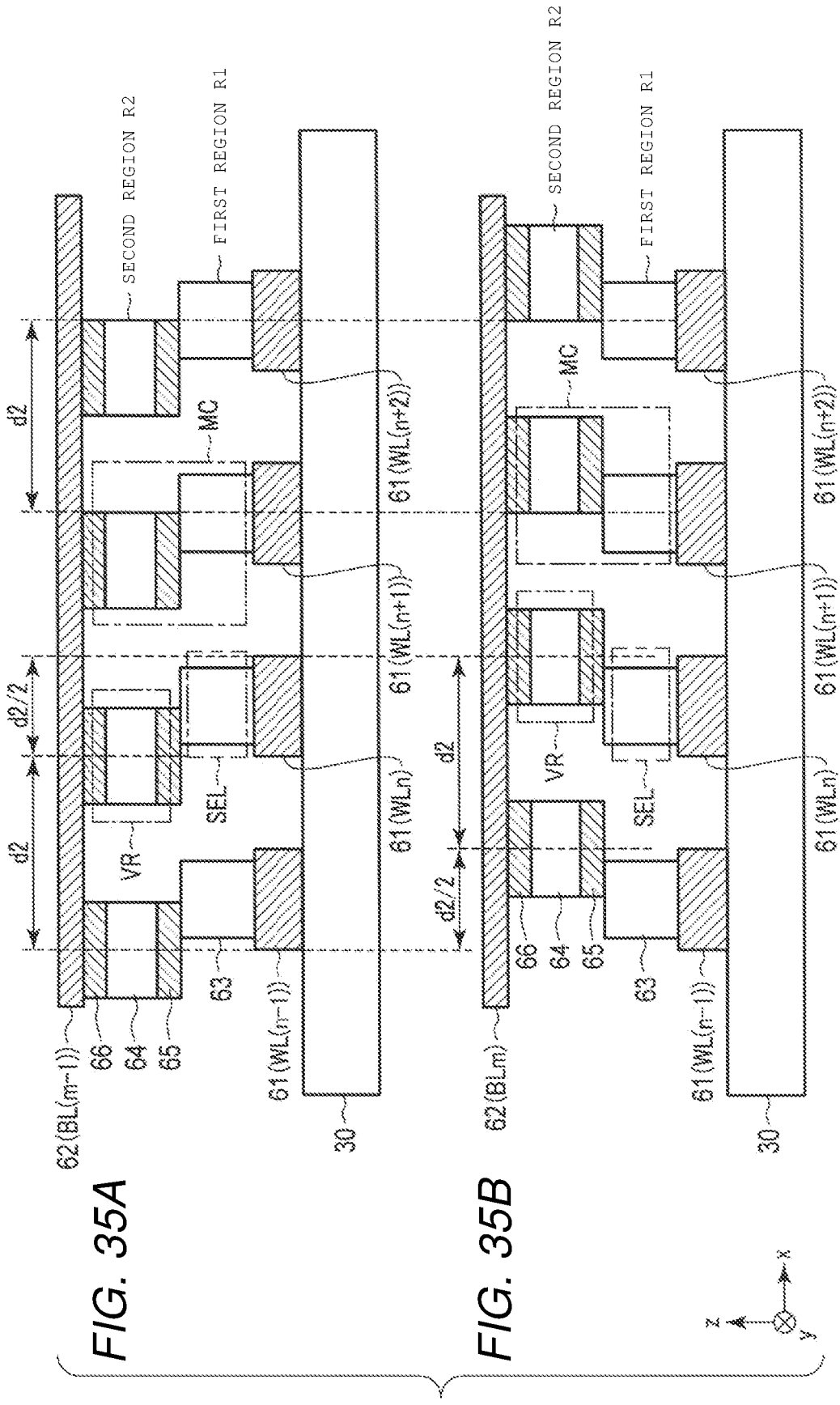
FIGS. 35A and 35B are sectional views for describing the configuration of the memory cell array of the semiconductor storage device according to the seventh embodiment.
Figure 36:
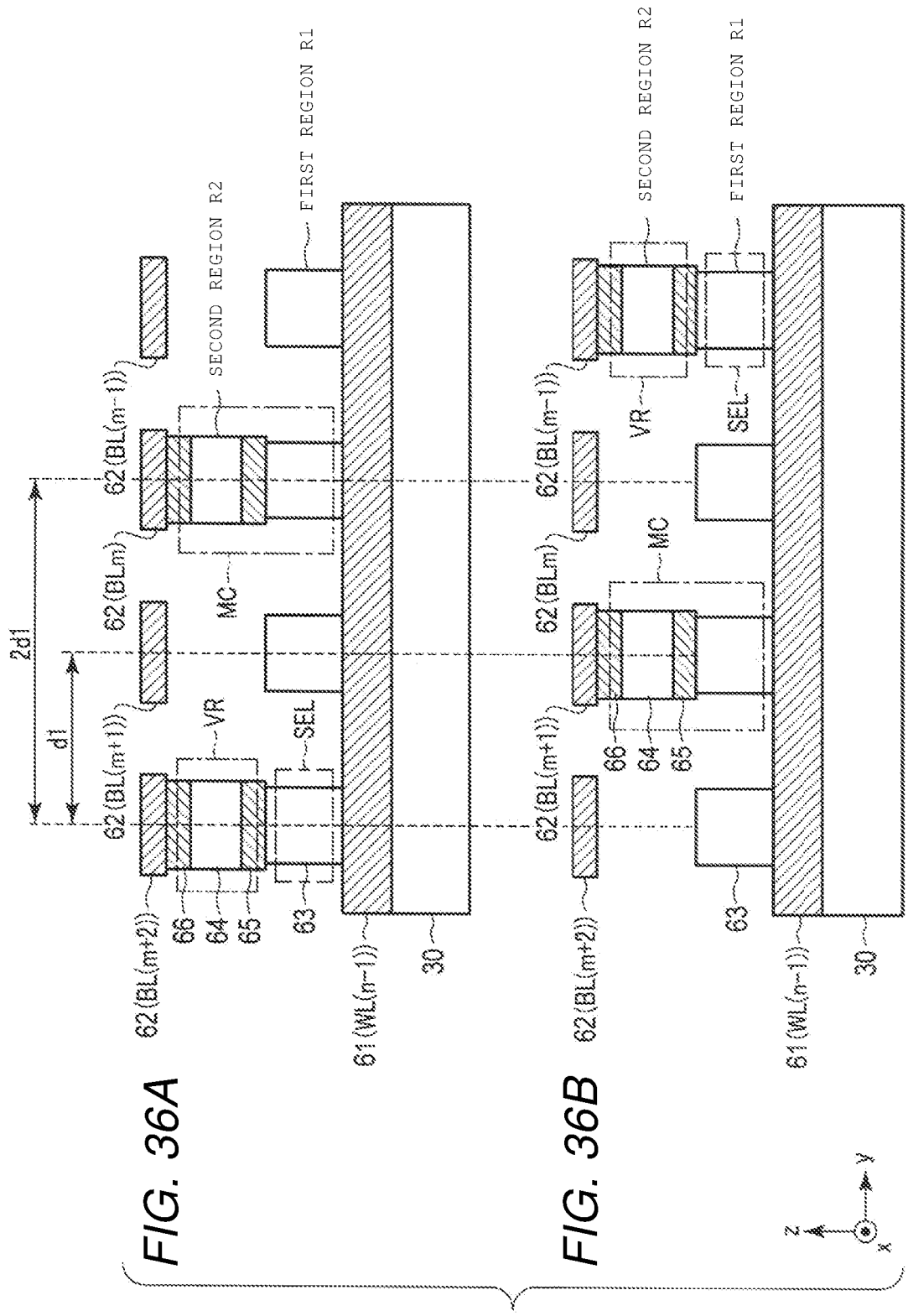
FIGS. 36A and 36B are sectional views for describing the configuration of the memory cell array of the semiconductor storage device according to the seventh embodiment.

Initially, a layout of the memory cell array 11A in the xy-plane will be described with reference to FIG. 34. FIG. 34 is a top view of the memory cell array 11A of the semiconductor storage device according to the seventh embodiment when viewed in the +z-axis direction.

As shown in FIG. 34, a plurality of wiring layers 61 each functioning as the word line WL extend, for example, along the y-axis direction, and are arranged along the x-axis direction at equal intervals. In the example of FIG. 34, four wiring layers 61 corresponding to an (n−1)-th-column word line WL(n−1), an n-th-column word line WLn, an (n+1)-th-column word line WL(n+1), and an (n+2)-th-column word line WL(n+2) are illustrated. Two wiring layers 61 adjacent to each other are separated from each other along the x-axis direction by a distance d2.

A plurality of wiring layers 62 each functioning as the bit line BL is formed above the wiring layers 61. For example, the wiring layers 62 extend along the x-axis direction, and are arranged along the y-axis direction at equal intervals. In the example of FIG. 34, four wiring layers 62 corresponding to a (m−1)-th-row bit line BL(m−1), an m-th-row bit line BLm, an (m+1)-th-row bit line BL(m+1), and an (m+2)-th-row bit line BL(m+2) are illustrated. Specifically, two wiring layers 62 adjacent to each other are separated from each other along the y-axis direction by the distance d1.

In FIG. 34, a selection element layer 63 functioning as the selector SEL is formed in a region in which the wiring layer 61 and the wiring layer 62 intersect with each other. For example, the selection element layer 63 has a cylindrical shape that extends along the z-axis direction, and is formed between the wiring layer 61 and the wiring layer 62. In the example of FIG. 34, the center of the selection element layer 63 is located at an intersection of a central line of the wiring layer 61 along the y-axis direction and a central line of the wiring layer 62 along the x-axis direction. That is, the selection element layers 63 are arranged in a rectangular grid in the xy-plane. Specifically, the selection element layers 63 are arranged along the x-axis direction at equal intervals for every distance d2, and are arranged along the y-axis direction at equal intervals for every distance d1. The selection element layers are arranged in this manner, and thus, the selection element layers 63 are formed one by one for the combination of the wiring layer 62 in a certain row and the wiring layer 61 in a certain column.

In FIG. 34, the memory element layers 64 functioning as the variable resistance elements VR are formed such that at least some thereof overlap in regions occupied by the selection element layers 63. For example, the memory element layer 64 has a cylindrical shape that extends along the z-axis direction, and is formed between the wiring layer 61 and the wiring layer 62.

The memory element layers 64 are arranged in the honeycomb shape in the xy-plane. Specifically, the memory element layers 64 are arranged in a position of vertices and a center of a regular hexagon of which a length of one side is the distance d2 in the xy-plane. More specifically, the memory element layers 64 are arranged along the x-axis direction at equal intervals for every distance d2, and are arranged along the y-axis direction at equal intervals for every distance 2d1. That is, an (m−1)-th-row memory element layer 64 and an (m+1)-th-row memory element layer 64 are aligned in the y-axis direction. An m-th-row memory element layer 64 and an (m+2)-th-row memory element layer 64 are aligned in the y-axis direction. However, the m-th-row memory element layer 64 and the (m−1)-th-row memory element layer 64, and the m-th-row memory element layer 64 and the (m+1)-th-row memory element layer 64 are not aligned in the y-axis direction.

In the example of FIG. 34, the center of the m-th-row memory element layer 64 is located in a position, which is offset from the center of the width of the corresponding wiring layer 61 along the x-axis direction, in the +x-axis direction. The centers of the (m−1)-th-row and (m+1)-th-row memory element layers 64 are located in positions, which are offset from the center of the width of the corresponding wiring layer 61 along the x-axis direction, in the −x-axis direction. The center of the m-th-row memory element layer 64 is located in a position offset from the centers of the (m−1)-th-row and (m+1)-th-row memory element layers 64 along the x-axis direction by a distance d2/2.

The memory element layers are arranged in this manner, and thus, the memory element layers 64 are formed so as to correspond to the selection element layers 63, and are formed one by one for the combination of the wiring layer 62 in a certain row and the wiring layer 61 in a certain column. An arbitrary memory element layer 64 is disposed with equal distances from six memory element layers 64 adjacent to the arbitrary memory element layer 64 in the xy-plane. Specifically, for example, six memory element layers 64(*m*, *n*−1), 64(*m*, *n*+1), 64(*m*−1, *n*), 64(*m*−1, *n*+1), 64(*m*+1, *n*), and 64(*m*+1, *n*+1) adjacent to the memory element layer 64(*m*, *n*) are arranged in the vertices of the regular hexagon of which one side is the distance d2, and the memory element layer 64(*m*, *n*) is disposed in the center of the regular hexagon. As another example, six memory element layer 64(*m*+1, *n*−1), 64(*m*+1, *n*+1), 64(*m*, *n*−1), 64(*m*, *n*), 64(*m*+2, *n*−1), and 64(*m*+2, *n*) adjacent to the memory element layer 64(*m*+1, *n*) are arranged in the vertices of the regular hexagon of which one side is the distance d2, and the memory element layer 64(*m*+1, *n*) is disposed in the center of the regular hexagon.

Hereinafter, configurations of sections of the memory cell array 11A described in FIG. 34 which are taken along the xz-plane and the yz-plane will be described with reference to FIGS. 35A to 36B. FIGS. 35A to 36B are examples of sectional views of a stacked structure of the memory cell array of the semiconductor storage device according to the seventh embodiment, which are taken along the xz-plane and the yz-plane. Specifically, FIGS. 35A to 36B show sections taken along a line XXXVA-XXXVA, a line XXXVB-XXXVB, a line XXXVIA-XXXVIA, and a line XXXVIB-XXXVIB shown in FIG. 34. In FIGS. 35A to 36B, some insulating layers are omitted for simplicity of illustration.

Initially, the configuration of the section of the memory cell array 11A taken along the xz-plane will be described with reference to FIGS. 35A and 35B.

As shown in FIGS. 35A and 35B, the plurality of wiring layers 61 functioning as the word lines WL(n−1), WLn, WL(n+1), and WL(n+2) is formed on the semiconductor substrate 30 at equal intervals for every distance d2 in the section taken along the line XXXVA-XXXVA. An insulating film (not shown) is formed on top surfaces of the wiring layers 61.

First regions R1 are respectively formed in a plurality of regions in which the selectors SEL are formed. The first regions R1 are formed along the x-axis direction so as to be separated from one another by the distance d2. For example, the selection element layer 63 functioning as the selector SEL is formed within the first region R1. An insulating film (not shown) is formed in a layer on an upper end of the selection element layer 63.

Second regions R2 are respectively formed in a plurality of regions in which the variable resistance elements VR are formed. The second regions R2 are formed along the x-axis direction so as to be separated from one another by the distance d2. Each second region R2 reaches a part of the upper end of the selection element layer 63. A conductive layer 65, the memory element layer 64, and a conductive layer 65 are sequentially stacked within the second region R2. The memory element layer 64 functions as the variable resistance element VR. The conductive layers 65 and 66 function as a lower electrode and an upper electrode of the variable resistance element VR, respectively. Accordingly, a one-side end of the variable resistance element VR and the other-side end of the selector SEL are connected to each other.

In a layer on an upper end of the conductive layer 66, the wiring layer 62 functioning as the bit line BL(m−1) is formed in the section taken along the line XXXVA-XXXVA, and the wiring layer 62 functioning as the bit line BLm is formed in the section taken along the line XXXVB-XXXVB. The wiring layer 62 is commonly connected to the other-side ends of the variable resistance elements VR of the plurality of memory cells MC arranged along the x-axis direction.

The second region R2 is formed so as to be offset from the first region R1 in the x-axis direction while maintaining a state in which the conductive layer 65 is electrically connected to the selection element layer 63. Specifically, the second region R2 is formed so as to be offset from the first region R1 in the −x-axis direction in the section taken along the line XXXVA-XXXVA, and is formed as to be offset from the first region R1 in the +x-axis direction in the section taken along the line XXXVB-XXXVB. The second region R2 in the section taken along the line XXXVA-XXXVA and the second region R2 in the section taken along the line XXXVB-XXXVB are formed along the x-axis direction so as to be offset from each other along the x-axis direction by the distance d2/2.

Hereinafter, the configuration of the section of the memory cell array 11A taken along the yz-plane will be described with reference to FIGS. 36A and 36B.

As shown in FIGS. 36A and 36B, the wiring layer 61 functioning as the word line WL(n−1) is formed on the semiconductor substrate 30. The plurality of wiring layers 62 functioning as the bit lines BL(m+2), BL(m+1), BLm, and BL(m−1) is formed above the wiring layers 61 at equal intervals for every distance d1.

The first regions R1 are formed along the y-axis direction so as to be separated from one another by the distance d1. The selector SEL having the same configuration as that of the selector SEL described in FIGS. 35A and 35B is formed in the first region R1. The plurality of selectors SEL formed along the y-axis direction is commonly connected to the same wiring layer 61.

The second regions R2 are formed along the y-axis direction so as to be separated from one another by the distance 2d1. Specifically, the second regions R2 are formed under the wiring layers 62 functioning as the bit lines BL(m+2) and BLm in the section taken along the line XXXVIA-XXXVIA. The second regions R2 are formed under the wiring layers 62 functioning as the bit lines BL(m+1) and BL(m−1) in the section taken along the line XXXVIB-XXXVIB. The second regions R2 in the section taken along the line XXXVIA-XXXVIA and the second regions R2 in the section taken along the line XXXVIB-XXXVIB are formed along the y-axis direction so as to be separated from each other by the distance d1. The variable resistance element VR having the same configuration as that of the variable resistance element VR described in FIGS. 35A and 35B is formed in the second region R2.

The wiring layer 62 is formed in the layer on the upper end of the conductive layer 66. The wiring layers 62 functioning as the bit lines BL(m+2) and BLm are connected to the conductive layer 66 in the section taken along the line XXXVIA-XXXVIA, and the wiring layers 62 functioning as the bit lines BL(m+1) and BL(m−1) are connected to the conductive layers 62 in the section taken along the line XXXVIB-XXXVIB. A center of a width of the wiring layer 62 along the y-axis direction matches centers of widths of the second region R2 and the first region R1 formed immediately under the wiring layer 62 along the y-axis direction.

7.2 Advantage According to Present Embodiment

According to the seventh embodiment, the variable resistance elements VR are disposed in the vertices and the center of the regular hexagon in the xy-plane. Specifically, the variable resistance elements VR which correspond to the same bit line BL and are adjacent to each other are separated along the x-axis direction by the distance d2. The variable resistance elements VR which correspond to the same word line WL and are adjacent to each other are separated from each other along the y-axis direction by the distance d1. The variable resistance element VR which corresponds to the m-th-row bit line BL and the n-th-column word line WL and the variable resistance element VR which corresponds to the (m+1)-th-row bit line BL and the n-th-column word line WL are separated along the x-axis direction by the distance d2/2. Accordingly, it is possible to set the distances between all the variable resistance elements VR adjacent to each other to be equal. Thus, a manufacturing fluctuation in a manufacturing stage can be reduced in the embodiment compared to the arrangement in which the distances between all the variable resistance elements adjacent to each other are not equal, such as in the case of the memory cells arranged in the rectangular grid.

In addition, according to the seventh embodiment, it is possible to similarly acquire other advantages mentioned in the first embodiment.

8. Eighth Embodiment

Hereinafter, a semiconductor storage device according to an eighth embodiment will be described. The variable resistance element is offset from the selector along the x-axis direction in the seventh embodiment, whereas the variable resistance element is offset from the selector along the y-axis direction. Hereinafter, differences from the seventh embodiment will be described.

8.1 Stacked Structure of Memory Cell Array

A stacked structure of a memory cell array of the semiconductor storage device according to the eighth embodiment will be described below.

Figure 37:
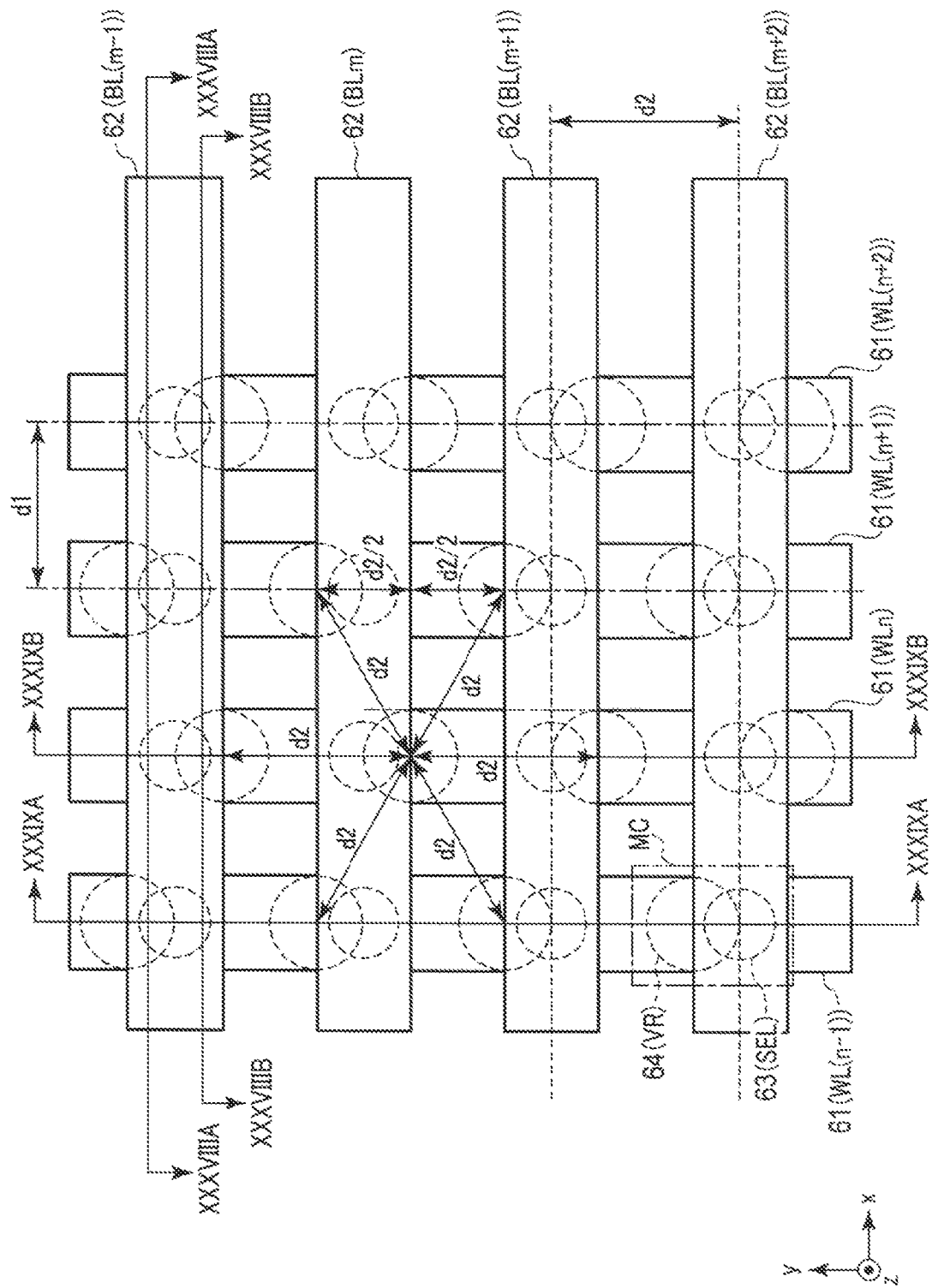
FIG. 37 is a top view for describing a configuration of a memory cell array of a semiconductor storage device according to an eighth embodiment.
Figure 38:
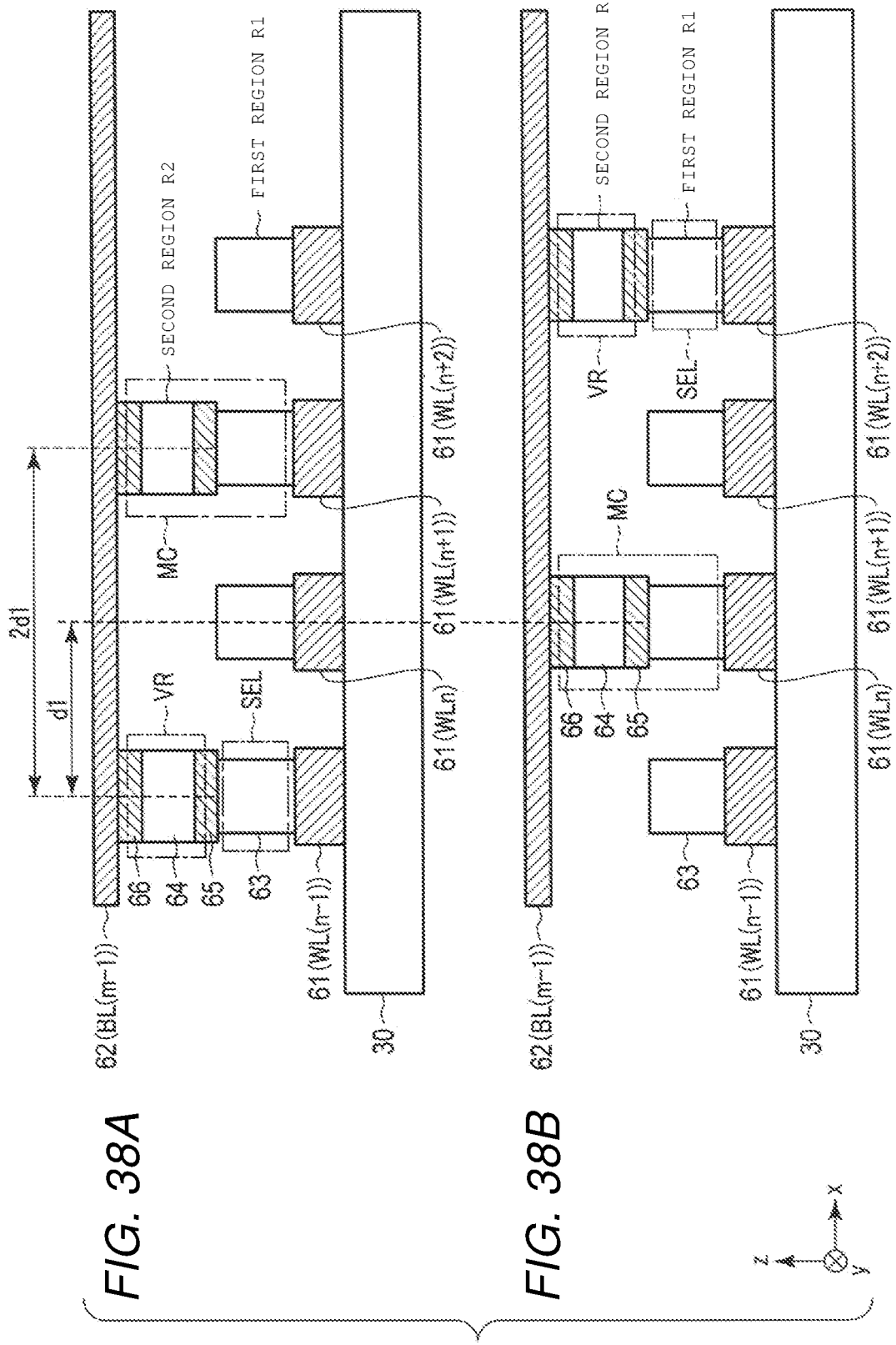
FIGS. 38A and 38B are sectional views for describing the configuration of the memory cell array of the semiconductor storage device according to the eighth embodiment.
Figure 39:
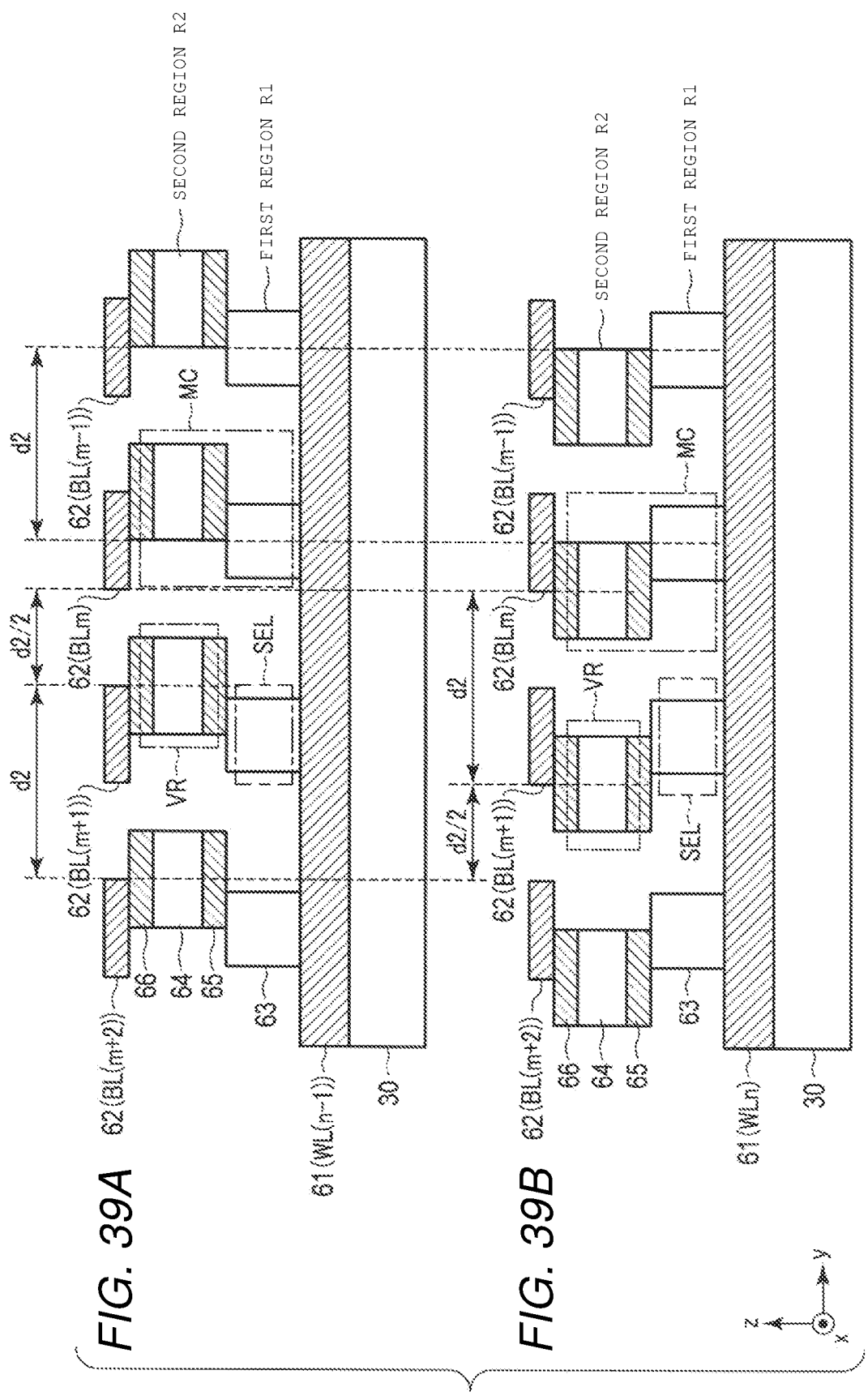
FIGS. 39A and 39B are sectional views for describing the configuration of the memory cell array of the semiconductor storage device according to the eighth embodiment.

Initially, a layout of the memory cell array 11A in the xy-plane will be described with reference to FIG. 37. FIG. 37 is a top view of the memory cell array 11 of the semiconductor storage device according to the eighth embodiment when viewed in the +z-axis direction.

As shown in FIG. 37, two wiring layers 62 adjacent to each other are separated from each other along the y-axis direction by the distance d2. Two wiring layers 61 adjacent to each other are separated from each other along the x-axis direction by the distance d1.

Selection element layers 63 are arranged in a rectangular grid in the xy-plane. Specifically, the selection element layers 63 are arranged, for example, along the x-axis direction at equal intervals for every distance d1, and are arranged along the y-axis direction at equal intervals for every distance d2.

The memory element layers 64 are arranged in the honeycomb shape in the xy-plane. Specifically, the memory element layers 64 are arranged in a position of vertices and a center of a regular hexagon of which a length of one side is the distance d2 in the xy-plane. More specifically, the memory element layers 64 are arranged along the y-axis direction at equal intervals for every distance d2, and are arranged along the x-axis direction at equal intervals for every distance 2d1. That is, the (n−1)-th-column memory element layer 64 and the (n+1)-th-column memory element layer 64 are arranged in a similar order along the x-axis direction. An n-th-column memory element layer 64 and an (n+2)-th-column memory element layer 64 are arranged in a similar order along the x-axis direction. However, the n-th-column memory element layer 64, the (n−1)-th-column memory element layer 64, and the (n+1)-th-column memory element layer 64 are not arranged in the x-axis direction.

In the example of FIG. 37, a center of the n-th-column memory element layer 64 is located in a position, which is offset from a center of a width of the corresponding wiring layer 62 along the y-axis direction, in the −y-axis direction. Centers of the (n−1)-th-column and (n+1)-th-column memory element layers 64 are located in positions, which are offset from a center of a width of the corresponding wiring layer 62 along the y-axis direction, in the +y-axis direction. The center of the n-th-column memory element layer 64 is positioned in a position offset from the centers of the (n−1)-th-column and (n+1)-th-column memory element layers 64, along the y-axis direction by the distance d2/2.

The memory element layers are arranged in this manner, and thus, an arbitrary memory element layer 64 is disposed with equal distances from six memory element layers 64 adjacent to the arbitrary memory element layer 64 in the xy-plane. Specifically, for example, six memory element layers 64($m-1$, $n$), 64($m+1$, $n$), 64($m$, $n-1$), 64($m+1$, $n-1$), 64($m$, $n+1$), and 64($m+1$, $n+1$) adjacent to the memory element layer 64($m$, $n$) are arranged in the vertices of the regular hexagon of which one side is the distance d2, and the memory element layer 64($m$, $n$) is disposed in the center of the regular hexagon. As another example, six memory element layers 64($m-1$, $n+1$), 64($m+1$, $n+1$), 64($m-1$, $n$), 64($m$, $n$), 64($m-1$, $n+2$), and 64($m$, $n+2$) adjacent to the memory element layer 64($m$, $n+1$) are arranged in the vertices of the regular hexagon of which one side is the distance d2, and the memory element layer 64($m$, $n+1$) is disposed in the center of the regular hexagon.

Hereinafter, configurations of sections of the memory cell array 11A described in FIG. 37 which are taken along the xz-plane and the yz-plane will be described with reference to FIGS. 38A to 39B. FIGS. 38A to 39B are examples of sectional views of a stacked structure of the memory cell array of the semiconductor storage device according to the eighth embodiment, which are taken along the xz-plane and the yz-plane. Specifically, FIGS. 38A to 39B show sections taken along a line XXXVIIIA-XXXVIIIA, a line XXXVIIIB-XXXVIIIB, a line XXXIXA-XXXIXA, and a line XXXIXB-XXXIXB shown in FIG. 37. In the following description, differences between FIGS. 38A to 39B and FIGS. 35A to 36B will be described.

Initially, the configuration of the section of the memory cell array 11A taken along the xz-plane will be described with reference to FIGS. 38A and 38B.

As shown in FIGS. 38A and 38B, the plurality of wiring layers 32 functioning as the word lines WL(n−1), WLn, WL(n+1), and WL(n+2) is formed in the same layer above the semiconductor substrate 30 at equal intervals for every distance d1.

The first regions R1 are formed along the x-axis direction so as to be separated from one another by the distance d1. A center of a width of the first region R1 along the x-axis direction matches a center of a width of the wiring layer 61 formed immediately under the first region R1 along the x-axis direction. The selector SEL having the same configuration as that of the selector SEL described in the above-mentioned embodiment is formed in the first region R1.

Second regions R2 are formed along the x-axis direction so as to be separated from each other by the distance 2d1. Specifically, the second regions R2 are formed above the wiring layers 61 functioning as the word lines WL(n−1) and WL(n+1) in the section taken along the line XXXVIIIA-XXXVIIIA. The second regions R2 are formed above the wiring layers 61 functioning as the word lines WLn and WL(n+2) in the section taken along the line XXXVIIIB-XXXVIIIB. The second regions R2 in the section taken along the line XXXVIIIA-XXXVIIIA and the second regions R2 in the section taken along the line XXXVIIIB-XXXVIIIB are formed along the x-axis direction so as to be separated from each other by the distance d1. A center of a width of the second region R2 along the x-axis direction matches a center of a width of the first region R1 formed immediately under the second region R2 along the x-axis direction. The variable resistance element VR having the same configuration as that of the variable resistance element VR described in the above-described embodiment is formed in the second region R2.

Hereinafter, the configuration of the section of the memory cell array 11A taken along the yz-plane will be described with reference to FIGS. 39A and 39B.

As shown in FIGS. 39A and 39B, on the semiconductor substrate 30, the wiring layer 61 functioning as the word line WL(n−1) is formed in the section taken along the line XXXIXA-XXXIXA, and the wiring layer 61 functioning as the word line WLn is formed in the section taken along the line XXXIXB-XXXIXB.

The first regions R1 are formed along the y-axis direction so as to be separated from one another by the distance d2.

The second regions R2 are formed along the y-axis direction so as to be separated from one another by the distance d2. The second region R2 is formed so as to be offset from the first region R1 in the y-axis direction while maintaining a state in which the conductive layer 65 is electrically connected to the selection element layer 63. Specifically, the second region R2 is formed so as to be offset from the first region R1 in the +y-axis direction in the section taken along the line XXXIXA-XXXIXA, and is formed so as to be offset from the first region R1 in the −y-axis direction in the section taken along the line XXXIXB-XXXIXB. The second region R2 in the section taken along the line XXXIXA-XXXIXA and the second region R2 in the section taken along the line XXXIXB-XXXIXB are formed along the x-axis direction so as to be offset from each other along the x-axis direction by the distance d2/2.

The plurality of wiring layers 62 functioning as the bit lines BL(m+2), BL(m+1), BLm, and BL(m−1) is formed on an upper end of the conductive layer 66 at equal intervals by the distance d2. A center of a width of the wiring layer 62 along the y-axis direction matches a center of a width of the first region R1 formed immediately under the wiring layer 62 along the y-axis direction.

8.2 Advantage According to Present Embodiment

According to the eighth embodiment, the variable resistance elements VR are disposed in the vertices and the center of the regular hexagon in the xy-plane. Specifically, the variable resistance elements VR which correspond to the same word line WL and are adjacent to each other are separated from each other along the y-axis direction by the distance d2. The variable resistance elements VR which correspond to the same bit line BL and are adjacent to each other are separated from each other along the x-axis direction by the distance d1. The variable resistance element VR which corresponds to the m-th-row bit line BL and the n-th-column word line WL and the variable resistance element VR which corresponds to the m-th-row bit line BL and the (n+1)-th-column word line WL are separated along the y-axis direction by the distance d2/2. Accordingly, it is possible to set the distances between all the variable resistance elements VR adjacent to each other to be equal. Thus, a manufacturing fluctuation in a manufacturing stage can be reduced in the embodiment compared to the arrangement in which the distances between all the variable resistance elements adjacent to each other are not equal, such as in the case of the memory cells arranged in the rectangular grid.

In addition, according to the eighth embodiment, it is possible to similarly acquire other advantages mentioned in the seventh embodiment.

9. Ninth Embodiment

Hereinafter, a semiconductor storage device according to a ninth embodiment will be described. The selectors are arranged in the rectangular grid in the seventh embodiment and the eighth embodiment, whereas the selectors are arranged in the honeycomb shape in the ninth embodiment. In the ninth embodiment, the selectors are arranged similarly to the arrangement of the variable resistance elements described in the seventh embodiment. That is, the center of the selector in the xy-plane matches the center of the variable resistance element in the ninth embodiment. Hereinafter, differences from the seventh embodiment will be described.

9.1 Stacked Structure of Memory Cell Array

A stacked structure of a memory cell array of the semiconductor storage device according to the ninth embodiment will be described below.

Figure 40:
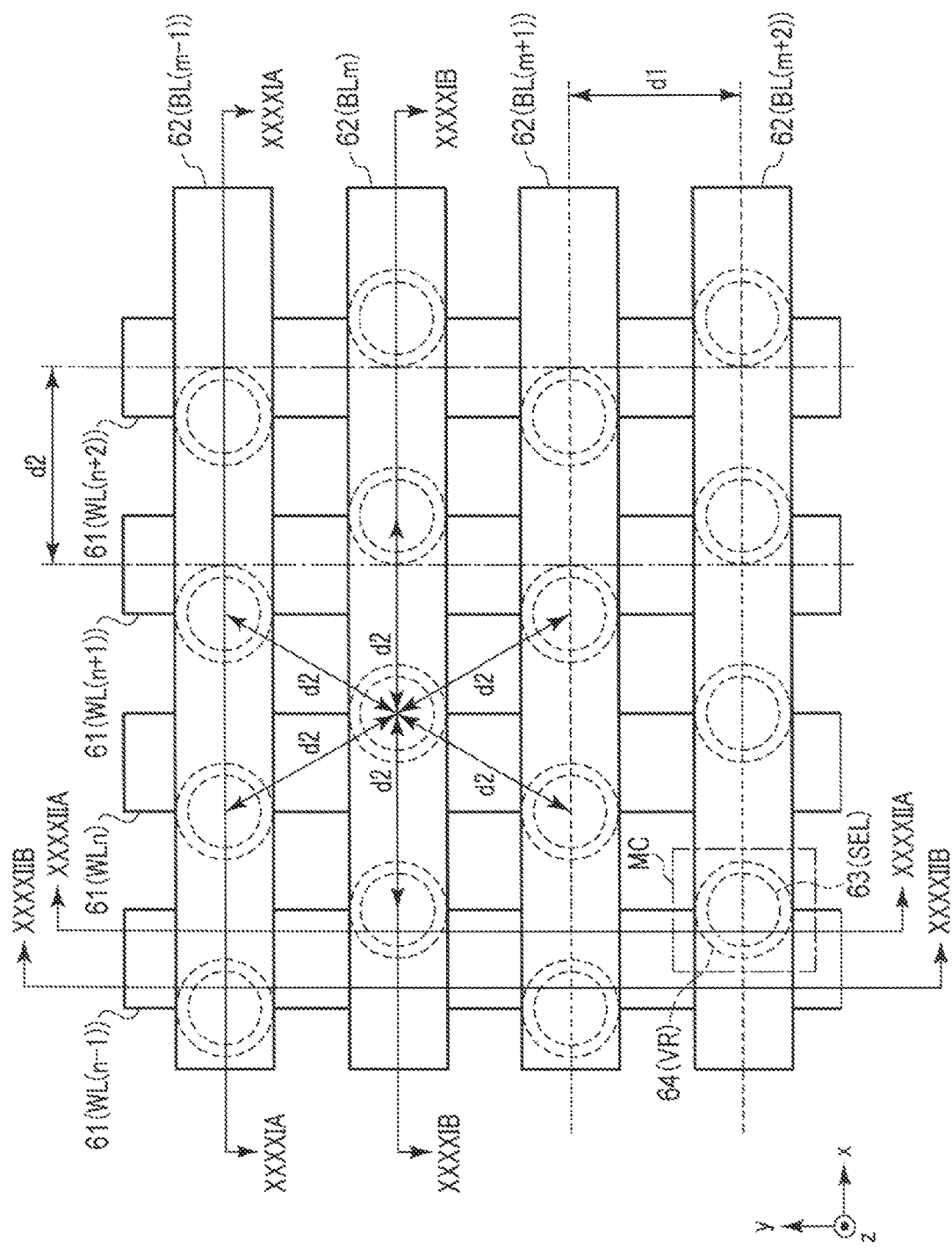
FIG. 40 is a top view for describing a configuration of a memory cell array of a semiconductor storage device according to a ninth embodiment.

Initially, a layout of the memory cell array 11A in the xy-plane will be described with reference to FIG. 40. FIG. 40 is a top view of the memory cell array 11A of the semiconductor storage device according to the ninth embodiment when viewed in the +z-axis direction.

As shown in FIG. 40, the arrangement of the wiring layers 61 and 62 and the memory element layers 64 is the same as that of the seventh embodiment, and thus, the description is omitted.

The selection element layers 63 are arranged in the honeycomb shape in the xy-plane. Specifically, the selection element layers 63 are arranged in vertices and a center of a regular hexagon of which a length of one side is the distance d2 in the xy-plane. More specifically, the selection element layers 63 are arranged along the x-axis direction at equal intervals for every distance d2, and are arranged along the y-axis direction at equal intervals for every distance 2d1. That is, an (m−1)-th-row selection element layer 63 and an (m+1)-th-row selection element layer 63 are arranged in a similar order along the y-axis direction. An m-th-row selection element layer 63 and an (m+2)-th-row selection element layer 63 are arranged in a similar order along the y-axis direction. However, the m-th-row selection element layer 63, the (m−1)-th-row selection element layer 63, and the (m+1)-th-row selection element layer 63 are not arranged along the y-axis direction.

In the example of FIG. 40, a center of the selection element layer 63 is disposed so as to match a center of the memory element layer 64 in the xy-plane. That is, a center of the m-th-row selection element layer 63 is located in a position offset from centers of the (m−1)-th-row and (m+1)-th-row selection element layers 63 along the x-axis direction by the distance d2/2.

The selection element layers are arranged in this manner, and thus, an arbitrary selection element layer 63 is disposed with equal distances from six selection element layers 63 adjacent to the arbitrary selection element layer 63 in the xy-plane. Specifically, for example, six selection element layers 63(m, n−1), 63(m, n+1), 63(m−1, n), 63(m−1, n+1), 63(m+1, n), and 63(m+1, n+1) adjacent to the selection element layer 63(m, n) are arranged in the vertices of the regular hexagon of which one side is the distance d2, and the selection element layer 63(m, n) is disposed in the center of the regular hexagon. As another example, six selection element layers 63(m+1, n−1), 63(m+1, n+1), 63(m, n−1), 63(m, n), 63(m+2, n−1), and 63(m+2, n) adjacent to the selection element layer 63(m+1, n) are arranged in the vertices of the regular hexagon of which one side is the distance d2, and the selection element layer 63(m+1, n) is disposed in the center of the regular hexagon.

Hereinafter, configurations of sections of the memory cell array 11A described in FIG. 40 which are taken along the xz-plane and the yz-plane will be described with reference to FIGS. 41A to 42B. FIGS. 41A to 42B are examples of sectional views of a stacked structure of the memory cell array of the semiconductor storage device according to the ninth embodiment, which are taken along the xz-plane and the yz-plane. Specifically, FIGS. 41A to 42B show sections taken along a line XXXXIA-XXXXIA, a line XXXXIB-XXXXIB, a line XXXXIIA-XXXXIIA, and a line XXXXIIB-XXXXIIB shown in FIG. 40. In the following description, differences between FIGS. 41A to 42B and FIGS. 35A to 36B will be described.

Initially, the configuration of the section of the memory cell array 11A taken along the xz-plane will be described with reference to FIGS. 41A and 41B.

Figures 41A, 41B:
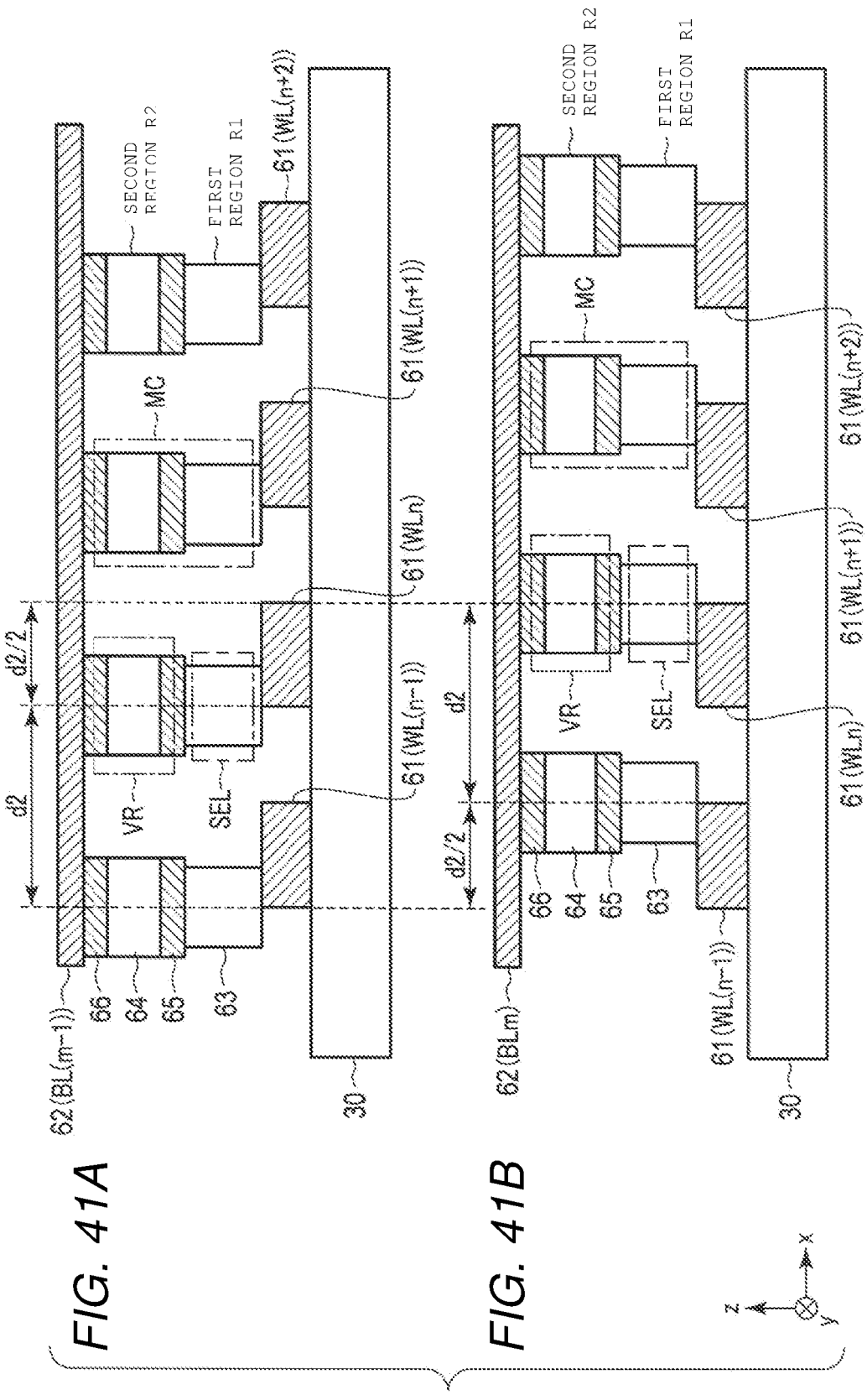
FIGS. 41A and 41B are sectional views for describing the configuration of the memory cell array of the semiconductor storage device according to the ninth embodiment.

As shown in FIGS. 41A and 41B, the first region R1 is formed so as to reach a part of an upper end of the wiring layer 62. Specifically, the first region R1 is in contact with a part of the wiring layer 61 on the −x-axis in the section taken along the line XXXXIA-XXXXIA, and is in contact with a part of the wiring layer 61 on the +x-axis in the section taken along the line XXXXIB-XXXXIB. A center of a width of the first region R1 along the x-axis direction matches a center of a width of the second region R2 formed immediately above the first region R1 along the x-axis direction.

That is, the combination of the first region R1 and the second region R2 is formed so as to be offset from the wiring layer 61 in the −x-axis direction in the section taken along the line XXXXIA-XXXXIA, and is formed so as to be offset from the wiring layer 61 in the +x-axis direction in the section taken along the line XXXXIB-XXXXIB. The combination of the first region R1 and the second region R2 in the section taken along the line XXXXIA-XXXXIA and the combination of the first region R1 and the second region R2 in the section taken along the line XXXXIB-XXXXIB are formed along the x-axis direction so as to be offset from each other by the distance d2/2.

Hereinafter, the configuration of the section of the memory cell array 11A taken along the yz-plane will be described with reference to FIGS. 42A and 42B.

As shown in FIGS. 42A and 42B, the first region R1 and the second region R2 are formed such that the centers of the widths along the y-axis direction match each other. The combination of the first region R1 and the second region R2 are formed along the y-axis direction so as to be offset by the distance 2d1. Specifically, the combinations of the first regions R1 and the second regions R2 are formed under the wiring layers 62 functioning as the bit lines BL(m+2) and BLm in the section taken along the line XXXXIIA-XXXXIIA. The combinations of the first regions R1 and the second regions R2 are formed under the wiring layers 62 functioning as the bit lines BL(m+1) and BL(m−1) in the section taken along the line XXXXIIB-XXXXIIB. The combination of the first region R1 and the second region R2 formed under the wiring layer 62 functioning as the bit line BL(m−1) and the combination of the first region R1 and the second region R2 formed under the wiring layer 62 functioning as the bit line BLm are formed along the y-axis direction so as to be separated from each other by the distance d1.

9.2 Advantage According to Present Embodiment

According to the ninth embodiment, the selectors SEL are disposed in the vertices and the center of the regular hexagon in the xy-plane. Specifically, the selectors SEL which correspond to the same bit line BL and are adjacent to each other are separated along the x-axis direction by the distance d2. The selectors SEL which correspond to the same word line WL and are adjacent to each other are separated from each other along the y-axis direction by the distance d1. The selector SEL which corresponds to the m-th-row bit line BL and the n-th-column word line WL and the selector SEL which corresponds to the (m+1)-th-row bit line BL and the n-th-column word line WL are separated along the x-axis direction by the distance d2/2. Accordingly, it is possible to set the distances between all the selectors SEL adjacent to each other to be equal. Thus, it is possible to reduce a manufacturing fluctuation in a manufacturing stage.

A center of the selector SEL matches a center of the variable resistance element VR in the xy-plane. Accordingly, it is possible to increase a contact area between the selector SEL and the variable resistance element VR. It is possible to further reduce an area occupied by the memory cell in the xy-plane.

In addition, according to the ninth embodiment, it is possible to similarly acquire other advantages mentioned in the seventh embodiment.

10. Tenth Embodiment

Hereinafter, a semiconductor storage device according to a tenth embodiment will be described. In the tenth embodiment, the tenth embodiment is different from the seventh embodiment and the eighth embodiment in that the select transistors are arranged in the honeycomb shape, similarly to the ninth embodiment. In the tenth embodiment, the selectors are arranged similarly to the arrangement of the variable resistance elements described in the eighth embodiment. That is, the center of the selector in the xy-plane matches the center of the variable resistance element in the tenth embodiment. Hereinafter, differences from the eighth embodiment will be described.

10.1 Stacked Structure of Memory Cell Array

A stacked structure of a memory cell array of the semiconductor storage device according to the tenth embodiment will be described below.

Figure 43:
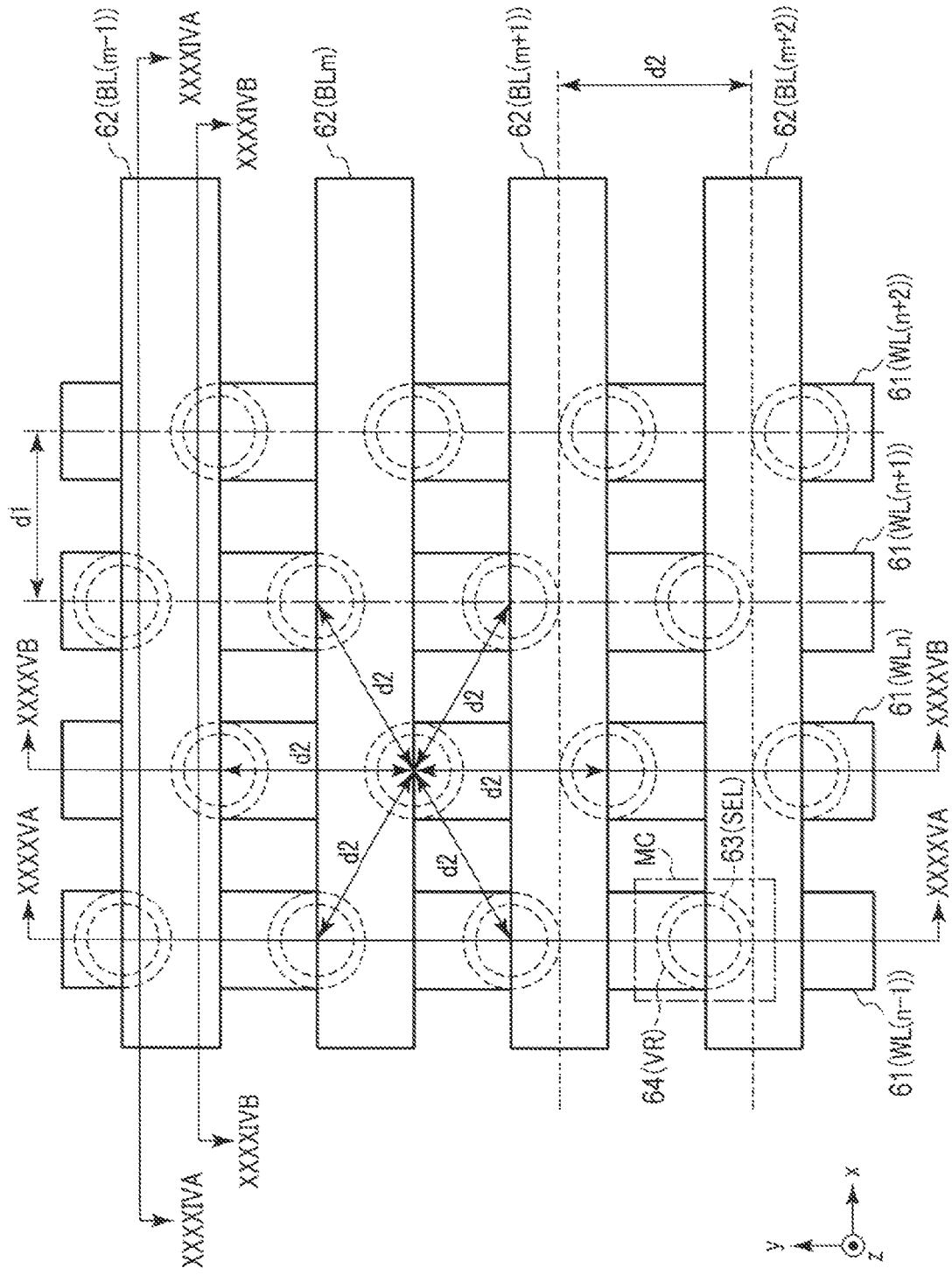
FIG. 43 is a top view for describing a configuration of a memory cell array of a semiconductor storage device according to a tenth embodiment.

Initially, a layout of the memory cell array 11A in the xy-plane will be described with reference to FIG. 43. FIG. 43 is a top view of the memory cell array 11A of the semiconductor storage device according to the tenth embodiment when viewed in the +z-axis direction.

As shown in FIG. 43, the arrangement of the wiring layers 61 and 62 and the memory element layers 64 is the same as that of the eighth embodiment, and thus, the description is omitted.

The selection element layers 63 are arranged in the honeycomb shape in the xy-plane. Specifically, the center of the selection element layer 63 is disposed so as to match the center of the memory element layer 64 in the xy-plane.

The selection element layers 63 are arranged in the honeycomb shape in the xy-plane. Specifically, the selection element layers 63 are arranged in vertices and a center of a regular hexagon of which a length of one side is the distance d2 in the xy-plane. More specifically, the selection element layers 63 are arranged along the y-axis direction at equal intervals for every distance d2, and are arranged along the x-axis direction at equal intervals for every distance 2d1. That is, the (n−1)-th-column selection element layer 63 and the (n+1)-th-column selection element layer 63 are arranged in a similar order along the x-axis direction. The n-th-column selection element layer 63 and the (n+2)-th-column selection element layer 63 are arranged in a similar order along the x-axis direction. However, the n-th-column selection element layer 63, the (n−1)-th-column selection element layer 63, and the (n+1)-th-column selection element layer 63 are not arranged in the x-axis direction.

In the example of FIG. 43, a center of the selection element layer 63 is disposed so as to match a center of the memory element layer 64 in the xy-plane. That is, the center of the n-th-column selection element layer 63 is located in a position offset from the centers of the (n−1)-th-column and (n+1)-th-column selection element layers 63, along the y-axis direction by the distance d2/2.

The selection element layers are arranged in this manner, and thus, an arbitrary selection element layer 63 is disposed with equal distances from six selection element layers 63 adjacent to the arbitrary selection element layer 63 in the xy-plane. Specifically, for example, six selection element layers 63(m−1, n), 63(m+1, n), 63(m, n−1), 63(m+1, n−1), 63(m, n+1), and 63(m+1, n+1) adjacent to the selection element layer 63(m, n) are arranged in the vertices of the regular hexagon of which one side is the distance d2, and the selection element layer 63(m, n) is disposed in the center of the regular hexagon. As another example, six selection element layers 63(m−1, n+1), 63(m+1, n+1), 63(m−1, n), 63(m, n), 63(m−1, n+2), and 63(m, n+2) adjacent to the selection element layer 63(m, n+1) are arranged in the vertices of the regular hexagon of which one side is the distance d2, and the selection element layer 63(m, n+1) is disposed in the center of the regular hexagon.

Hereinafter, configurations of sections of the memory cell array 11A described in FIG. 43 which are taken along the xz-plane and the yz-plane will be described with reference to FIGS. 44A to 45B. FIGS. 44A to 45B are examples of sectional views of a stacked structure of the memory cell array of the semiconductor storage device according to the tenth embodiment, which are taken along the xz-plane and the yz-plane. Specifically, FIGS. 44A to 45B show sections taken along a line XXXXIVA-XXXXIVA, a line XXXXIVB-XXXXIVB, a line XXXXVA-XXXXVA, and a line XXXXVB-XXXXVB shown in FIG. 43. In the following description, differences between FIGS. 44A to 45B and FIGS. 38A to 39B will be described.

Initially, the configuration of the section of the memory cell array 11A taken along the xz-plane will be described with reference to FIGS. 44A and 44B.

Figures 44A, 44B:
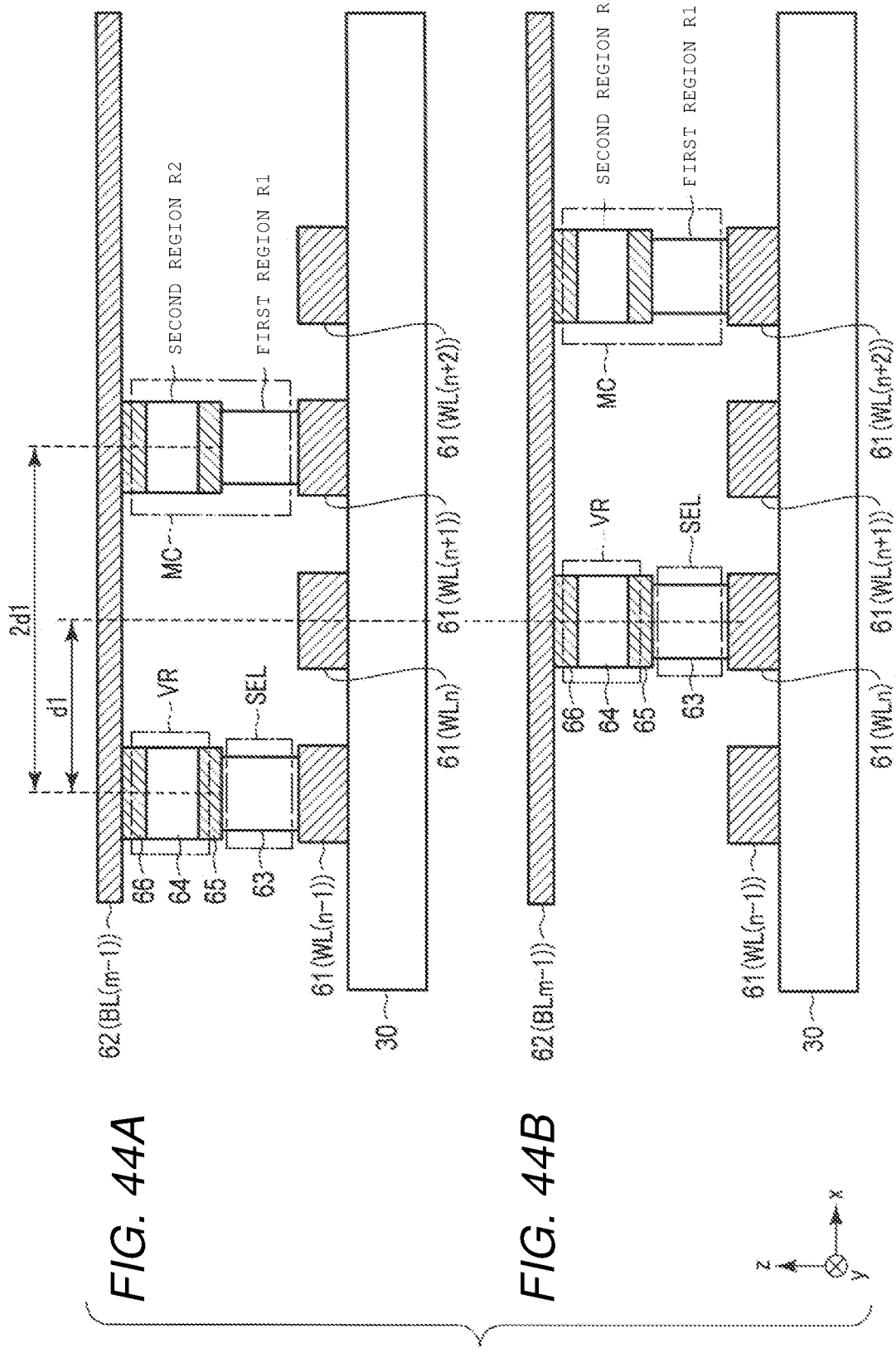
FIGS. 44A and 44B are sectional views for describing the configuration of the memory cell array of the semiconductor storage device according to the tenth embodiment.

As shown in FIGS. 44A and 44B, the combination of the first regions R1 and the second region R2 is formed so as to be separated from one another along the x-axis direction by the distance 2d1. Specifically, the first regions R1 are formed so as to reach the upper ends of the wiring layers 61 functioning as the word lines WL(n−1) and WL(n+1) in the section taken along the line XXXXIVA-XXXXIVA. The first regions R1 are formed so as to reach the upper ends of the wiring layers 61 functioning as the word lines WLn and WL(n+2) in the section taken along the line XXXXIVB-XXXXIVB. The first region R1 in the section taken along the line XXXXIVA-XXXXIVA and the first region R1 in the section taken along the line XXXXIVB-XXXXIVB are formed along the x-axis direction so as to be separated from each other by the distance d1.

Hereinafter, the configuration of the section of the memory cell array 11A taken along the yz-plane will be described with reference to FIGS. 45A and 45B.

Figures 45A, 45B:
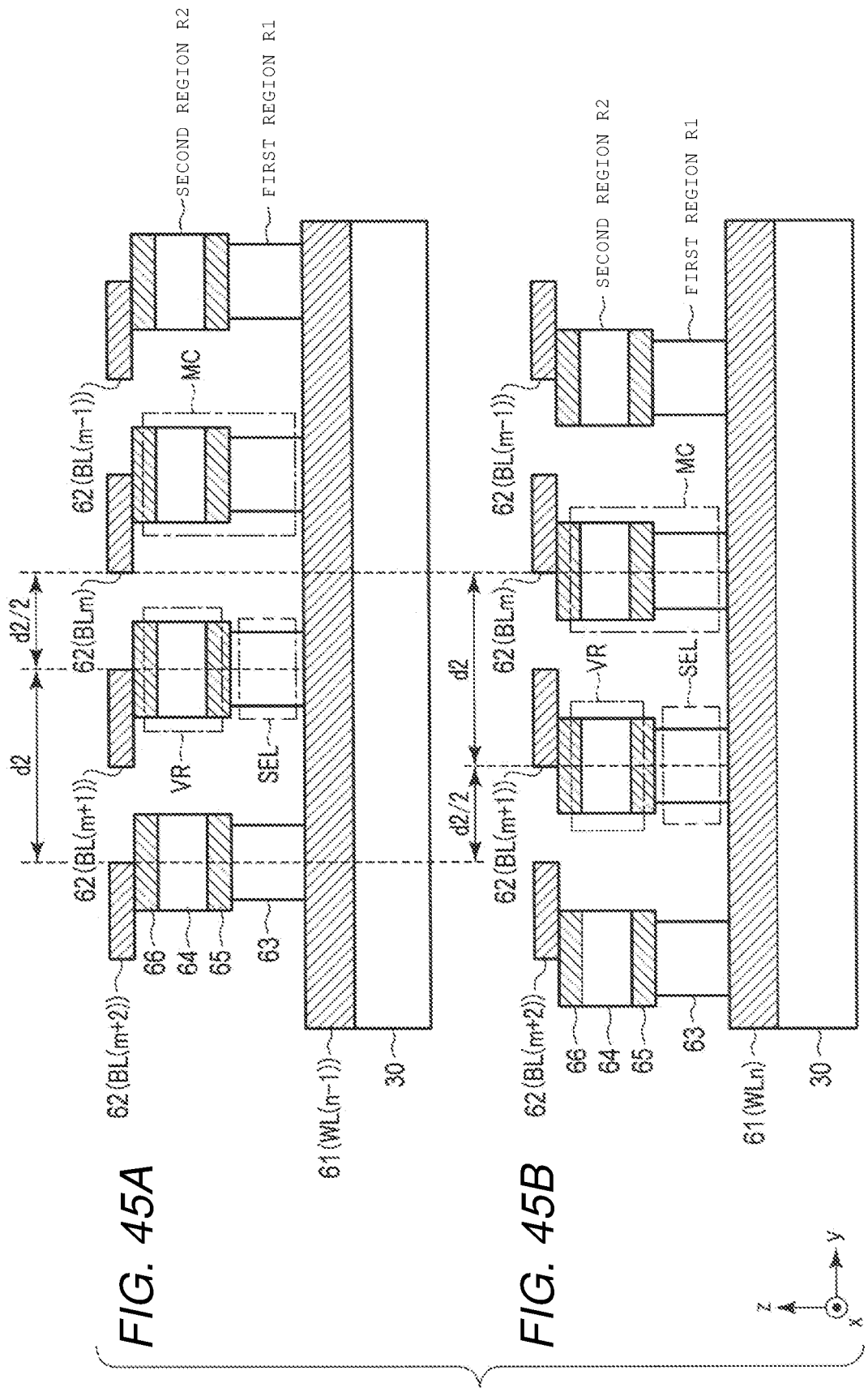
FIGS. 45A and 45B are sectional views for describing the configuration of the memory cell array of the semiconductor storage device according to the tenth embodiment.

As shown in FIGS. 45A and 45B, the first region R1 and the second region R2 are formed such that the centers of the widths along the y-axis direction match each other. The combinations of the first regions R1 and the second regions R2 are formed along the y-axis direction so as to be separated from one another by the distance d2. The combination of the first region R1 and the second region R2 is formed in a position, which is offset from the center of the width of the wiring layer 62 along the y-axis direction, in the +y-axis direction in the section taken along the line XXXXVA-XXXXVA, and is formed in a position, which is offset from the center of the width of the wiring layer 62 along the y-axis direction, in the −y-axis direction in the section taken along the line XXXXVB-XXXXVB. The combination of the first region R1 and the second region R2 corresponding to the wiring layer 61 functioning as the word line WL(n−1) and the combination of the first region R1 and the second region R2 corresponding to the wiring layer 61 functioning as the word line WLn are formed along the y-axis direction so as to be offset from each other by the distance d2/2.

10.2 Advantage According to Present Embodiment

According to the tenth embodiment, the selectors SEL are disposed in the vertices and the center of the regular hexagon in the xy-plane. Specifically, the selectors SEL which correspond to the same word line WL and are adjacent to each other are separated from each other along the y-axis direction by the distance d2. The selectors SEL which correspond to the same bit line BL and are adjacent to each other are separated from each other along the x-axis direction by the distance d1. The selector SEL which corresponds to the m-th-row bit line BL and the n-th-column word line WL and the selector SEL which corresponds to the m-th-row bit line BL and the (n+1)-th-column word line WL are separated along the y-axis direction by the distance d2/2. Accordingly, it is possible to set the distances between all the selectors SEL adjacent to each other to be equal. Thus, it is possible to reduce a manufacturing fluctuation in a manufacturing stage.

A center of the selector SEL matches a center of the variable resistance element VR in the xy-plane. Accordingly, it is possible to increase a contact area between the selector SEL and the variable resistance element VR. It is possible to further reduce an area occupied by the memory cell in the xy-plane.

In addition, according to the tenth embodiment, it is possible to similarly acquire other advantages mentioned in the eighth embodiment.

11. Eleventh Embodiment

Hereinafter, a semiconductor storage device according to an eleventh embodiment will be described. In the ninth embodiment, the selectors are offset from the word lines in the same direction with the variable resistance elements, and thus, the selectors are arranged in the honeycomb shape. In contrast, the eleventh embodiment is different from the ninth embodiment in that the selectors are offset from the word line in a direction opposite to a direction the variable resistance elements are offset, and thus, the selectors are arranged in the honeycomb shape. That is, in the eleventh embodiment, when the center of the variable resistance element is offset from the word line in the +x-axis direction, the center of the selector is offset from the word line in the −x-axis direction. When the center of the variable resistance element is offset from the word line in the −x-axis direction, the center of the selector is offset from the word line in the +x-axis direction. Hereinafter, differences from the ninth embodiment will be described.

11.1 Stacked Structure of Memory Cell Array

A stacked structure of a memory cell array of the semiconductor storage device according to the eleventh embodiment will be described below.

Figure 46:
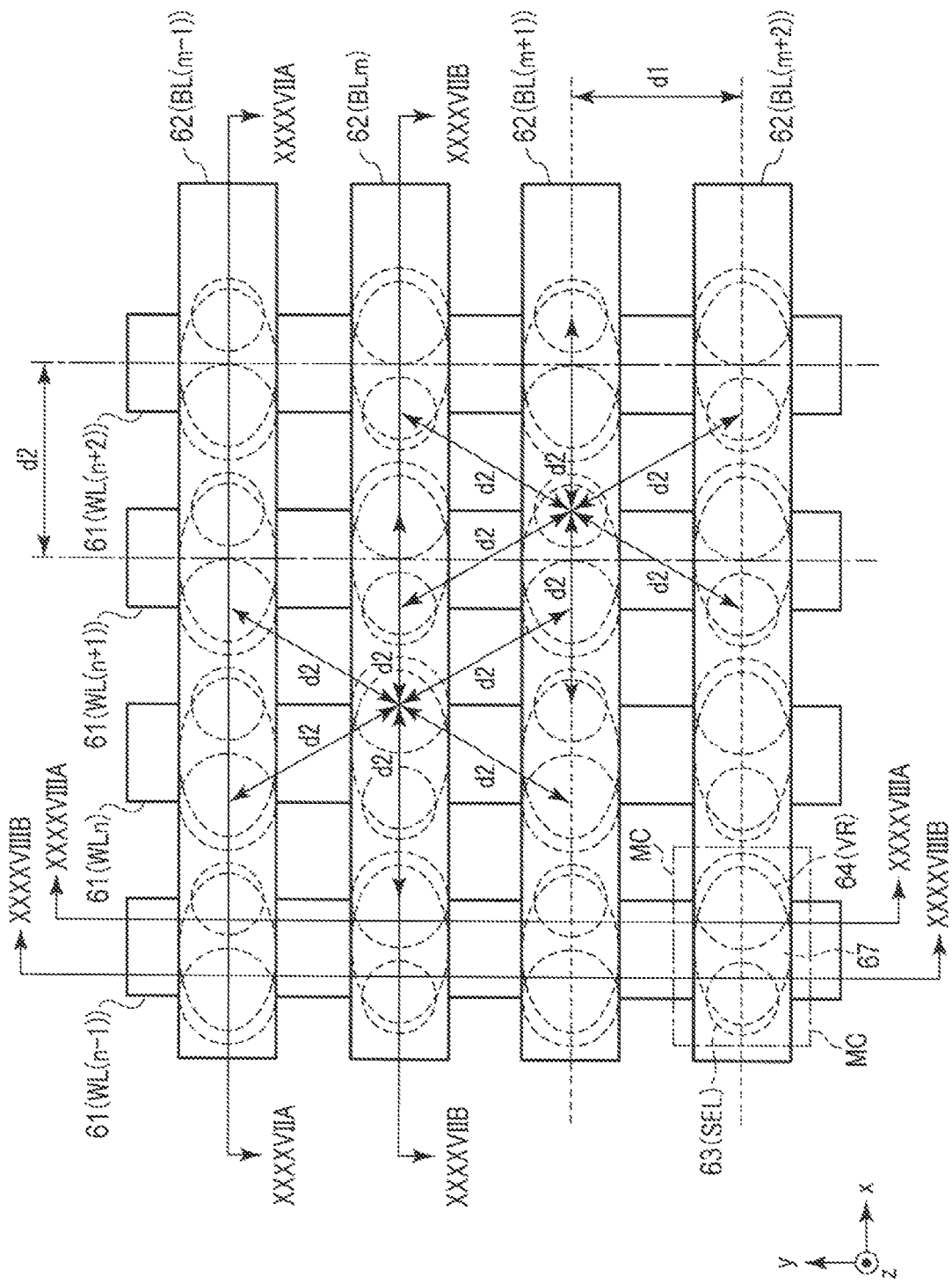
FIG. 46 is a top view for describing a configuration of a memory cell array of a semiconductor storage device according to an eleventh embodiment.
Figure 47:
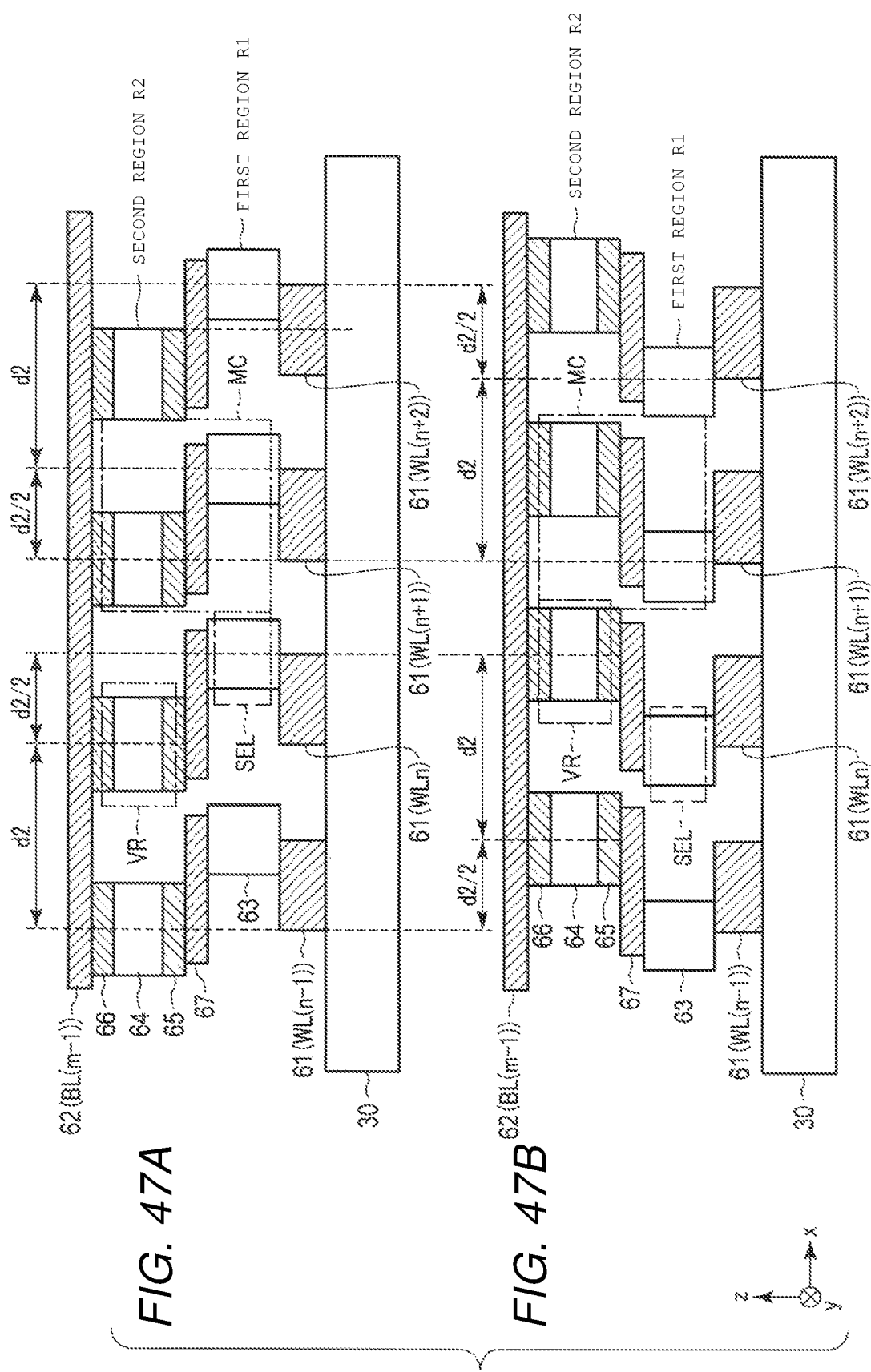
FIGS. 47A and 47B are sectional views for describing the configuration of the memory cell array of the semiconductor storage device according to the eleventh embodiment.
Figure 48:
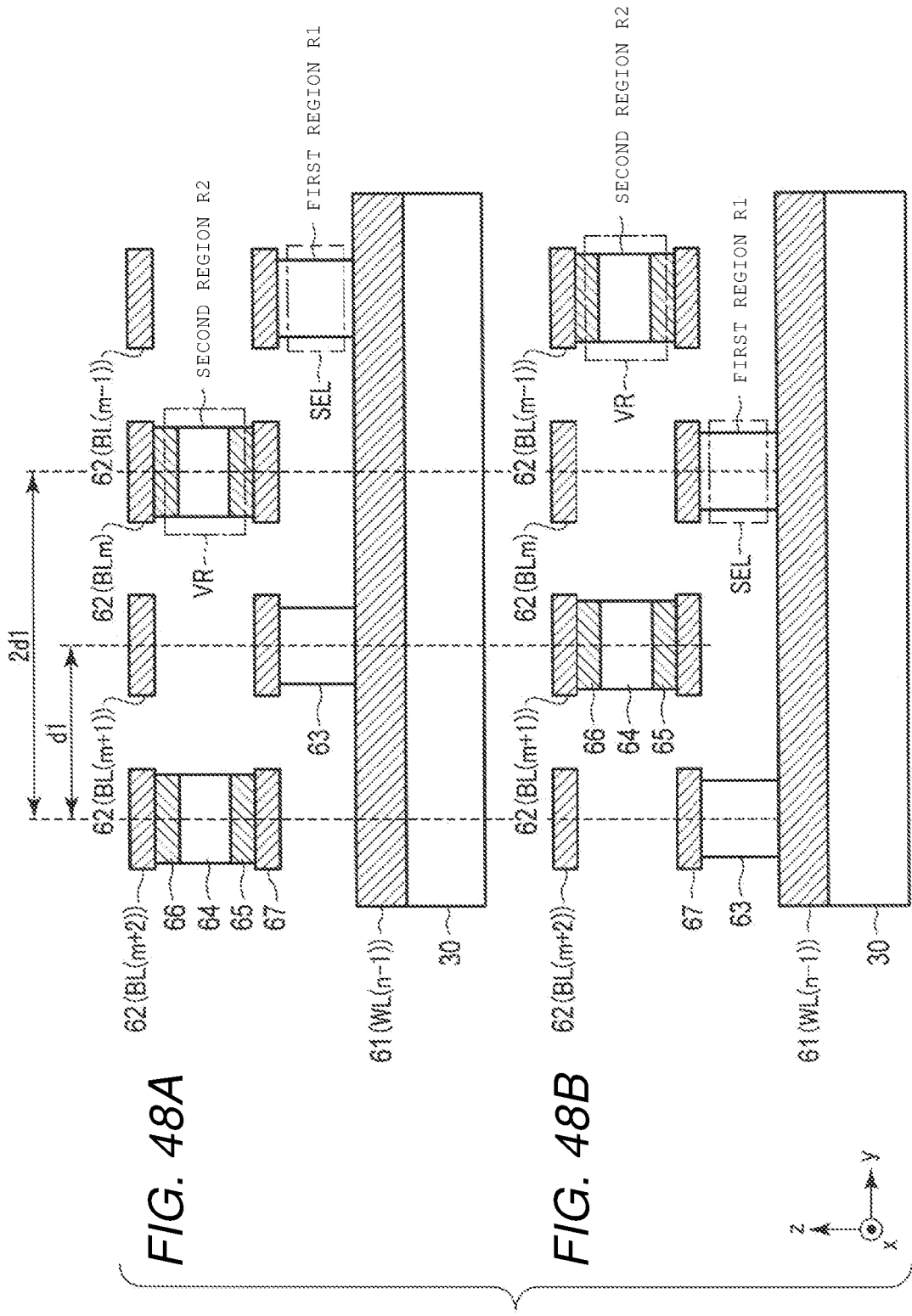
FIGS. 48A and 48B are sectional views for describing the configuration of the memory cell array of the semiconductor storage device according to the eleventh embodiment.

Initially, a layout of the memory cell array 11A in the xy-plane will be described with reference to FIG. 46. FIG. 46 is a top view of the memory cell array 11A of the semiconductor storage device according to the eleventh embodiment when viewed in the +z-axis direction.

As shown in FIG. 46, the arrangement of the wiring layers 61 and 62 and the memory element layers 64 is the same as that of the ninth embodiment, and thus, the description is omitted.

The selection element layers 63 are arranged in the honeycomb shape in the xy-plane. Specifically, the center of the selection element layer 63 is disposed so as to be offset from the wiring layer 61 in a direction opposite to the direction in which the center of the memory element layer 64 is offset from the wiring layer in the xy-plane.

The selection element layers 63 are formed such that at least some thereof overlap in regions occupied by the wiring layers 61. More specifically, the center of the m-th-row selection element layer 63 is located in a position which is offset from the center of the width of the corresponding wiring layer 61 along the x-axis direction, in the −x-axis direction. The centers of the (m−1)-th-row and (m+1)-th-row selection element layers 63 are located in positions, which are offset from the center of the width of the corresponding wiring layer 61 along the x-axis direction, in the +x-axis direction. The center of the m-th-row selection element layer 63 is located in a position, which is offset from the centers of the (m−1)-th-row and (m+1)-th-row selection element layers 63, along the x-axis direction by the distance d2/2.

The selection element layers are arranged in this manner, and thus, an arbitrary selection element layer 63 is disposed with equal distances from six selection element layers 63 adjacent to the arbitrary selection element layer 63 in the xy-plane. Specifically, for example, six selection element layers 63($m$, $n$−1), 63($m$, $n$+1), 63($m$−1, $n$−1), 63($m$−1, $n$), 63($m$+1, $n$−1), and 63($m$+1, $n$) adjacent to the selection element layer 63($m$, $n$) are arranged in the vertices of the regular hexagon of which one side is the distance d2, and the selection element layer 63($m$, $n$) is disposed in the center of the regular hexagon. As another example, six selection element layers 63($m$+1, $n$−1), 63($m$+1, $n$+1), 63($m$, $n$), 63($m$, $n$+1), 63($m$+2, $n$), and 63($m$+2, $n$+1) adjacent to the selection element layer 63($m$+1, $n$) are arranged in the vertices of the regular hexagon of which one side is the distance d2, and the selection element layer 63($m$+1, $n$) is disposed in the center of the regular hexagon.

In the example of FIG. 46, the memory element layer 64 and the selection element layer 63 do not overlap and are separate from each other in the xy-plane. Thus, an internal connection layer 67 is further formed between the memory element layer 64 and the selection element layer 63 such that the memory element layer 64 and the selection element layer 63 are connected to each other. For example, the internal connection layer 67 has an oval shape so as to overlap both the memory element layer 64 and the selection element layer 63 in the xy-plane.

Hereinafter, configurations of sections of the memory cell array 11A described in FIG. 46 which are taken along the xz-plane and the yz-plane will be described with reference to FIGS. 47A to 48B. FIGS. 47A to 48B are examples of sectional views of a stacked structure of the memory cell array of the semiconductor storage device according to the eleventh embodiment, which are taken along the xz-plane and the yz-plane. Specifically, FIGS. 47A to 48B show sections taken along a line XXXXVIIA-XXXXVIIA, a line XXXXVIIB-XXXXVIIB, a line XXXXVIIIA-XXXXVIIIA, and a line XXXXVIIIB-XXXXVIIIB shown in FIG. 46. In the following description, differences between FIGS. 47A to 48B and FIGS. 41A to 42B will be described.

Initially, the configuration of the section of the memory cell array 11A taken along the xz-plane will be described with reference to FIGS. 47A and 47B.

As shown in FIGS. 47A and 47B, the first region R1 is formed so as to reach a part of an upper end of the wiring layer 61. Specifically, the first region R1 reaches a part of the upper end of the wiring layer 61 on the +x-axis in the section taken along the line XXXXVIIA-XXXXVIIA, and reaches a part of the upper end of the wiring layer 61 on the −x-axis in the section taken along the line XXXXVIIB-XXXXVIIB. A center of a width of the first region R1 along the x-axis direction is different from a center of a width of the second region R2 formed immediately above the first region R1 along the x-axis direction.

That is, in the section taken along the line XXXXVIIA-XXXXVIIA, the second region R2 is formed so as to be offset from the wiring layer 61 in the −x-axis direction, and the first region R1 is formed so as to be offset from the wiring layer 61 in the +x-axis direction. In the section taken along the line XXXXVIIB-XXXXVIIB, the second region R2 is formed so as to be offset from the wiring layer 61 in the +x-axis direction, and the first region R1 is formed so as to be offset from the wiring layer 61 in the −x-axis direction. The first region R1 and the second region R2 in the section taken along the line XXXXVIIA-XXXXVIIA and the first region R1 and the second region R2 in the section taken along the line XXXXVIIB-XXXXVIIB are formed along the x-axis direction so as to be offset from each other by the distance d2/2.

The internal connection layer 67 is formed on an upper end of the selection element layer 63. The internal connection layer 67 further extends toward the −x-axis direction than the selector SEL in the section taken along the line XXXXVIIA-XXXXVIIA, and further extends toward the +x-axis direction than the selector SEL in the section taken along the line XXXXVIIB-XXXXVIIB. The second region R2 is formed on an upper end of the internal connection layer 67.

Hereinafter, the configuration of the section of the memory cell array 11A taken along the yz-plane will be described with reference to FIGS. 48A and 48B.

As shown in FIGS. 48A and 48B, the first regions R1 are formed along the y-axis direction so as to be separated from one another by the distance 2d1. Specifically, the first regions R1 are formed under the wiring layer 62 functioning as the bit lines BL(m+1) and BL(m−1) in the section taken along the line XXXXVIIIA-XXXXVIIIA. Specifically, the first regions R1 are formed under the wiring layers 62 functioning as the bit lines BL(m+2) and BLm in the section taken along the line XXXXVIIIB-XXXXVIIIB. The first region R1 in the section taken along the line XXXXVIIA-XXXXVIIA and the first region R1 in the section taken along the line XXXXVIIB-XXXXVIIB are formed along the y-axis direction so as to be separated from each other by the distance d1.

The internal connection layer 67 is formed in an upper end of the selection element layer 63 and a lower end of the conductive layer 65. For example, a center of the internal connection layer 67 along the y-axis direction matches centers of widths of the first region R1 and the second region R2 along the y-axis direction.

11.2 Advantage According to Present Embodiment

According to the eleventh embodiment, when the variable resistance element VR is offset from the center of the width of the corresponding word line WL along the x-axis direction in the +x-axis direction, the selector SEL is offset from the center of the width of the corresponding word line WL along the x-axis direction in the −x-axis direction. When the variable resistance element VR is offset from the center of the width of the corresponding word line WL along the x-axis direction in the −x-axis direction, the selector SEL is offset from the center of the width of the corresponding word line WL along the x-axis direction in the +x-axis direction. The selectors SEL are disposed in the vertices and the center of the regular hexagon in the xy-plane. Accordingly, the selector SEL does not overlap the variable resistance element VR in the xy-plane. Thus, it is possible to form the variable resistance element VR on a base portion in which the selector SEL is not present. Accordingly, it is possible to reduce a characteristic fluctuation of the variable resistance element VR in manufacturing the variable resistance element.

The internal connection layer 67 is formed between the selector SEL and the variable resistance element VR. The internal connection layer 67 overlaps both the selector SEL and the variable resistance element VR in the xy-plane. Accordingly, it is possible to connect the selector SEL and the variable resistance element VR.

In addition, according to the eleventh embodiment, it is possible to similarly acquire other advantages mentioned in the ninth embodiment.

12. Twelfth Embodiment

Hereinafter, a semiconductor storage device according to a twelfth embodiment will be described. In the tenth embodiment, the selectors are offset from the word lines in the same direction with the variable resistance elements, and thus, the selectors are arranged in the honeycomb shape. In contrast, the twelfth embodiment is different from the tenth embodiment in that the selectors are offset from the word line in a direction opposite to a direction the variable resistance elements are offset, and thus, the selectors are arranged in the honeycomb shape. That is, in the twelfth embodiment, when the center of the variable resistance element is offset from the bit line in the +y-axis direction, the center of the selector is offset from the bit line in the −y-axis direction. When the center of the variable resistance element is offset from the bit line in the −y-axis direction, the center of the selector is offset from the bit line in the +y-axis direction. Hereinafter, differences from the tenth embodiment will be described.

12.1 Stacked Structure of Memory Cell Array

A stacked structure of a memory cell array of the semiconductor storage device according to the twelfth embodiment will be described below.

Figure 49:
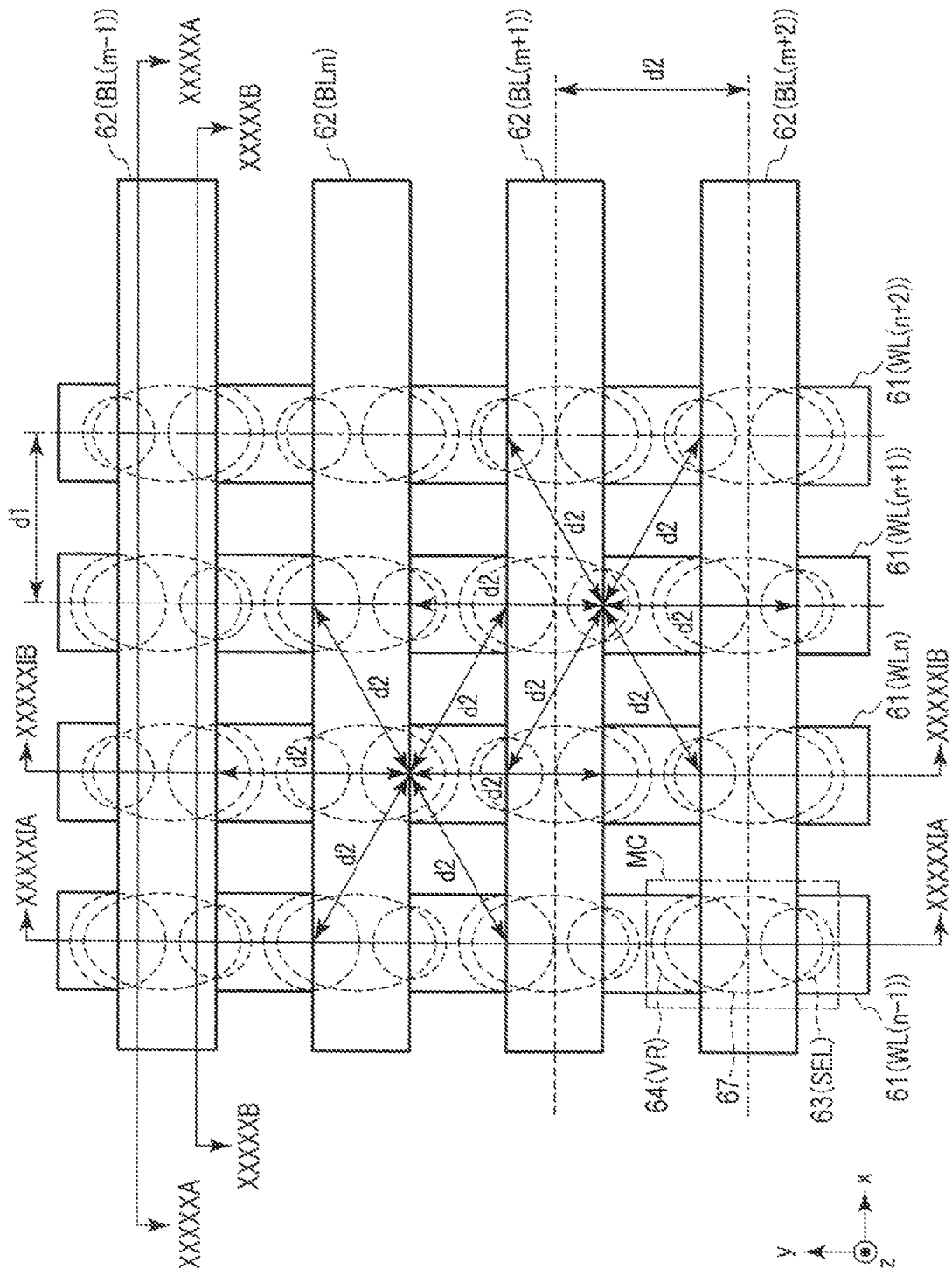
FIG. 49 is a top view for describing a configuration of a memory cell array of a semiconductor storage device according to a twelfth embodiment.

Initially, a layout of the memory cell array 11A in the xy-plane will be described with reference to FIG. 49. FIG. 49 is a top view of the memory cell array 11A of the semiconductor storage device according to the twelfth embodiment when viewed in the +z-axis direction.

As shown in FIG. 49, the arrangement of the wiring layers 61 and 62 and the memory element layers 64 is the same as that of the tenth embodiment, and thus, the description is omitted.

The selection element layers 63 are arranged in the honeycomb shape in the xy-plane. Specifically, the center of the selection element layer 63 is disposed so as to be offset from the wiring layer 62 in a direction opposite to the direction in which the center of the memory element layer 64 is offset from the wiring layers in the xy-plane.

In FIG. 49, the selection element layers 63 are formed such that at least some thereof overlap in regions occupied by the wiring layers 62. More specifically, the center of the n-th-column selection element layer 63 is located in a position, which is offset from the center of the width of the corresponding wiring layer 62 along the y-axis direction, in the +y-axis direction. The centers of the (n−1)-th-column and (n+1)-th-column selection element layers 63 are located in positions, which are offset from the center of the width of the corresponding wiring layer 62 along the y-axis direction, in the −y-axis direction. The center of the n-th-column selection element layer 63 is located in a position offset from the centers of the (n−1)-th-column and (n+1)-th-column selection element layers 63, along the y-axis direction by the distance d2/2.

The selection element layers are arranged in this manner, and thus, an arbitrary selection element layer 63 is disposed with equal distances from six selection element layers 63 adjacent to the arbitrary selection element layer 63 in the xy-plane. Specifically, for example, six selection element layers 63(*m*−1, *n*), 63(*m*+1, *n*), 63(*m*−1, *n*−1), 63(*m*, *n*−1), 63(*m*−1, *n*+1), and 63(*m*, *n*+1) adjacent to the selection element layer 63(*m*, *n*) are arranged in the vertices of the regular hexagon of which one side is the distance d2, and the selection element layer 63(*m*, *n*) is disposed in the center of the regular hexagon. As another example, six selection element layers 63(*m*−1, *n*+1), 63(*m*+1, *n*+1), 63(*m*, *n*), 63(*m*+1, *n*), 63(*m*, *n*+2), and 63(*m*+1, *n*+2) adjacent to the selection element layer 63(*m*, *n*+1) are arranged in the vertices of the regular hexagon of which one side is the distance d2, and the selection element layer 63(*m*, *n*+1) is disposed in the center of the regular hexagon.

In the example of FIG. 49, the memory element layer 64 and the selection element layer 63 do not overlap and are separate from each other in the xy-plane. Thus, an internal connection layer 67 is further formed between the memory element layer 64 and the selection element layer 63 such that the memory element layer 64 and the selection element layer 63 are connected to each other. For example, the internal connection layer 67 has an oval shape so as to overlap both the memory element layer 64 and the selection element layer 63 in the xy-plane.

Hereinafter, configurations of sections of the memory cell array 11A described in FIG. 49 which are taken along the xz-plane and the yz-plane will be described with reference to FIGS. 50A to 51B. FIGS. 50A to 51B are examples of sectional views of a stacked structure of the memory cell array of the semiconductor storage device according to the twelfth embodiment, which are taken along the xz-plane and the yz-plane. Specifically, FIGS. 50A to 51B show sections taken along a line XXXXXA-XXXXXA, a line XXXXXB-XXXXXB, a line XXXXXIA-XXXXXIA, and a line XXXXXIB-XXXXXIB shown in FIG. 49. In the following description, differences between FIGS. 50A to 51B and FIGS. 44A to 45B will be described.

Initially, the configuration of the section of the memory cell array 11A taken along the xz-plane will be described with reference to FIGS. 50A and 50B.

Figures 50A, 50B:
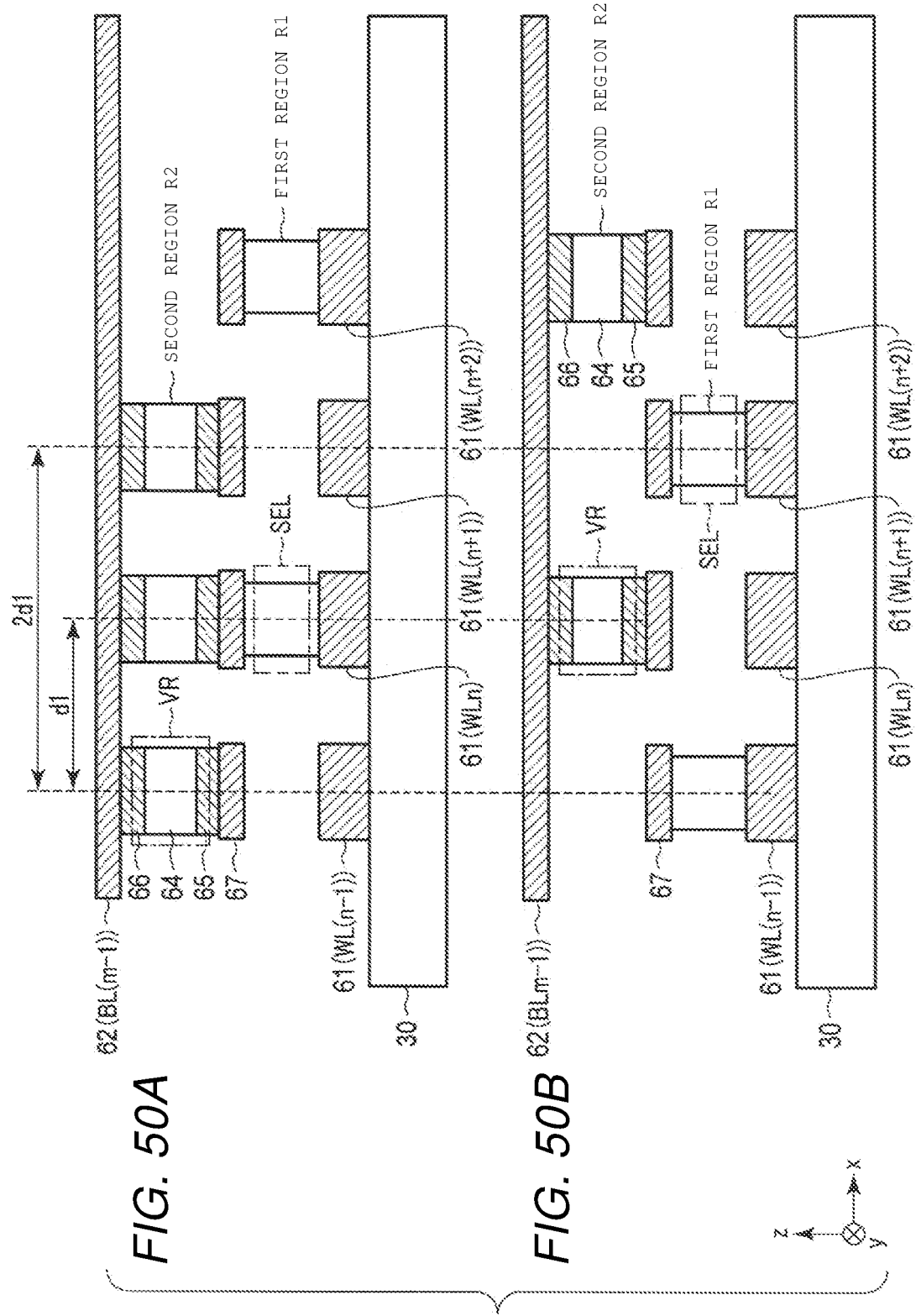
FIGS. 50A and 50B are sectional views for describing the configuration of the memory cell array of the semiconductor storage device according to the twelfth embodiment.

As shown in FIGS. 50A and 50B, the first regions R1 is formed so as to be separated from one another along the x-axis direction by the distance 2d1. Specifically, the first regions R1 are formed so as to reach the upper ends of the wiring layers 61 functioning as the word lines WLn and WL(n+2) in the section taken along the line XXXXXA-XXXXXA. The first regions R1 are formed so as to reach the upper ends of the wiring layers 61 functioning as the word lines WL(n−1) and WL(n+1) in the section taken along the line XXXXXB-XXXXXB. The first region R1 in the section taken along the line XXXXXA-XXXXXA and the first region R1 in the section taken along the line XXXXXB-XXXXXB are formed along the x-axis direction so as to be separated from each other by the distance d1.

The internal connection layer 67 is located in an upper end of the selection element layer 63 and a lower end of the conductive layer 65. The center of the width of the internal connection layer 67 along the x-axis direction matches the centers of the widths of the first region R1 and the second region R2 along the x-axis direction.

Hereinafter, the configuration of the section of the memory cell array 11A taken along the yz-plane will be described with reference to FIGS. 51A and 51B.

As shown in FIGS. 51A and 51B, the first region R1 is formed so as to be offset from the wiring layer 62 in the −y-axis direction in the section taken along the line XXXXXIA-XXXXXIA, and is formed so as to be offset from the wiring layer 62 in the +y-axis direction in the section taken along the line XXXXXIB-XXXXXIB. The first region R1 in the section taken along the line XXXXXIA-XXXXXIA and the first region R1 in the section taken along the line XXXXXIB-XXXXXIB are formed along the y-axis direction so as to be separated from each other by the distance d2/2.

The internal connection layer 67 further extends toward the +y-axis direction than the first region R1 in the section taken along the line XXXXXIA-XXXXXIA, and further extends toward the −y-axis direction than the first region R1 in the section taken along the line XXXXXIB-XXXXXIB. The second region R2 is formed on an upper end of the internal connection layer 36.

12.2 Advantage According to Present Embodiment

According to the twelfth embodiment, when the variable resistance element VR is offset from the center of the width of the corresponding bit line BL along the y-axis direction in the +y-axis direction, the selector SEL is offset from the center of the width of the corresponding bit line BL along the y-axis direction in the −y-axis direction. When the variable resistance element VR is offset from the center of the width of the corresponding bit line BL along the y-axis direction in the −y-axis direction, the selector SEL is offset from the center of the width of the corresponding bit line BL along the y-axis direction in the +y-axis direction. The selectors SEL are disposed in the vertices and the center of the regular hexagon in the xy-plane. Accordingly, the selector SEL does not overlap the variable resistance element VR in the xy-plane. Thus, it is possible to form the variable resistance element VR on a base portion in which the selector SEL is not present. Accordingly, it is possible to reduce a characteristic fluctuation of the variable resistance element VR in manufacturing the variable resistance element.

The internal connection layer 67 is formed between the selector SEL and the variable resistance element VR. The internal connection layer 67 overlaps both the selector SEL and the variable resistance element VR in the xy-plane. Accordingly, it is possible to connect the selector SEL and the variable resistance element VR.

In addition, according to the twelfth embodiment, it is possible to similarly acquire other advantages mentioned in the tenth embodiment.

13. Thirteenth Embodiment

Hereinafter, a semiconductor storage device according to a thirteenth embodiment will be described. In the seventh embodiment to the twelfth embodiment, the configuration in which the memory cell includes the selector including the first end connected to the bit line and the second end connected to the first end of the variable resistance element and the variable resistance element including the second end connected to the word line is described. In contrast, in the thirteenth embodiment, a memory cell includes a selector including a first end connected to the word line and a second end connected to the first end of the variable resistance element and a variable resistance element including a second end connected to the bit line. The thirteenth embodiment is different from the seventh embodiment to the twelfth embodiment in that the memory cells are formed in two layers in the z-axis direction. Hereinafter, differences from the seventh embodiment will be described.

13.1 Stacked Structure of Memory Cell Array

Hereinafter, a stacked structure of a memory cell array of the semiconductor storage device according to the thirteenth embodiment will be described.

Figure 52:
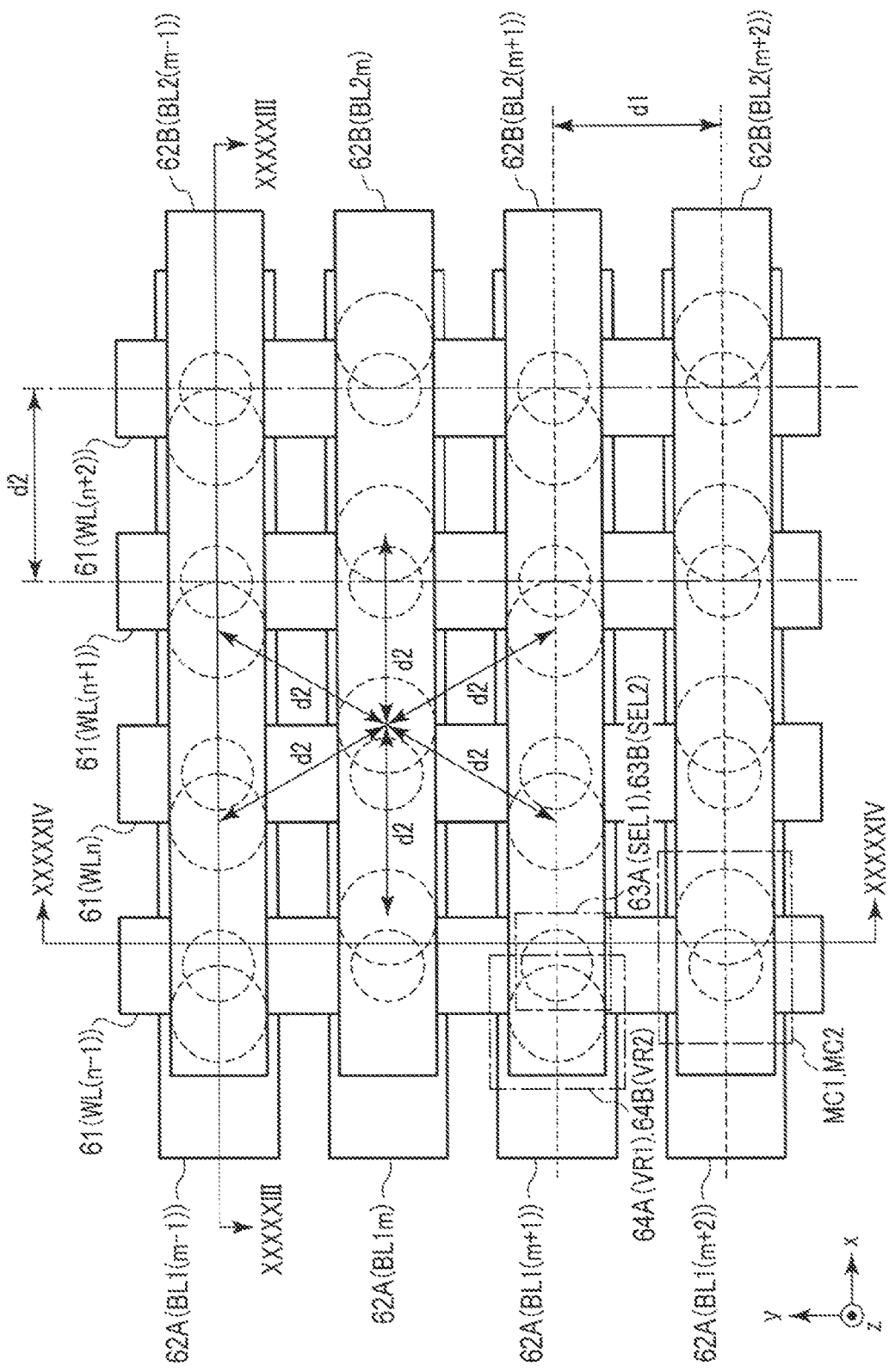
FIG. 52 is a top view for describing a configuration of a memory cell array of a semiconductor storage device according to a thirteenth embodiment.

Initially, a layout of the memory cell array 11A in the xy-plane will be described with reference to FIG. 52. FIG. 52 is a top view of the memory cell array 11A of the semiconductor storage device according to the thirteenth embodiment when viewed in the +z-axis direction.

For example, as shown in FIG. 52, the plurality of wiring layers 62A functioning as first bit lines BL1 extends along the x-axis direction, and are arranged along the y-axis direction at equal intervals. In the example of FIG. 52, four wiring layers 62A corresponding to an (m−1)-th-row first bit line BL1(m−1), an m-th-row first bit line BL1m, an (m+1)-th-row first bit line BL1(m+1), and an (m+2)-th-row first bit line BL1(m+2) are illustrated. Two wiring layers 62A adjacent to each other are separated from each other along the y-axis direction by the distance d1.

The wiring layer 61 is formed above the wiring layer 62A.

A plurality of wiring layers 62B each functioning as a second bit line BL2 is formed above the wiring layers 61. For example, the wiring layers 62B extend along the x-axis direction, and are arranged along the y-axis direction at equal intervals. In the example of FIG. 52, four wiring layers 62B corresponding to an (m−1)-th-row second bit line BL2(m−1), an m-th-row second bit line BL2m, an (m+1)-th-row second bit line BL2(m+1), and an (m+2)-th-row second bit line BL2(m+2) are illustrated. Specifically, two wiring layers 62B adjacent to each other are separated from each other along the y-axis direction by the distance d1.

For example, the wiring layers 62A and 62B are formed in a region in which the wiring layers overlap each other in the xy-plane.

In FIG. 52, selection element layers 63A and 63B functioning as selectors SEL1 and SEL2 are formed in regions in which the wiring layers 62A and 62B intersect with the wiring layer 61. For example, the selection element layers 63A and 63B each have a cylindrical shape that extends along the z-axis direction. The selection element layer 63A is formed between the wiring layer 62A and the wiring layer 61, and the selection element layer 63B is formed between the wiring layer 61 and the wiring layer 62B. In the example of FIG. 52, the selection element layers 63A and 63B locate coaxially in the xy-plane. Selection element layers 63A and 63B are arranged in a rectangular grid in the xy-plane. The arrangement of the selection element layers 63A and 63B in the xy-plane is the same as that of the selection element layers 63 in the seventh embodiment, and thus, the description thereof will be omitted.

In FIG. 52, memory element layers 64A and 64B functioning as variable resistance elements VR1 and VR2 are formed in a region including a part of a region in which the wiring layers 62A and 62B intersect with the wiring layer 61. For example, the memory element layers 64A and 64B each have a cylindrical shape that extends along the z-axis direction. The memory element layer 64A is formed between the wiring layer 62A and the wiring layer 61, and the memory element layer 64B is formed between the wiring layer 61 and the wiring layer 62B. In the example of FIG. 52, the memory element layers 64A and 64B locate coaxially in the xy-plane. Memory element layers 64A and 64B are disposed in a honeycomb shape in the xy-plane. The arrangement of the memory element layers 64A and 64B in the xy-plane is the same as that of the memory element layers 64 in the seventh embodiment, and thus, the description thereof will be omitted.

Figure 53:
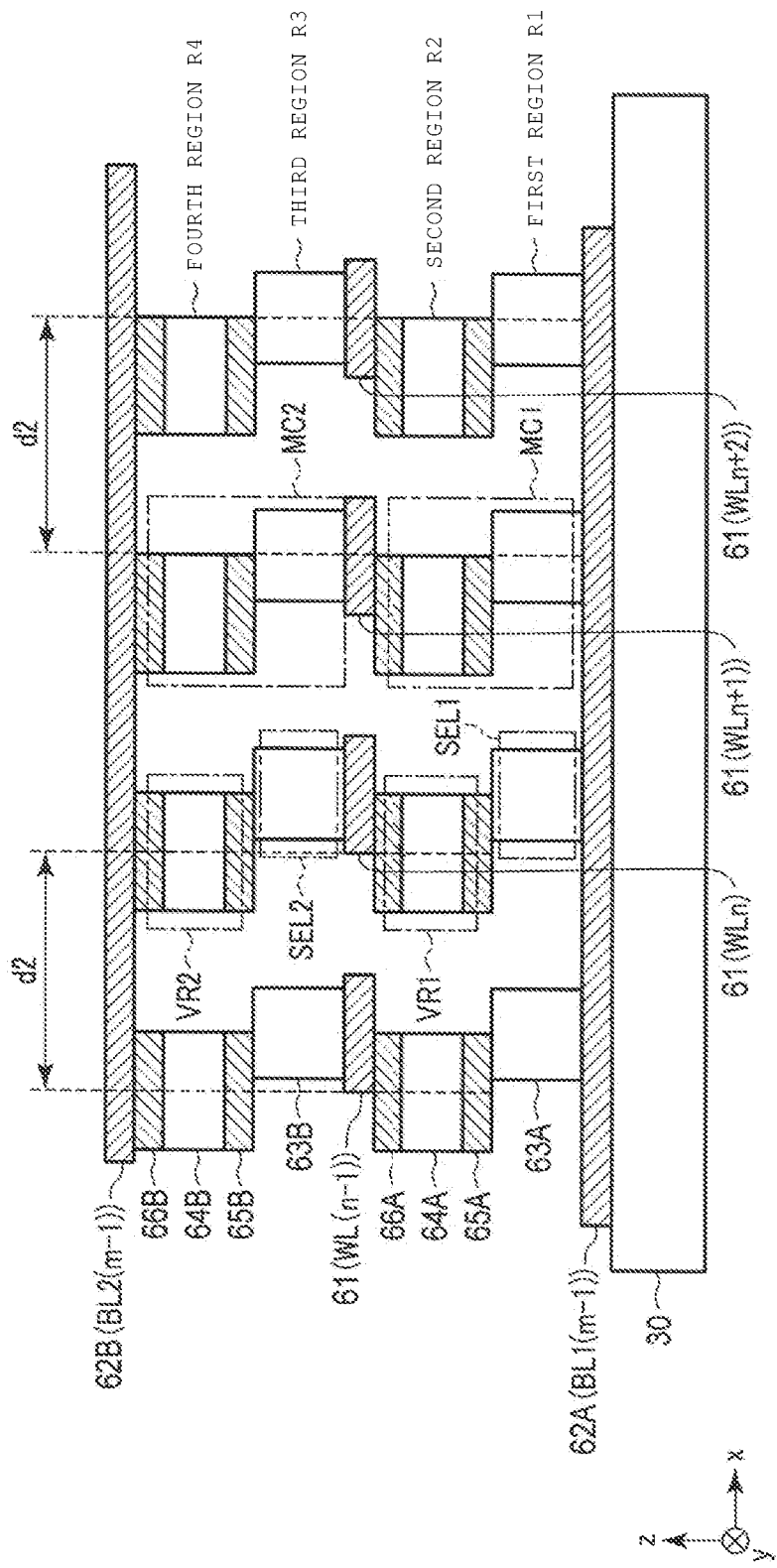
FIG. 53 is a sectional view for describing the configuration of the memory cell array of the semiconductor storage device according to the thirteenth embodiment.
Figure 54:
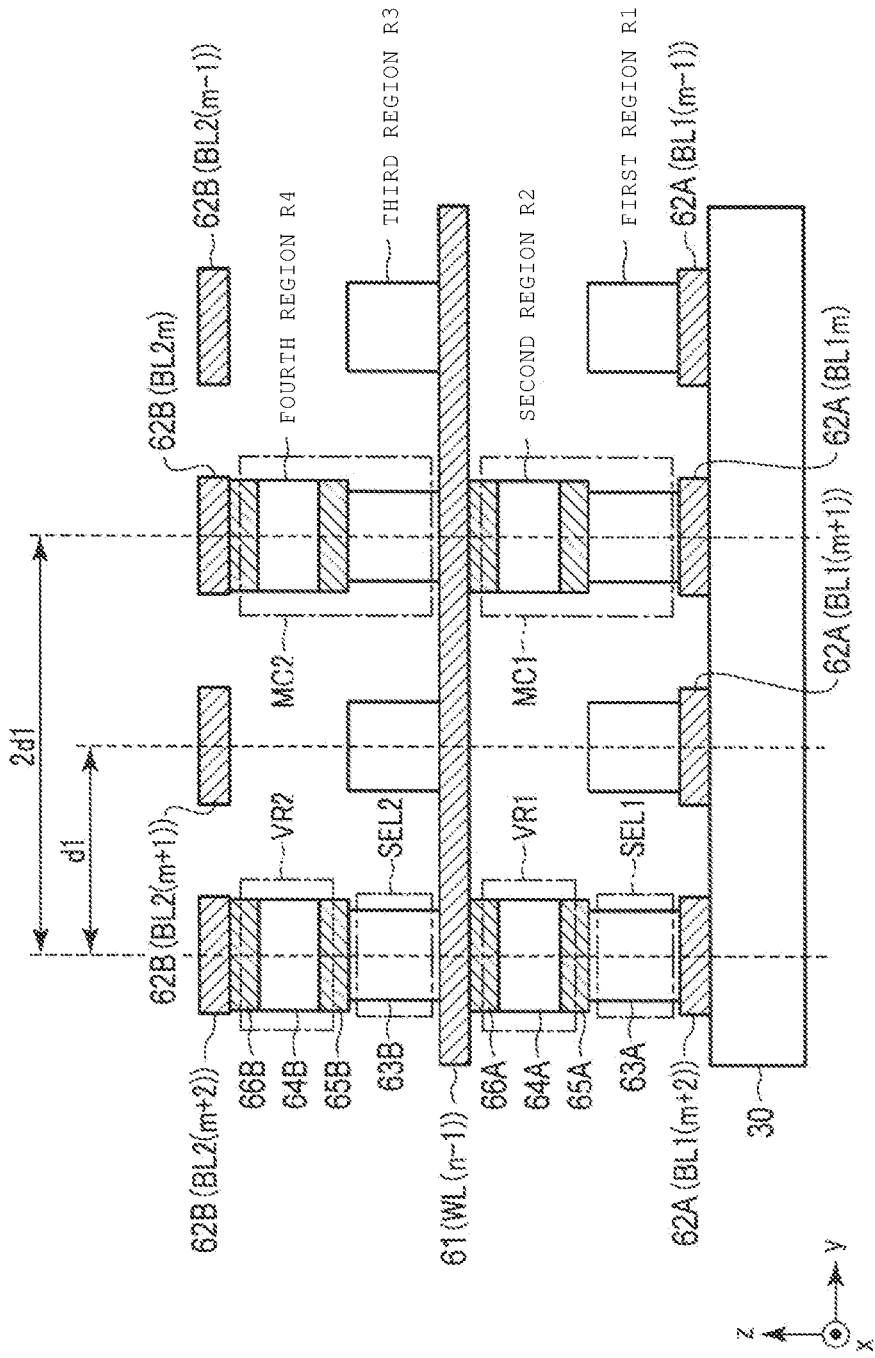
FIG. 54 is a sectional view for describing the configuration of the memory cell array of the semiconductor storage device according to the thirteenth embodiment.

Hereinafter, configurations of sections of the memory cell array 11A described in FIG. 52, which are taken along the xz-plane and the yz-plane, will be described with reference to FIGS. 53 and 54. FIGS. 53 and 54 are examples of sectional views of a stacked structure of the memory cell array of the semiconductor storage device according to the thirteenth embodiment, which are taken along the xz-plane and the yz-plane. Specifically, FIGS. 53 and 54 show sections taken along a line XXXXXIII-XXXXXIII and a line XXXXXIV-XXXXXIV shown in FIG. 52. In FIGS. 53 and 54, some insulating layers are omitted for simplicity of illustration.

Initially, the configuration of the section of the memory cell array 11A taken along the xz-plane will be described with reference to FIG. 53.

As shown in FIG. 53, the wiring layer 62A functioning as the first bit line BL1(m−1) is formed on the semiconductor substrate 30 in the section taken along the line XXXXXIII-XXXXXIII. An insulating film (not shown) is formed on top surfaces of the wiring layers 62A.

First regions R1 are respectively formed in a plurality of regions in which the selectors SEL1 are formed. The first regions R1 are formed along the x-axis direction so as to be separated from one another by the distance d2. For example, the selection element layer 63A including a semiconductor layer functioning as the selector SEL1 is formed within the first region R1. In the example of FIG. 53, the selection element layer 63A has, for example, non-linear characteristics that allow a current to easily flow to the wiring layer 61 from the wiring layer 62A and a current to hardly flow to the wiring layer 62A from the wiring layer 61. An insulating film (not shown) is formed in a layer on an upper end of the selection element layer 63A.

Second regions R2 are respectively formed in a plurality of regions in which the variable resistance elements VR1 are formed. The second regions R2 are formed along the x-axis direction so as to be separated from one another by the distance d2. Each second region R2 reaches a part of the upper end of the selection element layer 63A. A conductive layer 65A, the memory element layer 64A, and a conductive layer 66A are sequentially stacked within the second region R2. The memory element layer 64A functions as the variable resistance element VR1. The conductive layers 65A and 66A function as a lower electrode and an upper electrode of the variable resistance element VR1, respectively. Accordingly, a one-side end of the variable resistance element VR1 and the other-side end of the selector SEL1 are connected to each other.

The plurality of wiring layers 61 functioning as the word lines WL(n−1), WLn, WL(n+1), and WL(n+2) is formed in a layer on an upper end of the conductive layer 66A at equal intervals by the distance d2. The wiring layer 61 is connected to a part of an upper end of the conductive layer 66A. The center of the width of the wiring layer 61 along the x-axis direction matches the center of the width of the selection element layer 63A along the x-axis direction. The wiring layer 61 is commonly connected to the other-side ends of the variable resistance elements VR of the plurality of memory cells MC arranged along the x-axis direction. An insulating film (not shown) is formed on top surfaces of the wiring layers 61.

Third regions R3 are formed in a plurality of regions in which selectors SEL2 are formed. The third regions R3 are formed along the x-axis direction so as to be separated from one another by the distance d2. For example, the selection element layer 63B functioning as the selector SEL2 is formed within the third region R3. In the example of FIG. 53, the selection element layer 63B has, for example, non-linear characteristics that allow a current to easily flow to the wiring layer 61 from the wiring layer 62B and a current to hardly flow to the wiring layer 62B from the wiring layer 61. A center of a width of the third region R3 along the x-axis direction is different from a center of a width of the wiring layer 61 and the first region R1 formed immediately under the third region R3 along the x-axis direction. An insulating film (not shown) is formed in a layer on an upper end of the selection element layer 63B.

Fourth regions R4 are formed in a plurality of regions in which variable resistance elements VR2 are formed. The fourth regions R4 are formed along the x-axis direction so as to be separated from one another by the distance d2. Each fourth region R4 reaches a part of the upper end of the selection element layer 63B. A conductive layer 65B, the memory element layer 64B, and a conductive layer 66B are sequentially stacked within the fourth region R4. The memory element layer 64B functions as the variable resistance element VR2. The conductive layers 65B and 66B function as a lower electrode and an upper electrode of the variable resistance element VR2, respectively. Accordingly, a one-side end of the variable resistance element VR2 and the other-side end of the selector SEL2 are connected to each other.

The wiring layer 62B functioning as the second bit line BL2(m−1) is formed in a layer on an upper end of the conductive layer 66B.

The second region R2 and the fourth region R4 are respectively formed so as to be offset from the first region R1 and the third region R3 in the x-axis direction while maintaining a state in which the conductive layers 65A and 65B are electrically connected to the selection element layers 63A and 63B. Specifically, the second region R2 and the fourth region R4 are formed so as to be offset from the first region R1 and the third region R3 in the −x-axis direction.

Hereinafter, the configuration of the section of the memory cell array 11A taken along the yz-plane will be described with reference to FIG. 54.

As shown in FIG. 54, the plurality of wiring layers 62A functioning as the first bit lines BL1(m+2), BL1(m+1), BL1m, and BL1(m−1) is formed on the semiconductor substrate 30.

The first regions R1 are formed along the y-axis direction so as to be separated from one another by the distance d1. The selector SEL1 having the same configuration as that of the selector SEL1 described in FIG. 54 is formed in the first region R1.

The second regions R2 are formed along the y-axis direction so as to be separated from one another by the distance 2d1. Specifically, the second regions R2 are formed above the wiring layers 62A functioning as the first bit lines BL1(m+2) and BL1m in the section taken along the line XXXXXIV-XXXXXIV. A center of a width of the second region R2 along the y-axis direction matches a center of a width of the first region R1 formed immediately under the second region R2 along the y-axis direction. That is, the second region R2 formed above the wiring layer 62A functioning as the first bit line BL1(m+2) and the first region R1 formed on the wiring layer 62A functioning as the first bit line BL1(m+1) are formed along the y-axis direction so as to be separated from each other by the distance d1. The variable resistance element VR1 having the same configuration as that of the variable resistance element VR1 described in FIG. 53 is formed in the second region R2.

The wiring layer 61 is formed in the layer on the upper end of the conductive layer 66A.

The third regions R3 are formed along the y-axis direction so as to be separated from one another by the distance d1. The selector SEL2 having the same configuration as that of the selector SEL2 described in FIG. 54 is formed in the third region R3. A center of a width of the third region R3 along the y-axis direction matches centers of widths of the first region R1, the second region R2, and the wiring layer 62A formed immediately under the third region R3 along the y-axis direction.

The fourth regions R4 are formed along the y-axis direction so as to be separated from one another by the distance 2d1. Specifically, the fourth regions R4 are formed under the wiring layers 62B functioning as the second bit lines BL2(m+2) and BL2m in the section taken along the line XXXXXIV-XXXXXIV. A center of a width of the fourth region R4 along the y-axis direction matches centers of widths of the third region R3, the second region R2, the first region R1, and the wiring layer 62A formed immediately under the fourth region R4 along the y-axis direction. That is, the fourth region R4 formed under the wiring layer 62B functioning as the second bit line BL2(m+2) and the third region R3 formed above the wiring layer 62 functioning as the first bit line BL1(m+1) are formed along the y-axis direction so as to be separated from each other by the distance d1. The variable resistance element VR2 having the same configuration as that of the variable resistance element VR2 described in FIG. 53 is formed in the fourth region R4.

The plurality of wiring layers 62B functioning as the second bit line BL2(m+2), BL2(m+1), BL2m, and BL2(m−1) is formed in the layer of the upper end of the conductive layer 66B.

13.2 Advantage According to Present Embodiment

According to the thirteenth embodiment, the variable resistance elements VR1 and VR2 are disposed in the vertices and the center of the regular hexagon in the xy-plane. Specifically, the variable resistance elements VR1 which correspond to the same first bit line BL1 and are adjacent to each other are separated along the x-axis direction by the distance d2. The variable resistance elements VR1 which correspond to the same word line WL and are adjacent to each other are separated from each other along the y-axis direction by the distance d1. The variable resistance element VR1 which corresponds to the m-th-row first bit line BL1 and the n-th-column word line WL and the variable resistance element VR1 which corresponds to the (m+1)-th-row first bit line BL1 and the n-th-column word line WL are separated along the x-axis direction by the distance d2/2. Accordingly, it is possible to set the distances between all the variable resistance elements VR1 adjacent to each other to be equal. The variable resistance elements VR2 which correspond to the same second bit line BL2 and are adjacent to each other are separated along the x-axis direction by the distance d2. The variable resistance elements VR2 which correspond to the same word line WL and are adjacent to each other are separated from each other along the y-axis direction by the distance d1. The variable resistance element VR2 which corresponds to the m-th-row second bit line BL2 and the n-th-column word line WL and the variable resistance element VR2 which corresponds to the (m+1)-th-row second bit line BL2 and the n-th-column word line WL are separated along the x-axis direction by the distance d2/2. Accordingly, it is possible to set the distances between all the variable resistance elements VR1 adjacent to each other and the distances between all the variable resistance elements VR2 adjacent to each other to be equal. Thus, a manufacturing fluctuation in a manufacturing stage can be reduced in the embodiment compared to the arrangement in which the distances between all the variable resistance elements adjacent to each other are not equal, such as in the case of the memory cells arranged in the rectangular grid.

The variable resistance elements 63A and 63B have opposite-orientation characteristics along the z-axis direction. Specifically, the selection element layer 63A allows a current to easily flow to the wiring layer 61 from the wiring layer 62A and a current to hardly flow to the wiring layer 62A from the wiring layer 61. The selection element layer 63B allows a current to easily flow to the wiring layer 61 from the wiring layer 62B and a current to hardly flow to the wiring layer 62B from the wiring layer 61. Accordingly, it is possible to form the memory cell array of the semiconductor storage device according to the seventh embodiment in two layers in the z-axis direction. Thus, it is possible to further improve a degree of integration of the memory cells.

In addition, according to the seventh embodiment, it is possible to similarly acquire other advantages mentioned in the first embodiment.

14. Modification Examples

The storage devices described herein are not limited to the forms mentioned in the above-described embodiments, and may be embodied in a variety of changes. Although it is described in the first embodiment to the sixth embodiment that the conductive layers 44 and 45 have the same section as that of the memory element layer 20 taken along the xy-plane, these embodiments are not limited thereto. For example, the conductive layers may have sections different from that of the memory element layer 20.

FIGS. 55A and 55B are sectional views for describing a sectional structure of a memory cell of a semiconductor storage device according to another modification example. FIGS. 55A and 55B show sectional views of the memory cell cut by a plane parallel to the z-axis direction. FIG. 55A shows a case where the magnetic tunnel junction element MTJ is formed above the select transistor ST, and FIG. 55B shows a case where the magnetic tunnel junction element MTJ is formed under the select transistor ST.

As shown in FIG. 55A, a conductive layer 44A may include a top surface of the diffusion layer 43 in the bottom surface. Also, the conductive layer 44A may include a bottom surface of the memory element layer 20 in the top surface. Likewise a conductive layer 45A may include a top surface of the memory element layer 20 in the bottom surface. Also, the conductive layer 45A may include a bottom surface of the wiring layer 33 in the top surface.

As shown in FIG. 55B, a conductive layer 44B may include a top surface of the wiring layer 31 in the bottom surface. Also, the conductive layer 44B may the bottom surface of the memory element layer 20 in the top surface. Likewise a conductive layer 45B may include the top surface of the memory element layer 20 in the bottom surface. Also, the conductive layer 45B may include a bottom surface of the diffusion layer 41 in the top surface.

The conductive layers are formed in this manner, and thus, it is possible to increase a contact area between the magnetic tunnel junction element MTJ and the select transistor ST. Accordingly, it is possible to reduce a wiring resistance.

The above-described modification example may be similarly applied to the seventh embodiment to the thirteenth embodiment. Accordingly, it is possible to acquire the same advantages for the seventh embodiment to the thirteenth embodiment.

Although it is described that the magnetic tunnel junction element mentioned in the first embodiment to the sixth embodiment and the modification examples thereof is a bottom-free type in which the reference layer is formed above the memory layer, the magnetic tunnel junction element may be a top-free type in which the memory layer is formed above the reference layer.

Although it is described in the first embodiment to the sixth embodiment and the modification examples thereof that the MRAM using the magnetic tunnel junction element MTJ is used as the semiconductor storage device, these embodiments are not limited thereto. For example, these embodiments may be applied to the same variable resistance memory as the MRAM, for example, the semiconductor storage device including the element that stores data by using a resistance change like ReRAM or PCRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
    a plurality of first wirings that each extend along a first direction and are adjacent to each other in a second direction that intersects with the first direction;
    a plurality of second wirings that each extend along the second direction and are adjacent to each other in the first direction, the plurality of second wirings being separated from the plurality of first wirings in a third direction;
    a plurality of memory cells, each memory cell being connected between a first wiring in the plurality of first wirings and a second wiring in the plurality of second wirings and including a variable resistance element and a switching element, wherein
    a center of each switching element of each respective memory cell is offset in the second direction from a center of the respective first wiring, and each switching element overlaps a side edge of the respective first wiring, and
    a center of each variable resistance element of each respective memory cell is offset in the second direction from the center of the respective first wiring, and each variable resistance element overlaps an opposite side edge of the respective first wiring.

2. The semiconductor storage device according to claim 1, wherein each memory cell further includes an internal connection layer between the first wiring and the second wiring in the third direction.

3. The semiconductor storage device according to claim 2, wherein each internal connection layer extends in the second direction and electrically connects the switching element to the variable resistance element of the respective memory cell.

4. The semiconductor storage device according to claim 2, wherein the internal connection layer is an oval shape in a plane parallel to the first and second directions.

5. The semiconductor storage device according to claim 1, further comprising:
    a substrate having a first surface, wherein
    the third direction is substantially orthogonal to the first surface,
    the plurality of first wirings is in a first layer above the first surface in the third direction, and the plurality of second wirings is in a second layer above the first layer in the third direction.

6. The semiconductor storage device according to claim 5, wherein the first wirings are word lines and the second wirings are bit lines.

7. The semiconductor storage device according to claim 1, further comprising:
a substrate having a first surface, wherein
the third direction is substantially orthogonal to the first surface,
the plurality of first wiring is in a first layer above the first surface in the third direction, and
the plurality of second wirings is in a second layer below the first layer in the third direction.

8. The semiconductor storage device according to claim 7, wherein the first wirings are bit lines and the second wirings are word lines.

9. The semiconductor storage device according to claim 1, wherein the first wirings are word lines and the second wirings are bit lines.

10. The semiconductor storage device according to claim 1, wherein the first wirings are bit lines and the second wirings are word lines.

11. The semiconductor storage device according to claim 1, wherein centers of variable resistance elements of adjacent memory cells are equidistant from one another.

12. The semiconductor storage device according to claim 11, wherein centers of selector elements of adjacent memory cells are equidistant from one another.

13. The semiconductor storage device according to claim 12, wherein centers of the selector element and the variable resistance element in each respective memory cell are offset in opposite directions along the second direction.

14. The semiconductor storage device according to claim 1, wherein centers of the selector element and the variable resistance element in each respective memory cell are offset in opposite directions along the second direction.

15. A semiconductor storage device, comprising:
a substrate;
a first wiring and a second wiring that extend along a first direction that is parallel to a surface of the substrate, are adjacent to each other in a second direction that crosses the first direction and is parallel to the surface of the substrate, and are in a first layer above the substrate in a third direction orthogonal to the surface of the substrate;
a third wiring and a fourth wiring that are in a second layer above the first layer in the third direction, extend along the second direction, and are adjacent to each other in the first direction;
a first memory cell including a first variable resistance element and a first switching element between the first wiring and the third wiring in the third direction, a center of the first variable resistance element being offset from a center of the first wiring in the second direction, the first variable resistance element overlapping a first side edge of the first wiring, a center of the first switching element being offset from the center of the first wiring in the second direction, the first switching element overlapping a second side edge of the first wiring, the first side edge being opposite the second side edge;
a second memory cell including a second variable resistance element and a second switching element between the second wiring and the third wiring in the third direction, a center of the second variable resistance element being offset from a center of the second wiring in the second direction, the second variable resistance element overlapping a first side edge of the second wiring, a center of the second switching element being offset from the center of the second wiring in the second direction, the second switching element overlapping a second side edge of the second wiring, the first side edge being opposite the second side edge; and
a third memory cell including a third variable resistance element and a third switching element between the first wiring and the fourth wiring in the third direction, a center of the third variable resistance element being offset from a center of the first wiring in the second direction, the third variable resistance element overlapping the second side edge of the first wiring, a center of the third switching element being offset from the center of the first wiring in the second direction, the third switching element overlapping the first side edge of the first wiring.

16. The semiconductor storage device according to claim 15, wherein the first memory cell further includes an internal connection layer between the first wiring and the third wiring in the third direction.

17. The semiconductor storage device according to claim 16, wherein the internal connection layer extends in the second direction and electrically connects the first switching element to the first variable resistance element.

18. The semiconductor storage device according to claim 16, wherein the internal connection layer is oval shaped in a plane parallel to the first and second directions.

19. The semiconductor storage device according to claim 1, wherein the direction of the offset for center of the selector element in each respective memory cell is in the opposite direction from the direction of the offset for center of the variable resistance element in the respective memory cell.

20. The semiconductor storage device according to claim 12, wherein the direction of the offset for center of the selector element in each respective memory cell is in the opposite direction from the direction of the offset for center of the variable resistance element in the respective memory cell.

* * * * *